United States Patent
Honjo et al.

(10) Patent No.: US 11,264,565 B2
(45) Date of Patent: Mar. 1, 2022

(54) MAGNETORESISTANCE EFFECT ELEMENT AND MAGNETIC MEMORY

(71) Applicant: TOHOKU UNIVERSITY, Sendai (JP)

(72) Inventors: Hiroaki Honjo, Sendai (JP); Tetsuo Endoh, Sendai (JP); Hideo Sato, Sendai (JP); Shoji Ikeda, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 0 days.

(21) Appl. No.: 16/843,708

(22) Filed: Apr. 8, 2020

(65) Prior Publication Data
US 2020/0343442 A1  Oct. 29, 2020

(30) Foreign Application Priority Data
Apr. 11, 2019 (JP) .............................. JP2019-075644

(51) Int. Cl.
| | |
|---|---|
| *G11C 11/15* | (2006.01) |
| *H01L 27/22* | (2006.01) |
| *G11C 11/16* | (2006.01) |
| *H01L 43/08* | (2006.01) |
| *H01L 43/10* | (2006.01) |
| *H01L 43/02* | (2006.01) |
| *G01R 33/09* | (2006.01) |

(52) U.S. Cl.
CPC ............ *H01L 43/08* (2013.01); *G01R 33/098* (2013.01); *G11C 11/15* (2013.01); *G11C 11/161* (2013.01); *H01L 27/222* (2013.01); *H01L 43/02* (2013.01); *H01L 43/10* (2013.01)

(58) Field of Classification Search
CPC ....... G11C 11/15; G11C 11/161; H01L 43/02; H01L 43/08; H01L 43/10; H01L 27/222
USPC .................................................. 365/158, 173
See application file for complete search history.

(56) References Cited

U.S. PATENT DOCUMENTS

| | | | |
|---|---|---|---|
| 7,663,197 B2 * | 2/2010 | Nagase .................... | H01L 43/08 257/421 |
| 8,604,572 B2 * | 12/2013 | Wang ........................ | G11C 11/16 257/421 |
| 9,130,155 B2 * | 9/2015 | Chepulskyy .......... | G11C 11/161 |
| 10,573,688 B2 * | 2/2020 | Swerts .................... | H01L 43/10 |
| 10,580,827 B1 * | 3/2020 | Watts ................... | G11C 11/1675 |

(Continued)

FOREIGN PATENT DOCUMENTS

JP   4595541 B2   12/2010

*Primary Examiner* — Son L Mai
(74) *Attorney, Agent, or Firm* — Procopio, Cory, Hargreaves & Savitch, LLP

(57) ABSTRACT

An object of the invention is to provide a magnetoresistance effect element which includes a reference layer having three or more magnetic layers and which improves a thermal stability factor $\Delta$ by decreasing a write error rate using an element structure that enables a wide margin to be secured between a current at which magnetization of the reference layer is reversed and a writing current Ic of a recording layer and by reducing an effect of a stray magnetic field from the reference layer.

The magnetoresistance effect element includes: a first recording layer (A1); a first non-magnetic layer (11); and a first reference layer (B1), wherein the first reference layer (B1) including n-number of a plurality of magnetic layers (21, 22, . . . , 2n) and (n−1)-number of a plurality of non-magnetic insertion layers (31, 32, . . . 3(n−1)) adjacently sandwiched by each of the plurality of magnetic layers, where n≥3.

64 Claims, 35 Drawing Sheets

(56) References Cited

U.S. PATENT DOCUMENTS

| | | | |
|---|---|---|---|
| 10,672,976 B2* | 6/2020 | Pinarbasi | H01L 43/12 |
| 10,804,457 B2* | 10/2020 | Ohno | H01L 43/10 |
| 2005/0242407 A1 | 11/2005 | Matsutera et al. | |

* cited by examiner

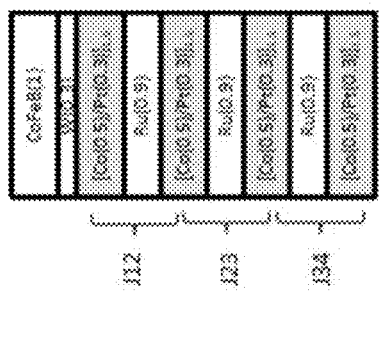
Fig. 26 (a)
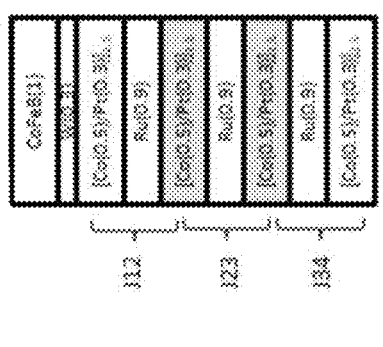
Fig. 26 (b)
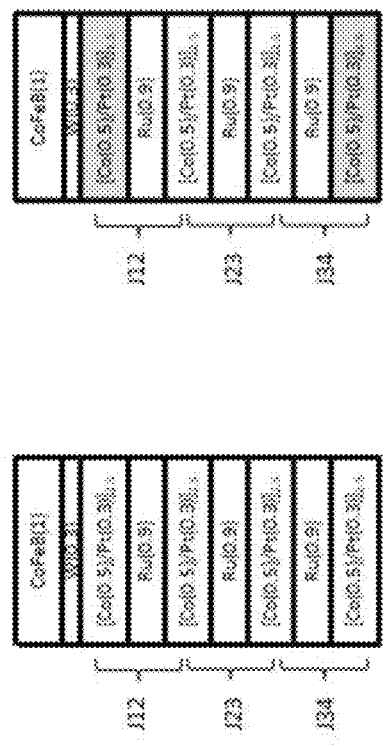
Fig. 26 (c)
Fig. 26 (d)
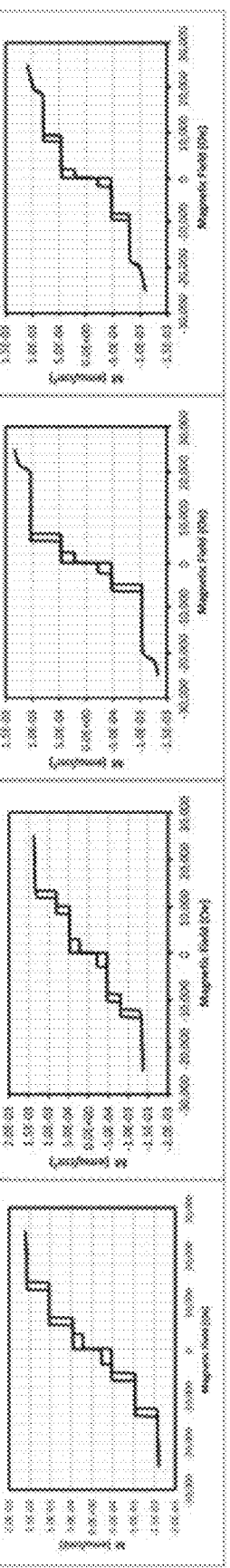

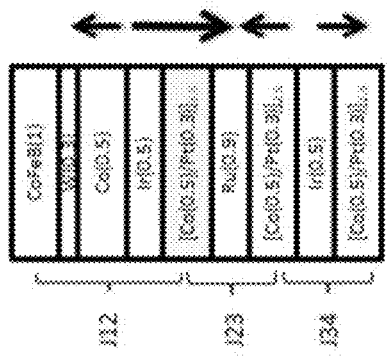
Fig. 28 (a)
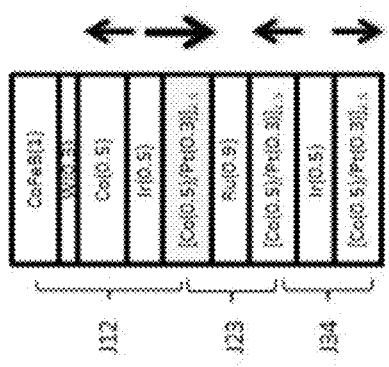
Fig. 28 (b)
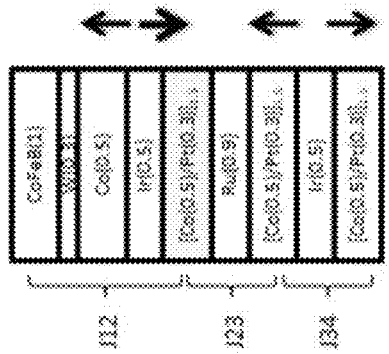
Fig. 28 (c)
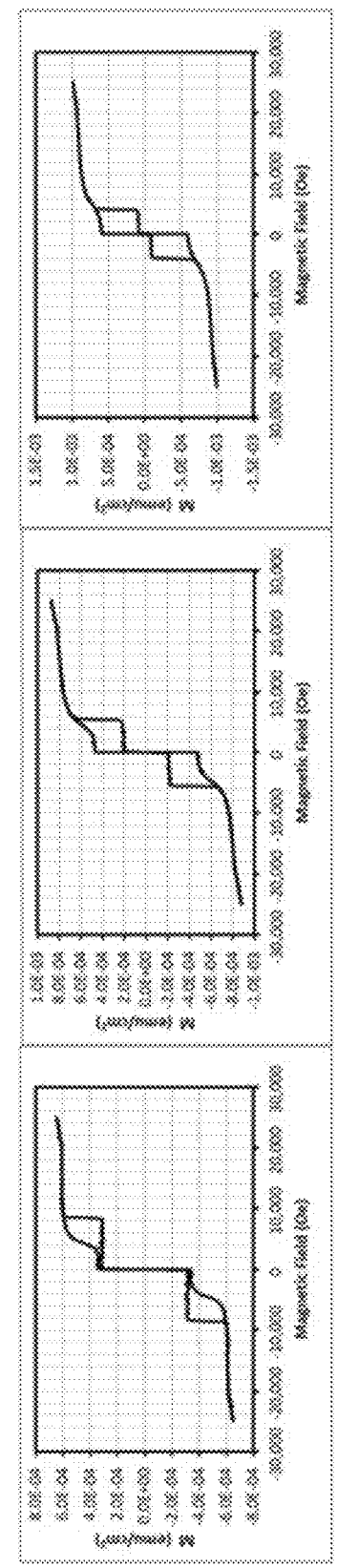

Prior Art

Fig. 34A
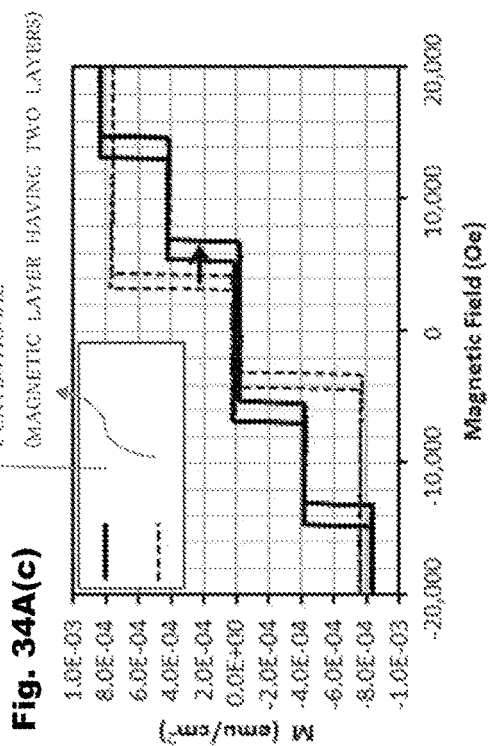
Fig. 34A(c)
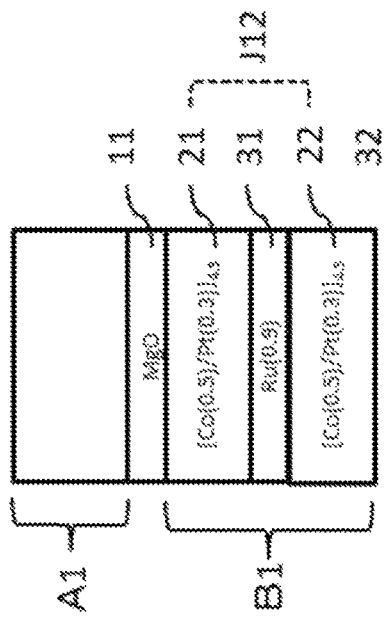
Fig. 34A(a)
Prior Art
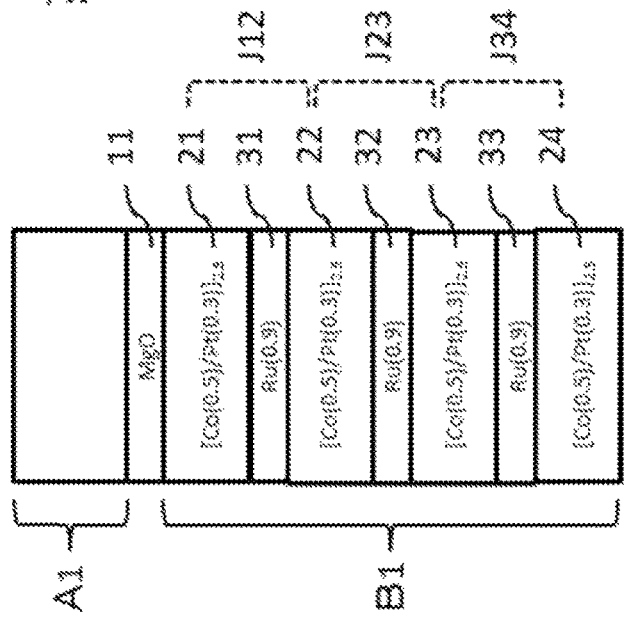
Fig. 34A(b)

Fig. 34B
Fig. 34B (a)
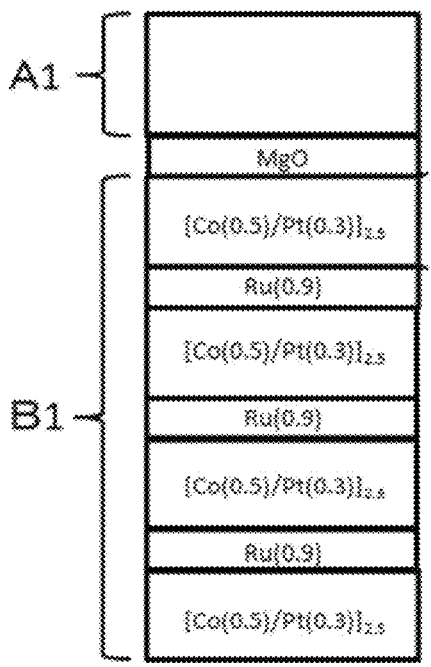
Fig. 34B (b)
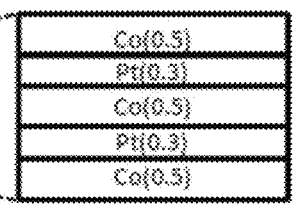
Fig. 35A
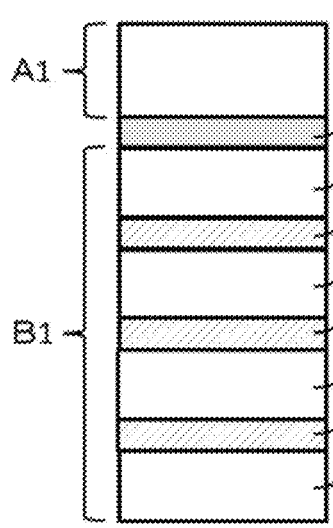
Fig. 35A (a)   Fig. 35A (b)   Fig. 35A (c)   Fig. 35A (d)
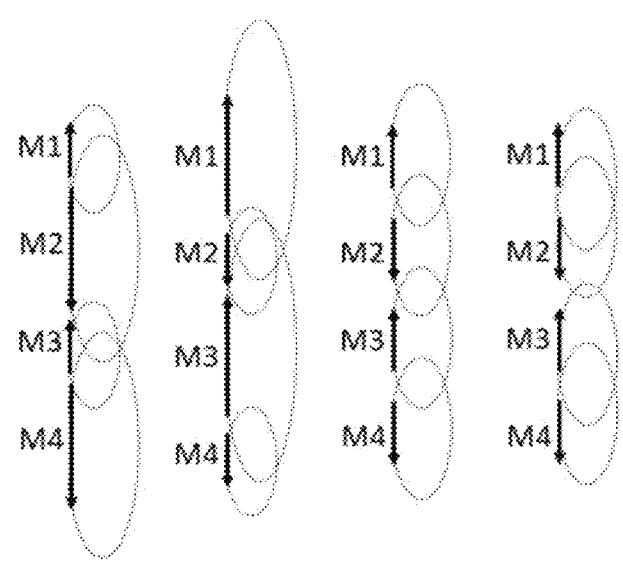

Fig. 35B
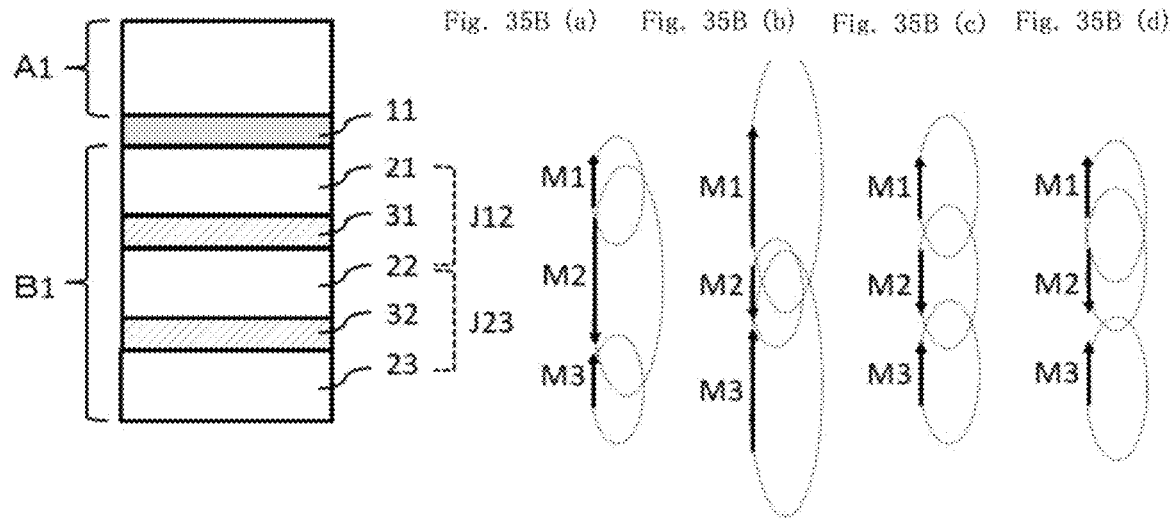
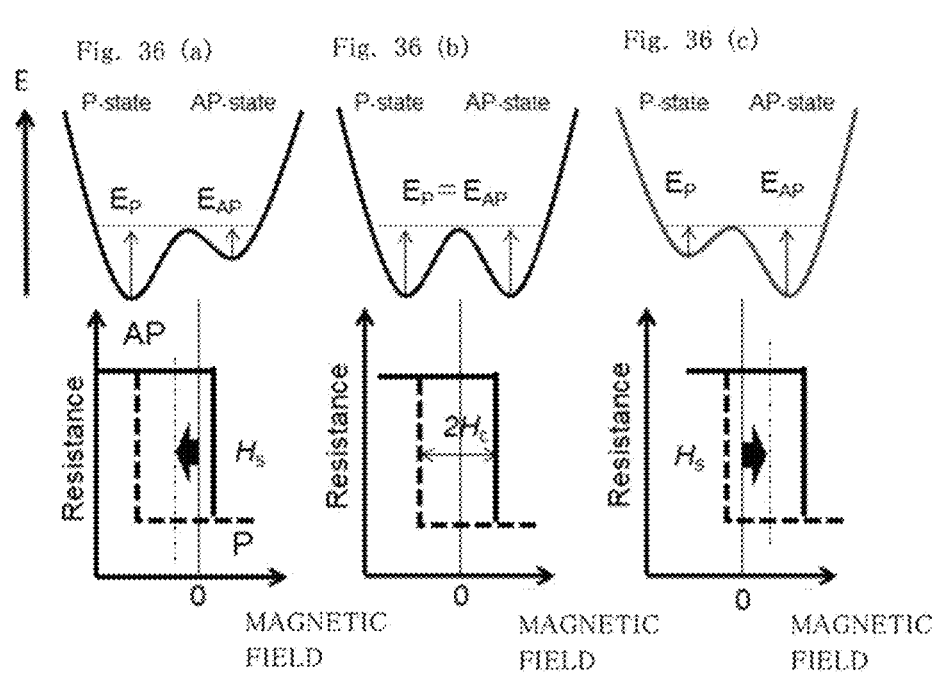
$\Delta_P = E_P / k_b T$
$\Delta_{AP} = E_{AP} / k_b T$

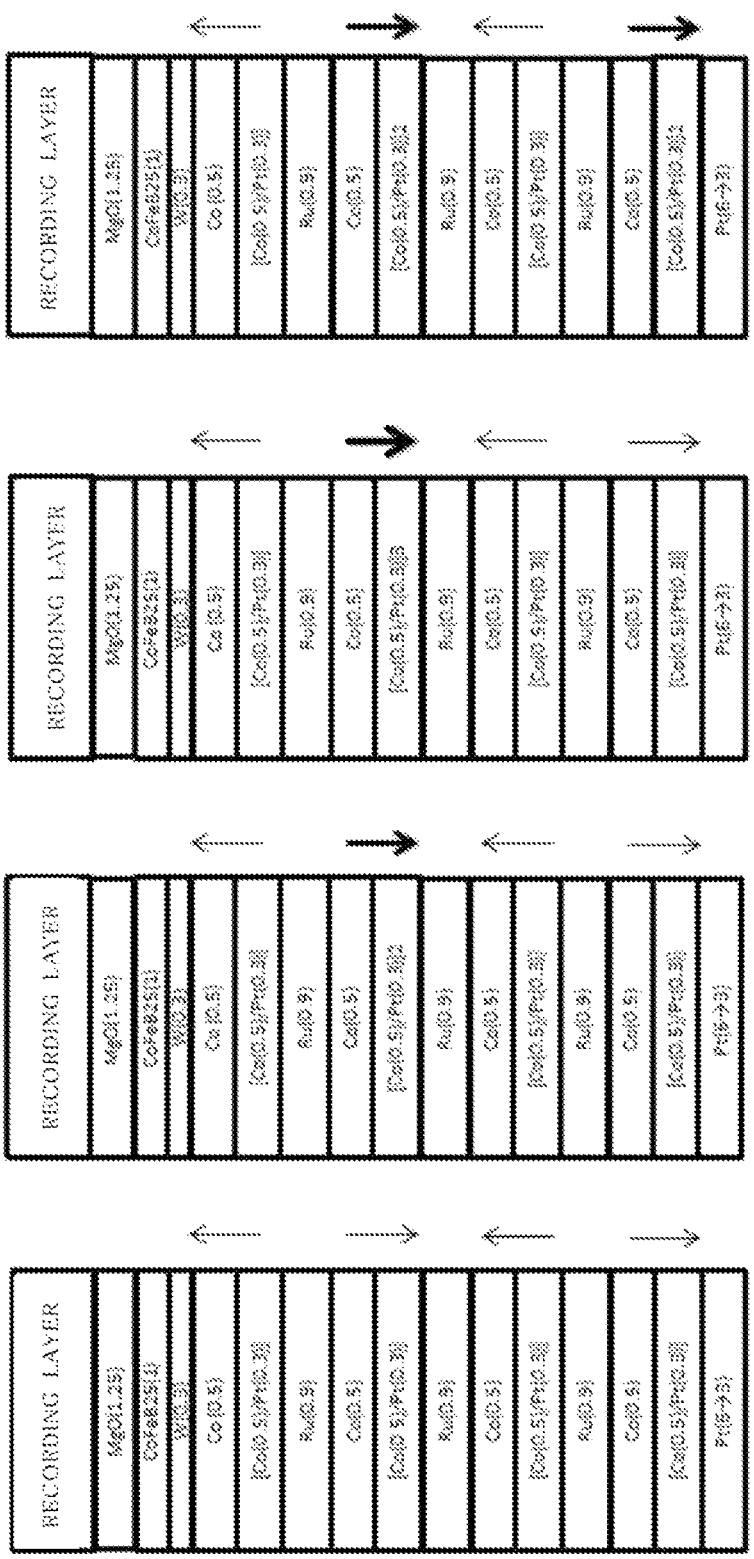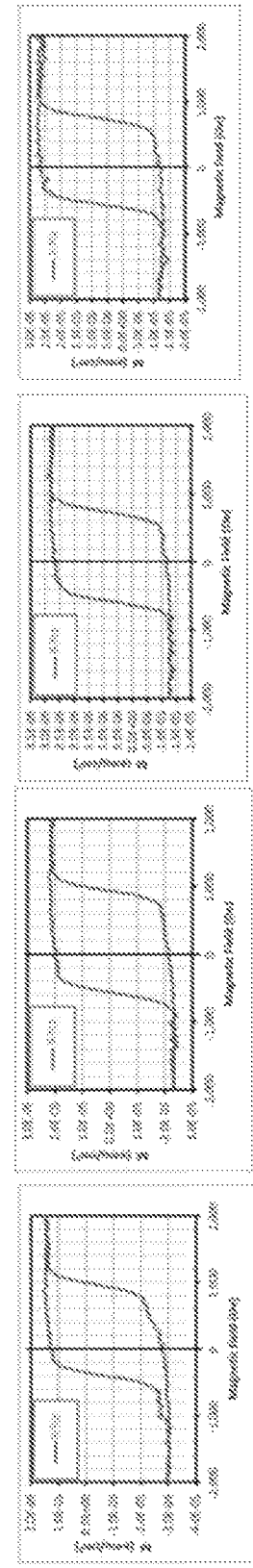

Fig. 39 (a)
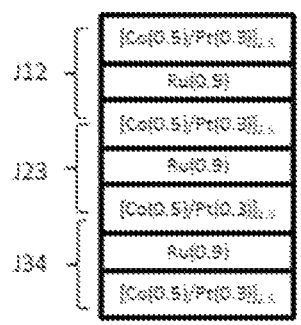
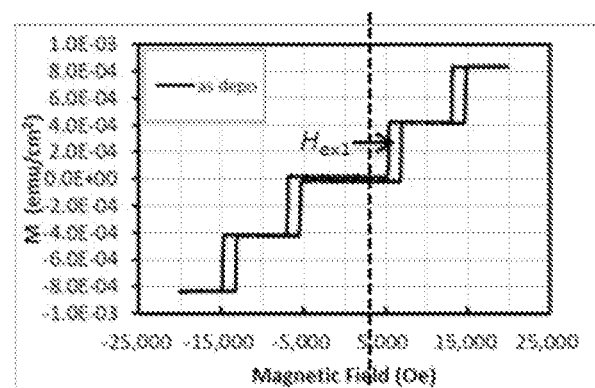
Fig. 39 (b)
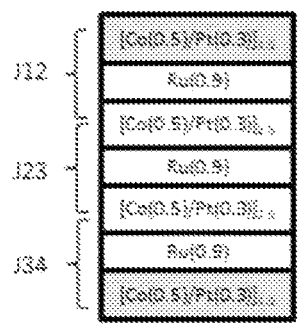
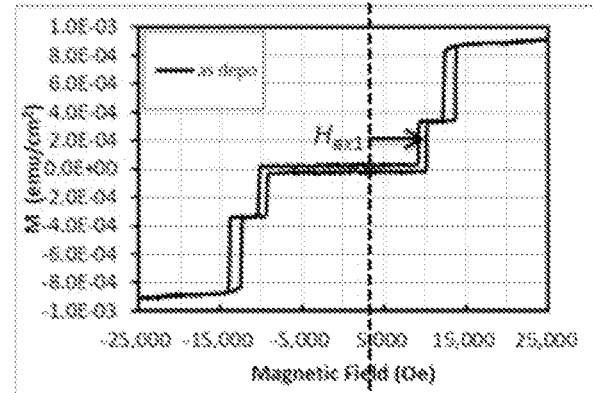
Fig. 39 (c)
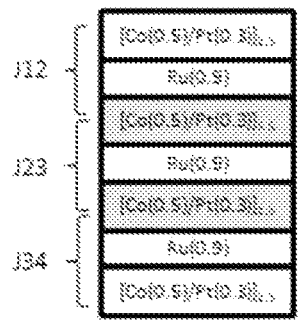
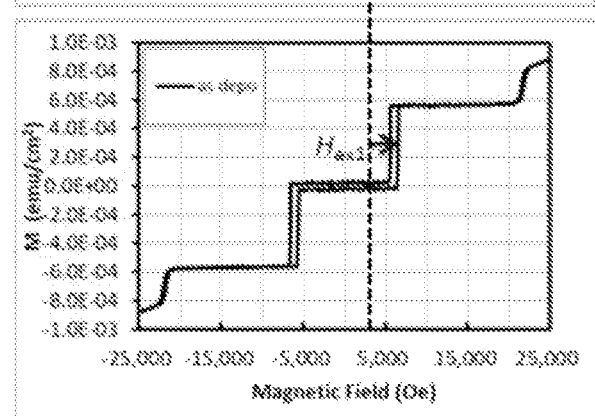

Fig. 41 (a)
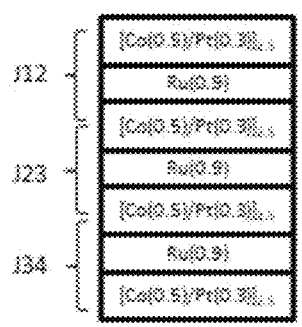 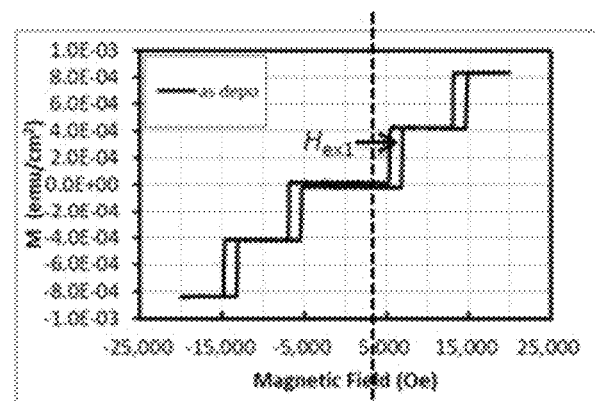
Fig. 41 (b)
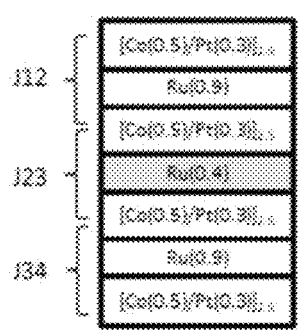 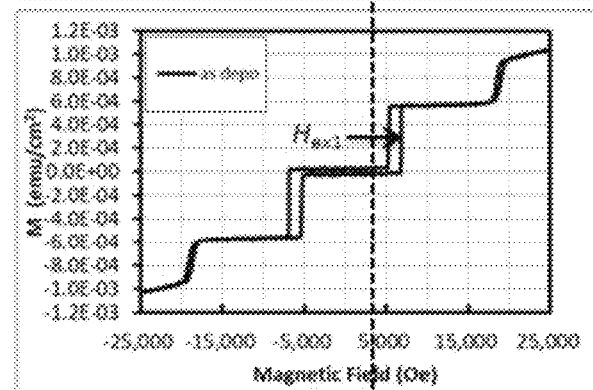
Fig. 41 (c)
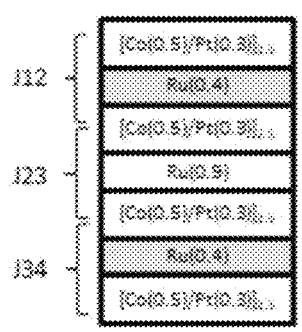 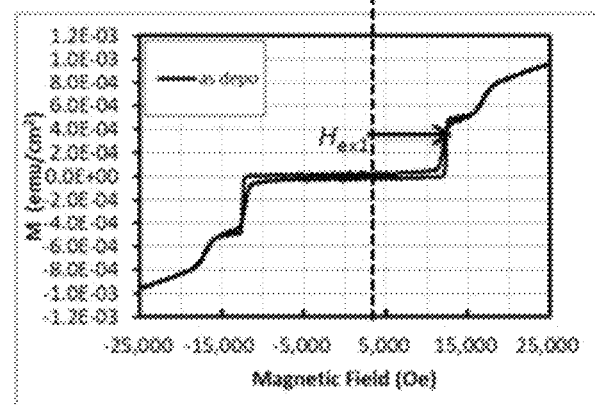

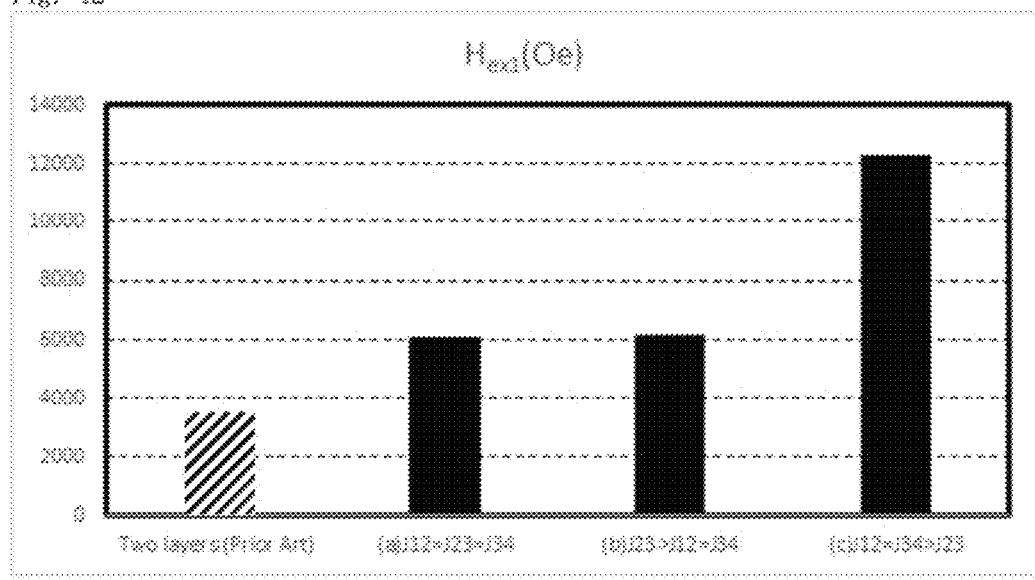

MAGNETORESISTANCE EFFECT ELEMENT AND MAGNETIC MEMORY

BACKGROUND OF THE INVENTION

1. Field of the Invention

The present invention relates to a magnetoresistance effect element and to a magnetic memory including the magnetoresistance effect element. In particular, the present invention relates to a structure of a reference layer.

2. Description of the Related Art

A magnetic random access memory (MRAM; magnetic memory) is a nonvolatile memory utilizing a magnetic tunnel junction (MTJ).

MRAMs which do not consume power during standby, which have high-speed operability and high write endurance, and which enable miniaturization of a memory size are attracting attention as a next-generation logic integrated circuit.

A magnetoresistance effect element used in an MRAM is based on a structure in which a non-magnetic layer to act as a barrier layer is sandwiched between a recording layer and a reference layer. Bit information recorded on a magnetic layer (the recording layer) of the MRAM is read out using a tunnel magnetoresistance (TMR) effect that is exhibited depending on magnetized states of the recording layer and the reference layer formed above and below the barrier layer.

Characteristics that are important in terms of application of an MRAM that is a magnetoresistance effect element are: (i) a large thermal stability factor $\Delta$; (ii) a small writing current Ic; (iii) a large tunnel magnetoresistance ratio (TMR ratio) of the magnetoresistance effect element; and (iv) a small element size. (i) is a characteristic required for non-volatility of a magnetic memory, (ii) is a characteristic required to reduce a size of a cell transistor and reduce a cell size and to lower power consumption, (iii) is a characteristic required to accommodate high-speed reading, and (iv) is a characteristic required to reduce cell area and increase capacity.

In addition, in relation to the characteristic (ii) described above, it is required that a wide margin be provided between a current at which a reversal of fixed magnetization of the reference layer occurs and the writing current Ic of the recording layer. This is because a write error rate rises during write of the recording layer when values of both currents approach each other.

Furthermore, in relation to the characteristic (i) described above, it is required for a recording layer to reduce a stray magnetic field from the reference layer as small as possible. This is because, when a stray magnetic field has a large effect, the thermal stability factor $\Delta$ of the recording layer in either of the magnetized states declines.

SUMMARY OF THE INVENTION

As disclosed in Japanese Patent No. 4595541 and the like, a conventional reference layer generally has a two-stage structure shown in FIG. 31. Specifically, a reference layer (B1) includes two magnetic layers (21 and 22) and a non-magnetic insertion layer (31) represented by Ru, and the non-magnetic layers (21 and 22) are antiferromagnetically coupled via the Ru of the non-magnetic insertion layer (31).

An intensity of the antiferromagnetic coupling of Ru varies depending on a film thickness of an Ru film and a maximum antiferromagnetic coupling force J12 is obtained at a film thickness of 0.4±0.15 nm. However, since t is insufficient, deterioration of antiferromagnetic coupling is likely to occur during a heat treatment at 400° C. in a backend process when manufacturing a circuit such as a complementary MOS (CMOS).

In consideration thereof, the Ru film is adjusted to a film thickness of 0.9±0.2 nm which indicates second lamest antiferromagnetic coupling and is used as the non-magnetic insertion layer (31) of the reference layer.

However, since the antiferromagnetic coupling force at a film thickness of 0.9±0.2 nm is weaker than the antiferromagnetic coupling force at a film thickness of 0.4±0.15 nm, there is a problem that a coupling force of the two magnetic layers (21 and 22) weakens and a current value at which fixed magnetization of the reference layer is reversed becomes smaller. In other words, there is a problem in that a wide margin cannot be secured between the current at which the fixed magnetization of the reference layer is reversed and the writing current is of the recording layer and, as a result, a write error rate rises.

In addition, there is also a problem in that, among the magnetic layers of the reference layer (B1) in the conventional example shown in FIG. 31, a large stray magnetic field from the magnetic layer (21) that is closest to a recording layer (A1) generates a shift magnetic field Hs, an effective coercive force Hc' that is correlated with a thermal stability factor $\Delta$ of the recording layer (A1) decreases particularly when the magnetized state is parallel, and a thermal stability factor $\Delta$ of an element decreases.

Furthermore, while increasing a magnetic layer film thickness of the magnetic layer 22 that is arranged under the non-magnetic insertion layer is effective in reducing the effect of the stray magnetic field from the magnetic layer that is closest to the recording layer among the magnetic layers at the reference layer (B1) in the conventional example, in this case, since the intensity of the antiferromagnetic coupling declines at the same time, there is a problem in that the margin between the current at which the reference layer is reversed and the current at which the recording layer is reversed decreases. In other words, in the conventional example, there is a problem in that both securing a wide margin between the current at which the reference layer is reversed and the current at which the recording layer is reversed and sufficiently reducing the stray magnetic field from the reference layer cannot be satisfied at the same time.

In consideration of the circumstances described above, the present invention has been made by discovering a magnetoresistance effect element which includes a reference layer having three or more magnetic layers and which improves a thermal stability factor $\Delta$ by decreasing a write error rate using an element structure that enables a wide margin to be secured between a current at which magnetization of the reference layer is reversed and a writing current Ic of a recording layer and by reducing an effect of a stray magnetic field from the reference layer.

In order to solve the problem described above, a magnetoresistance effect element according to the present invention includes: a first recording layer (A1); a first non-magnetic layer (11) provided adjacent to the first recording layer (A1); and a first reference layer (B1) provided adjacent to the first non-magnetic layer (11) on an opposite side to the first recording layer (A1), wherein the first reference layer (B1) includes n-number of a plurality of magnetic layers (21, 22, . . . , 2n) and (n–1)-number of a plurality of non-magnetic insertion layers (31, 32, . . . , 3(n–1)) adjacently sandwiched by each of the plurality of magnetic layers, where n≥3, a first magnetic layer (21) among the plurality of magnetic layers is provided adjacent to the first non-magnetic layer (11), an orientation of magnetization of the first reference layer (B1) is fixed in a film surface vertical direction, and each of the plurality of non-magnetic insertion layers (31, 32, . . . , 3(n−1)) antiferromagnetically couples two adjacent magnetic layers to each other.

Desirably, each of the plurality of non-magnetic insertion layers (31, 32, . . . , 3(n−1)) contains Ru or Ir, a film thickness of the Ru is 0.9±0.2 nm or 0.4±0.15 nm, and a film thickness of the Ir is 0.5±0.15 nm or 4.35±0.1 nm.

In addition, a magnetic memory according to the present invention includes the magnetoresistance effect element described above.

According to the present invention, a magnetoresistance effect element and a magnetic memory can be provided which improve a thermal stability factor Δ by decreasing a write error rate using an element structure that enables a wide margin to be secured between a current at which magnetization of a reference layer is reversed and a writing current Ic of a recording layer and by reducing an effect of a stray magnetic field from the reference layer.

BRIEF DESCRIPTION OF THE DRAWINGS

FIG. 26(a) to FIG. 26(d) show structures and each magnetization curve of an evaluation reference layer of a full stack when varying a film thickness of a magnetic layer;

FIG. 28(a) to FIG. 28(c) show structures and each magnetization curve of an evaluation reference layer of a full stack when varying a film thickness of a magnetic layer;

FIG. 298 shows an exchange coupling field ($H_{ex1}$) of a full stack when varying a film thickness of a magnetic layer;

FIG. 34A(a) represents an example of a conventional reference layer with two magnetic layers; FIG. 34A(b) represents an example of a reference layer according to the present invention; and FIG. 34A(c) represents magnetization curves of FIG. 34A(a) and FIG. 34A(b);

FIG. 34B(a) represents an example of a reference layer according to the present invention and FIG. 34B(b) represents details (a partial enlarged view) of a Co/Pt layer;

FIG. 35A(a) to FIG. 35A(d) are schematic charts of magnetization of a magnetic layer, an antiferromagnetic coupling force, and a stray magnetic field, in which: FIG. 35A(a) is a schematic chart of a stray magnetic field when magnetization is expressed as M2>M1 and antiferromagnetic coupling forces are expressed as J12=J23=J34, FIG. 35A(b) is a schematic chart of a stray magnetic field when magnetization is expressed as M1>M2 and antiferromagnetic coupling forces are expressed as J12=J23=J34, FIG. 35A(c) is a schematic chart of a stray magnetic field when magnetization is expressed as M1=M2=M3=M4 and antiferromagnetic coupling forces are expressed as J12=J23=J34, and FIG. 35A(d) is a schematic chart of a stray magnetic field when magnetization is expressed as M1=M2=M3=M4 and antiferromagnetic coupling forces are expressed as J12=J34>J23;

FIG. 35B(a) to FIG. 35B(d) are a schematic charts of magnetization of a magnetic layer, an antiferromagnetic coupling force, and a stray magnetic field, in which: FIG. 35B(a) is a schematic chart of a stray magnetic field when magnetization is expressed as M2>M1 and antiferromagnetic coupling forces are expressed as J12=J23, FIG. 35B(b) is a schematic chart of a stray magnetic field when magnetization expressed as M1>M2 and antiferromagnetic coupling forces are expressed as J12=J23, FIG. 35B(c) is a schematic chart of a stray magnetic field when magnetization is expressed as M1=M2=M3 and antiferromagnetic coupling forces are expressed as J12=J23, and FIG. 35B(d) is a schematic chart of a stray magnetic field when magnetization is expressed as M1=M2=M3 and antiferromagnetic coupling forces are expressed as J12>J23;

FIG. 36(a) to FIG. 36(c) are schematic charts of a relationship between a coercive force of a recording layer and a shill magnetic field Hs, in which: FIG. 36(a) represents a state where the coercive force Hc has shifted to a low-resistance state, FIG. 36(b) represents a state where the shift magnetic field Hs has no effect on the coercive force Hc, and FIG. 36(c) represents a state where the coercive force Hc has shifted to a high-resistance state;

FIG. 37(a) to FIG. 37(d) show structures and each magnetization curve of a reference layer when magnetization M2 of a second magnetic layer (22) and magnetization M4 of a fourth magnetic layer (24) are varied in accordance with film thicknesses t2 and t4;

FIG. 39(a) to FIG. 39(c) represent a structure and a magnetization curve of a reference layer when magnetization of each magnetic layer is varied;

FIG. 41 represents a structure and a magnetization curve of a reference layer when an antiferromagnetic coupling force of each non-magnetic insertion layer is varied; and FIG. 42 represents the exchange coupling field $H_{ex1}$ when an antiferromagnetic coupling force of each non-magnetic insertion layer is varied.

DESCRIPTION OF THE PREFERRED EMBODIMENTS

Figure 1:
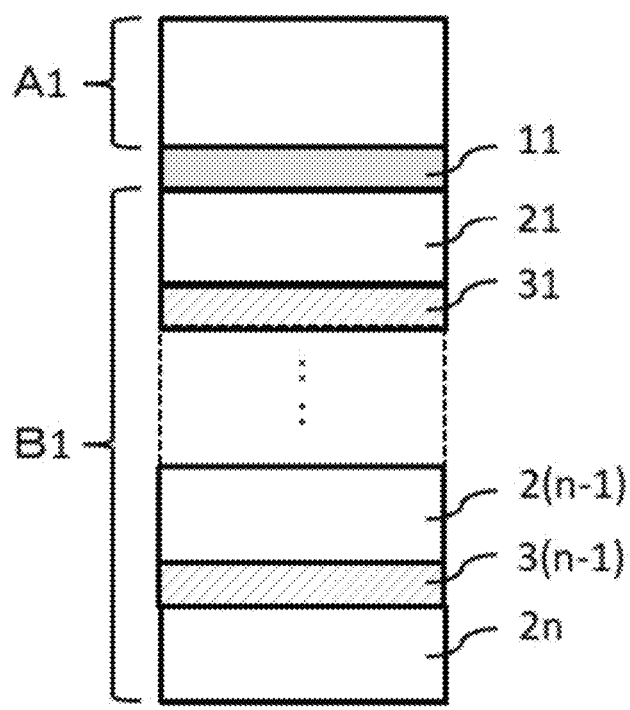
FIG. 1 is a longitudinal section view showing an example of a structure of a magnetoresistance effect element according to the present invention.

A magnetoresistance effect element and a magnetic memory according to the present invention will be described in detail with reference to the drawings.

It should be noted that the drawings merely represent examples and, while descriptions will be given using reference characters, the reference characters are not intended to limit the present invention in any way whatsoever. It should also be noted that widths and the like shown in the drawings do not necessarily represent actual ratios.

First Embodiment

Element Structure

FIG. 1 shows a structure according to a first embodiment of the present invention. A magnetoresistance effect element includes a structure in which a first recording layer (A1)/a first non-magnetic layer (11)/a first magnetic layer (21)/a first non-magnetic insertion layer (31)/ . . . /an (n−1)-th magnetic layer (2(n−1))/an (n−1)-th non-magnetic insertion layer (3(n−1))/and an n-th magnetic layer (2n) are sequentially and adjacently arranged, in which the first magnetic layer (21)/the first non-magnetic insertion layer (31)/ . . . /the (n−1)-th magnetic layer (2(n−1)) the (n−1)-th non-magnetic insertion layer (3(n−1)) and the n-th magnetic layer (2n) constitute a first reference layer (B1). n is 3 or larger, and more preferably 4 or larger.

A direction of magnetization of the magnetoresistance effect element according to the present invention is perpendicular to a film surface, and an orientation of magnetization of the first reference layer (B1) is fixed to being perpendicular to the film surface. An orientation of magnetization of the first recording layer (A1) is reversed to a parallel direction or an antiparallel direction with respect to the film surface vertical direction in correspondence with writing information.

The first recording layer (A1) is a material containing at least one 3d ferromagnetic transition metal element such as Co, Fe, Ni, and Mn, and examples thereof include Co, Fe, Ni, Cope, FeNi, CoNi, CoB, FeB, NiB, CoFeB, and MnAl. The first recording layer (A1) may also further contain a non-magnetic element such as B, V, Ti, Cr, Zr, Nb, Mo, Hf, Ta, W, Si, Al, Pd, Pt, or Ir.

The first recording layer (A1) may have a monolayer structure, a lamination layer structure, or a multilayer structure. The first recording layer (A1) may be in an alloyed state. When the first recording layer (A1) contains a non-magnetic element, a non-magnetic coupling layer may be appropriately arranged between a plurality of magnetic layers, the non-magnetic coupling layer causing a direction of magnetization between the magnetic layers to be the same, or an oxide of a non-magnetic element may be appropriately arranged.

Among the elements combined as described above, a content rate of some elements may be a minute amount or other magnetic materials or non-magnetic materials used to improve material characteristics may be further contained.

In addition, since the orientation of magnetization of the first recording layer (A1) is a film surface vertical direction, the first recording layer (A1) is preferably a material having interfacial perpendicular magnetic anisotropy in the film surface vertical direction. Furthermore, more preferably, an interface with the first non-magnetic layer (11) has perpendicular magnetic anisotropy, and a structure may be adopted in which two inter faces have perpendicular magnetic anisotropy by providing a non-magnetic layer other than the first non-magnetic layer (11).

A sum of film thicknesses of magnetic layers in the first recording layer (A1), while also dependent on layer structure, is preferably within a range of approximately 0.3 nm to 3.0 nm and more preferably within a range of 0.5 nm to 2.5 nm.

A material containing O (oxygen) may be used as the first non-magnetic layer (11). Since the first non-magnetic layer (11) is a barrier layer (a tunnel junction layer made of an insulating layer) of the magnetoresistance effect element, an insulating material containing oxygen such as MgO, $Al_2O_3$, $SiO_2$, TiO, or $Hf_2O$ is preferably used as the material of the first non-magnetic layer (11) so that a combination of materials of two joined end faces produces a large rate of change of magnetoresistance and, more preferably, MgO is used.

In order to increase the TMR ratio, the film thickness of the first non-magnetic layer (11) is preferably 0.5 nm or more and more preferably 0.8 nm or more. In addition, in order to cause a magnetization reversal with a small writing current Ic, the film thickness of the first non-magnetic layer (11) is preferably 2.0 nm or less and more preferably 1.5 nm or less. Therefore, the film thickness of the first non-magnetic layer (11) is preferably adjusted to a range of 0.5 nm to 2.0 nm and more preferably adjusted to a range of 0.8 nm to 1.5 nm.

The first reference layer (B1) is a ferromagnetic layer of which a direction of magnetization an orientation of magnetization) is fixed to a film surface vertical direction and which is structured by alternately and adjacently arranging n-number of magnetic layers (21, 22, 2n) and (n−1)-number of non-magnetic insertion layers (31, 32, . . . , 3(n−1)). A fixed layer or the like may be arranged adjacent to the first reference layer (B1) on an opposite side to the first non-magnetic layer (11).

The n-number of magnetic layers (21, 22, . . . , 2n) are ferromagnetic bodies at least containing any of 3d ferromagnetic transition metal elements, preferably containing at least one of Co, Fe, and Ni, and more preferably containing Co. Specific examples of the n-number of magnetic layers (21, 22, . . . , 2n) are combinations of elements such as Co, Fe, Ni, CoFe, FeNi, CoNi, CoB, FeB, NiB, CoFeB, CoPt, FePt, NiPt, CoPd, TbTeCo, MnAl, and MnGa, and more preferably combinations containing Co such as CoFe, CoNi CoB, CoFeB, CoPt, CoPd, and TbTeCo. The magnetic layer may be an alloy containing, in addition to the magnetic element described above, a non-magnetic element such as W, Ta, Hf, Zr, Nb, Mo, Ti, V, Cr, Si, Al, B, Pd, and Pt. Among the elements combined as described above, a content of some elements may be a minute amount or other magnetic materials or non-magnetic materials used to improve material characteristics may be further contained.

In addition, a thin non-magnetic coupling layer may be inserted into each magnetic layer. Examples of a material of the non-magnetic coupling layer include Pt, W, Ta, Hf, Zr, Nb, Mo, Ti, Mg, MgO, Cr, V, and Pd.

Each of the n-number of magnetic layers may have an alloyed structure, a monolayer structure, a lamination layer structure, a multilayer structure, a lamination layer structure with, other than Co/Pt, Pt, Ru, Ir, Rh, W, Ni, and Pd, a thin-layer ferri structure, and the like. When a ferromagnetic layer has a multilayer structure, an orientation of magnetization may be fixed to parallel or antiparallel depending on a material and/or a film thickness of the layers.

A sum of film thicknesses corresponding to magnetic elements of the n-number of magnetic layers (21, 22, . . . , 2n), while also dependent on layer structure, is adjusted to around 3.0 nm to 14 nm.

The (n−1)-number of non-magnetic insertion layers (31, 32, . . . , 3(n−1)) antiferromagnetically couple the adjacent magnetic layer with an element film constituting the non-magnetic insertion layer, and adjust interlayer exchange coupling energy $J_{ex}$ or, in other words, an antiferromagnetic coupling force between the adjacent magnetic layers with a constituent element and a film thickness thereof. Examples of materials whose interlayer exchange coupling energy $J_{ex}$ varies depending on film thickness include Ru, Ir, Rh, Os, Au, Re, and Cu.

The (n−1)-number of non-magnetic insertion layers may also contain another element insofar as the element does not alter crystal structure. Examples of such an element include Ta, B, Nb, and V.

Intensity of the interlayer exchange coupling energy $J_{ex}$ via the non-magnetic insertion layer or, in other words, intensity of the antiferromagnetic coupling force is adjusted by, in addition to adjusting the material and/or the film thickness of the non-magnetic insertion layer, varying a film thickness of an adjacent magnetic layer and adopting a multilayer film in which a magnetic layer and a non-magnetic insertion layer are alternately arranged as shown in FIG. 1. Ideally, within a range of film thickness where magnetism of an adjacent magnetic layer does not dissipate, when the film thickness of the magnetic layer is reduced, the intensity of the interlayer exchange coupling energy $J_{ex}$ or, in other words, the intensity of the antiferromagnetic coupling force increases in inverse proportion. In addition, when the number of lamination layers of a multilayer film is increased, the intensity of the interlayer exchange coupling energy $J_{ex}$ or, in other words, the intensity of the antiferromagnetic coupling force tends to increase.

When the non-magnetic layer contains Ru as a main element, the film thickness of the non-magnetic layer is desirably adjusted to 0.9±0.2 nm or 0.4±0.15 nm at which the antiferromagnetic coupling force peaks.

When the non-magnetic layer contains Ir as a main element, the film thickness of the non-magnetic layer is desirably adjusted to 0.5±0.15 nm or 1.35±0.1 nm at which the antiferromagnetic coupling force peaks. Details will be provided later.

A shift magnetic field Hs with respect to the first recording layer (A1) due to a stray magnetic field from the first reference layer (B1) is preferably smaller than a coercive force Hc of the first recording layer (A1), more preferably equal to or smaller than 0.5 or 0.2 of the coercive force Hc, and even more preferably equal to or smaller than 0.15 of the coercive force Hc. Details will be described later.

Antiferromagnetic Coupling Via Non-magnetic Insertion Layer

As described above, the (n−1)-number of non-magnetic insertion layers (31, 32, . . . , 3(n−1)) antiferromagnetically couple the adjacent magnetic layer with an element film constituting the non-magnetic insertion layer.

The interlayer exchange coupling energy $J_{ex}$ between two magnetic layers characteristically causes, when a non-magnetic layer is present between the magnetic layers, an oscillation of interlayer exchange coupling due to RKKY interaction with respect to certain elements depending on the film thickness of the non-magnetic layer. An oscillation period of the oscillation phenomenon is determined by a wavenumber of a nesting vector in a Fermi surface in a direction of film growth, and a standing wave with the wavenumber is to be created in the non-magnetic layer between the two magnetic layers to generate a quantum well state. In addition, when a nesting vector is absent in the Fermi surface, the intensity of the interlayer exchange coupling energy $J_{ex}$ monotonically decreases instead of oscillating.

Figure 32:
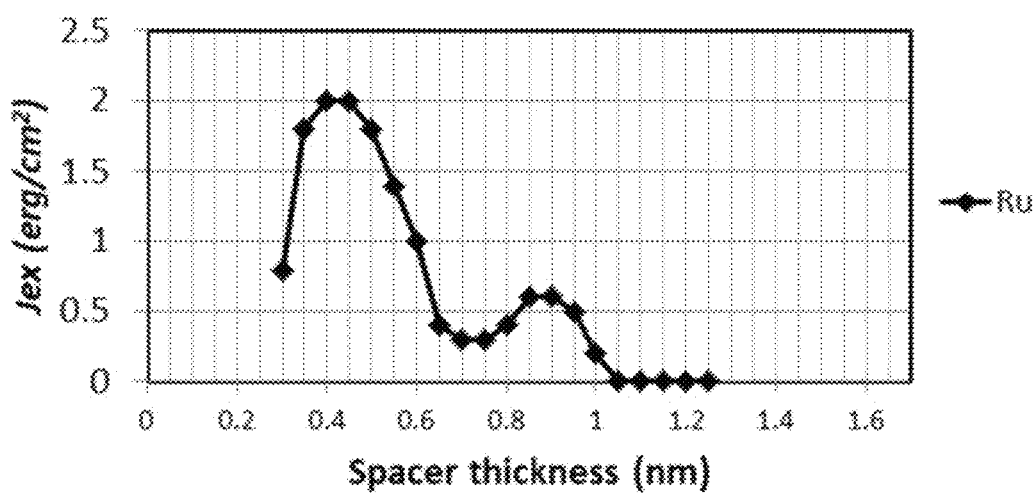
FIG. 32 is a graph representing a relationship between a film thickness of Ru and interlayer exchange coupling energy $J_{ex}$.

FIG. 32 shows a relationship between a film thickness of Ru and interlayer exchange coupling energy $J_{ex}$. The interlayer exchange coupling enemy $J_{ex}$ between Co magnetic layers shown in FIG. 32 can be calculated from a saturation magnetic field of magnetization by measuring magnetic characteristics of samples that represent variations of the film thickness of Ru of a three-layer film constituted by Co/Ru/Co.

FIG. 32 reveals that a peak representing a maximum value of the interlayer exchange coupling energy $J_{ex}$ is present when the film thickness of Ru is within a range of 0.4±0.15 nm and a second peak is present when the film thickness of Ru is within a range of 0.9±0.2 nm.

Figure 33:
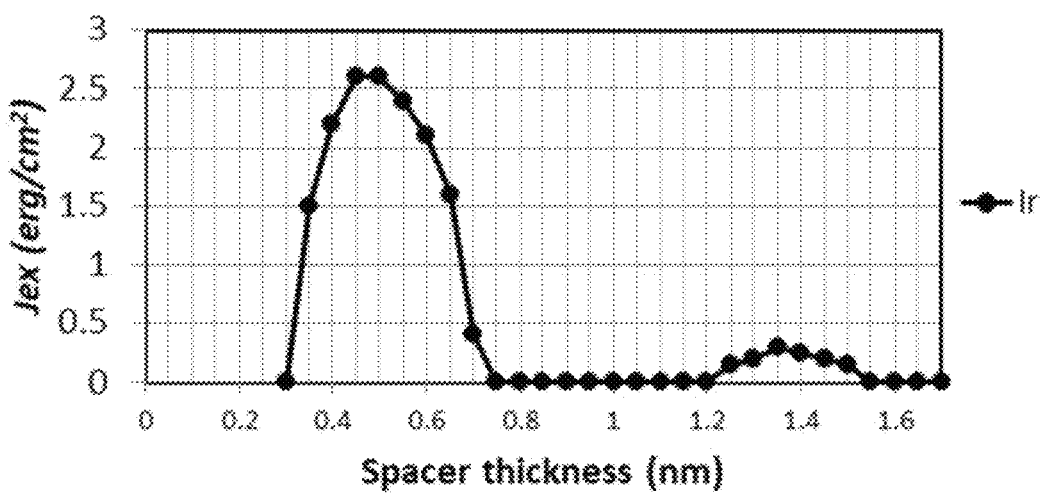
FIG. 33 is a graph representing a relationship between a rile thickness of Ir and interlayer exchange coupling energy $J_{ex}$.

FIG. 33 shows a relationship between a film thickness of Ir and interlayer exchange coupling energy $J_{ex}$. The interlayer exchange coupling energy $J_{ex}$ between Co magnetic layers shown in FIG. 33 can be calculated from a saturation magnetic field of magnetization by measuring magnetic characteristics of samples that represent variations of the film thickness of Ir of a three-layer film constituted by Co/Ir/Co.

FIG. 33 reveals that a peak representing a maximum value of the interlayer exchange coupling energy $J_{ex}$ is present when the film thickness of Ir is within a range of 0.5±: 0.15 nm and a second peak is present when the film thickness of Ir is within a range of 1.35±0.1 nm.

When selecting an element among Ru and Ir and a film thickness thereof, a setting of a magnitude of the interlayer exchange coupling energy $J_{ex}$ or, in other words, a magnitude of the antiferromagnetic coupling force, deterioration of antiferromagnetic coupling during heat treatment when manufacturing circuits such as a complementary MOS (CMOS), the number of non-magnetic insertion layers of Ru or Ir, and the like are taken into consideration. For example, with respect to a non-magnetic insertion layer that is close to a recording layer, setting a large antiferromagnetic coupling force may be considered, adjusting the film thickness to the range of the second peak in order to suppress deterioration of antiferromagnetic coupling due to heat treatment may be considered, or increasing the number of non-magnetic insertion layers so that, even when the antiferromagnetic coupling force of each non-magnetic insertion layer is small, the at antiferromagnetic coupling force of the recording layer as a whole is increased may be considered.

Stray Magnetic Field

As shown in FIG. 35A(*a*) to FIG. 35A(*d*), each magnetic layer constituting the first reference layer (B1) has magnetization (M1, M2, . . . ) in a direction parallel to or antiparallel to a film surface vertical direction, and a continuous magnetic field is generated so as to connect each arrow and a start point and end point of the arrows. While the magnetic field is dependent on a magnitude of magnetization of each magnetic layer and a magnitude of antiferromagnetic coupling between magnetic layers, the magnetic field generates a shift magnetic field Hs as a stray magnetic field from the first reference layer (B1) and affects the coercive force Hc of the first recording layer (A1) in a varying degree. In particular, compared to a leakage magnetic field of an element in which a direction of magnetization of a reference layer is in-plane only being generated from an end of the element and only having a small effect on the recording layer, since the direction of magnetization of the first reference layer (B1) of the magnetoresistance effect element according to the present invention is oriented in a film surface vertical direction or, in other words, a direction of the recording layer, the entire recording layer is affected by the stray magnetic field of the reference layer. The stray magnetic field shifts the coercive force Hc of the recording layer and affects a thermal stability factor Δ of the recording layer.

FIG. 36(*a*) to FIG. 36(*c*) show schematic charts of a relationship between the coercive force Hc of a recording layer and the shift magnetic field Hs. In FIG. 36(*a*) represents a state where the coercive force Hc has shifted to a low-resistance state due to an effect of the shift magnetic field Hs, FIG. 36(*b*) represents a state where the shift magnetic field Hs has no effect on the coercive force Hc, and FIG. 36(*c*) represents a state where the coercive force Hc has shifted to a high-resistance state due to an effect of the shift magnetic field Hs.

When a stray magnetic field from the reference layer is absent and there is no effect of the shift magnetic field Hs as shown in FIG. 36(*h*), a balance is established between a thermal stability factor $\Delta_P$ in a low-resistance state (P-state) and a thermal stability factor $\Delta_{AP}$ in a high-resistance state (AP-state) in magnetization of the magnetic layer in the recording laser. However, when the shift magnetic field Hs is generated by a stray magnetic field from the reference layer as shown in FIG. 36(*a*) and FIG. 36(*c*), the balance between the thermal stability factor $\Delta_P$ and the thermal stability factor $\Delta_{AP}$ is disrupted and may cause a failure in element operation. In addition, while the coercive force Hc of a magnetic layer of the recording layer is proportional to the thermal stability factor Δ of an element, when affected by the shift magnetic field Hs, an effective coercive force Hc' becomes Hc'=Hc−Hs and the thermal stability factor Δ decreases.

Therefore, the shill magnetic field Hs needs to be minimized and is preferably smaller than the coercive three Hc of the recording layer, more preferably equal to or smaller than 0.5 or 0.2 of the coercive force Hc, and even more preferably equal to or smaller than 0.15 of the coercive force Hc.

In a magnetoresistance effect element in which a direction of magnetization of a reference layer is a film surface vertical direction, methods of weakening the shift magnetic field Hs due to a stray magnetic field from the reference layer include replacing the two magnetic layers of the reference layer having been antiferromagnetically coupled to three or more magnetic layers or four or more magnetic layers as in the present invention. This is because, given that orientations of magnetization of adjacent magnetic layers in the reference layer are both N poles or both S poles, a magnetic field that leaks to a recording layer can be reduced. In the case of an element in which a direction of magnetization of a reference layer is in-plane, since an N pole and an S pole are reversed between adjacent upper and lower magnetic layers, antiferromagnetic coupling is known to be strengthened.

While an element size according to the first embodiment may be appropriately set, the element size is preferably 100 nm or smaller and more preferably 40 nm or smaller.

Second Embodiment

Element Structure

Figure 2:
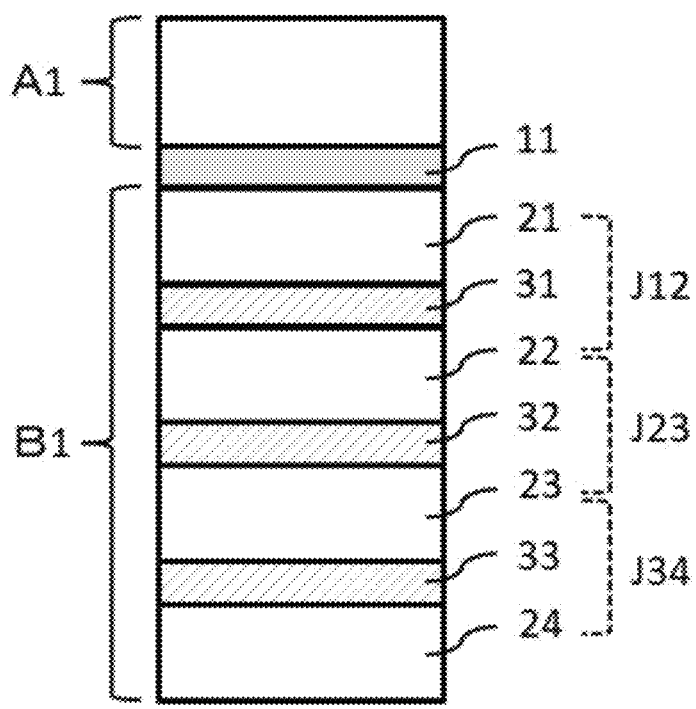
FIG. 2 is a longitudinal section view showing another example of a structure of the magnetoresistance effect element according to the present invention.

FIG. 2 shows a structure according to a second embodiment of the present invention. A magnetoresistance effect element includes a structure in which a first recording layer (A1) a first non-magnetic layer (11)/a first magnetic layer (21)/a first non-magnetic insertion layer (31)/a second magnetic layer (22)/a second non-magnetic insertion layer (32)/a third magnetic layer (23)/a third non-magnetic insertion layer (33)/and a fourth magnetic layer (24) are sequentially and adjacently arranged, in which the first magnetic layer (21)/the first non-magnetic insertion layer (31)/the second magnetic layer (22)/the second non-magnetic insertion layer (32)/the third magnetic layer (23)/the third non-magnetic insertion layer (33)/and the fourth magnetic layer (24) constitute a first reference layer (B1). In other words, the second embodiment represents a structure in a case where n=4 in the first embodiment.

Details of the second embodiment are similar to those of the first embodiment with the exception of the characteristics described below.

Magnetization and Film Thickness of Magnetic Layers

In the second embodiment, when magnetization of the first magnetic layer (21) is denoted by M1, magnetization of the second magnetic layer (22) is denoted by M2, magnetization of the third magnetic layer (23) is denoted by M3, and magnetization of the fourth magnetic layer (24) is denoted by M4, examples of a magnitude relationship thereof include M2+M4≥M1+M3, M2>M1, M2=M3>M1=M4, M4>M3, and M1=M2=M3=M4.

In this case, magnitudes of magnetization (M1, M2, M3, and M4) of the respective magnetic layers approximately correspond to film thicknesses of magnetic elements of the magnetic layers. Therefore, when the film thickness of the first magnetic layer (21) is denoted by t1, the film thickness of the second magnetic layer (22) is denoted by t2, the film thickness of the third magnetic layer (23) is denoted by t3, and the film thickness of the fourth magnetic layer (24) is denoted by t4, examples of a magnitude relationship thereof similarly include t2+t4≥t1+t3, t2>t1, t2=t3>t1=t4, t4>t3, and t1=t2=t3=t4.

Hereinafter, the magnitude relationships of magnetization and film thickness will be described.

In the following description, an antiferromagnetic coupling force between the first magnetic layer (21) and the second magnetic layer (22) is denoted by J12, an antiferromagnetic coupling force between the second magnetic layer (22) and the third magnetic layer (23) is denoted by J23, and an antiferromagnetic coupling force between the third magnetic layer (23) and the fourth magnetic layer (24) is denoted by J34.

FIG. 34A(a) represents a structure of a reference layer according to a conventional example having two magnetic layers and FIG. 34A(b) represents a structure of a reference layer according to the second embodiment having four magnetic layers. FIG. 34A(a) has a structure expressed as [Co(0.5)/Pt(0.3)]4.5/Ru(0.9)/[Co(0.5)/Pt(0.3)]4.5/MgO/recording layer, and FIG. 34A(b) has a structure expressed as [Co(0.5)/Pt(0.3)]2.5/Ru(0.9)/[Co(0.5)/Pt(0.3)]2.5/Ru(0.9)/[Co(0.5)/Pt(0.3)]2.5/Ru(0.9)/[Co(0.5)/Pt(0.3)]2.5/MgO/recording layer. In this case, the number of laminations, 2.5, shown in [Co(0.5)/Pt(0.3)]2.5, means that Co is laminated three times and Pt is laminated twice so that both ends are Co layers. FIG. 34B(b) shows details of Co/Pt layers of FIG. 34B(a). Hereinafter, similar descriptions apply to numbers of laminations in the present specification. Specifically, the number of laminations of [Co(0.5)/Pt(0.3)]3.5 is 3.5, which means that Co is laminated four times and Pt is laminated three times so that both ends are Co layers. In a similar manner, the number of laminations of [Co(0.5)/Pt(0.3)]1.5 is 1.5, which means that Co is laminated twice and Pt is laminated once so that both ends are Co layers. Furthermore, a bracketed numeral to the right of an element represents a film thickness expressed in units of nm (hereinafter, the same description applies in the present specification). In FIG. 34A(b), magnetization of the four magnetic layers is M1=M2=M3=M4 and film thicknesses are t1=t2=t3=t4. In addition, in both FIG. 34A(a) and FIG. 34A(b), a non-magnetic insertion layer is Ru with a film thickness of 0.9 nm, and antiferromagnetic coupling forces in FIG. 34A(b) are J12=J23=J34.

FIG. 34A(c) shows magnetization curves in the layer structures shown in FIG. 34A(a) and FIG. 34A(b). As indicated by arrows in the drawing, it is revealed that a magnetic field (an exchange coupling field $H_{ex1}$) in which magnetization saturates is increased from 3500 Oe in a conventional example to 6200 Oe.

Therefore, it is revealed that, even in a case where magnetization of the four magnetic layers is M1=M2=M3=M4, a current that causes a reversal of the fixed magnetization of the reference layer increases and a wider margin can be secured between the writing current Ic of the recording layer and the current at which magnetization of the reference layer reverses.

FIG. 35A(a) to FIG. 35A(d) show schematic charts of a stray magnetic field in the reference layer according to the second embodiment. FIG. 35A(a) is a schematic chart of a stray magnetic field when magnetization is expressed as M2>M1 or M2+M4≥M1+M3 and antiferromagnetic coupling forces are expressed as J12=J23=J34, FIG. 35A(b) is a schematic chart of a stray magnetic field when magnetization is expressed as M1>M2 and antiferromagnetic coupling forces are expressed as J12=J23=J34, FIG. 35A(c) is a schematic chart of a stray magnetic field when magnetization is expressed as M1=M2=M3=M4 and antiferromagnetic coupling forces are expressed as J12=J23=J34, and FIG. 35A(d) is a schematic chart of a stray magnetic field when magnetization is expressed as M1=M2=M3=M4 and antiferromagnetic coupling forces are expressed as J12=J34>J23.

With FIG. 35A(c) as a reference, it is shown that the stray magnetic field from the reference layer with respect to the recording, layer is large in FIG. 35A(b) but the stray magnetic field is small in FIG. 35A(a). In other words, it is revealed that making an adjustment to M2>M1 or M2+M4≥M1+M3 enables the stray magnetic field from the reference layer to be suppressed, an effect of the shift magnetic field Hs on the recording, layer to be reduced, the of coercive force Hc'=Hc−Hs to be increased, and the thermal stability factor Δ to be improved.

FIG. 37(a) to FIG. 37(d) show layer structures in which the film thickness t2 of Co that is at magnetic element of the second magnetic layer (22) and the film thickness t4 of Co that is a magnetic element of the fourth magnetic layer (24) have been varied and a magnetization curve of each recording layer.

In FIG. 37(a) represents a structure expressed as Pt(6→3)/[Co(0.5)/Pt(0.3)]1.5/Ru(0.9)/[Co(0.5)/Pt(0.3)]1.5/Ru(0.9)/[Co(0.5)/Pt(0.3)]1.5/Ru(0.9)/[Co(0.5)/Pt(0.3)]1.5/W(0.3)/CoFeB(1)/MgO(1.25)/recording layer, FIG. 37(b) represents a structure expressed as Pt(6→3)/[Co(0.5)/Pt(0.3)]1.5/Ru(0.9)/[Co(0.5)/Pt(0.3)]1.5/Ru(0.9)/[Co(0.5)/Pt(0.3)]2.5/Ru(0.9)/[Co(0.5)/Pt(0.3)]1.5/W(0.3)/CoFeB(1)/MgO(1.25)/recording layer, FIG. 37(c) represents a structure expressed as Pt(6→3)/[Co(0.5)/Pt(0.3)]1.5/Ru(0.9)/[Co(0.5)/Pt(0.3)]1.5/

Ru(0.9)/[Co(0.5)/Pt(0.3)]3.5/Ru(0.9)/[Co(0.5)/Pt(0.3)]1.5/ W(0.3)/CoFeB(1)/MgO(1.25)/recording layer, and FIG. 37(d) represents a structure expressed as Pt(6→3)/[Co(0.5)/ Pt(0.3)]2.5/Ru(0.9)/[Co(0.5)/Pt(0.3)]1.5/Ru(0.9)/[(Co(0.5)/ Pt(0.3)]2.5/Ru(0.9)/[Co(0.5)/Pt(0.3)]1.5/W(0.3)/CoFeB(1)/ MgO(1.25)/recording layer. Note that [Co(0.5)/Pt(0.3)]/Co (0.5), [Co(0.5/Pt(0.3)]2/Co(0.5), [Co(0.5/Pt(0.3)]3/Co(0.5), and the like shown in FIG. 37 are arranged so that both surfaces of a Pt layer are adjacent to and sandwiched by Co layers.

The magnetization curves of FIG. 37(a) and FIG. 37(b) show that, due to the effect of the shut magnetic field Hs caused by the stray magnetic field from the reference layer, the effective coercive force Hc' has decreased. In contrast, FIG. 37(c) and FIG. 37(d) show that the shift magnetic field Hs has become smaller but the effective coercive force Hc' has not decreased.

Therefore, from the perspective of a stray magnetic field, adjusting film thicknesses so as to satisfy $t2+t4 \geq t1+t3$, $t2>t1$, or $t4>t3$ and adjusting magnetization so as to satisfy $M2+M4 \geq M1+M3$, $M2>M1$, or $M4>M3$, the effective coercive force Hc' of the recording layer increases and the thermal stability factors of the element can be improved.

Figure 38:
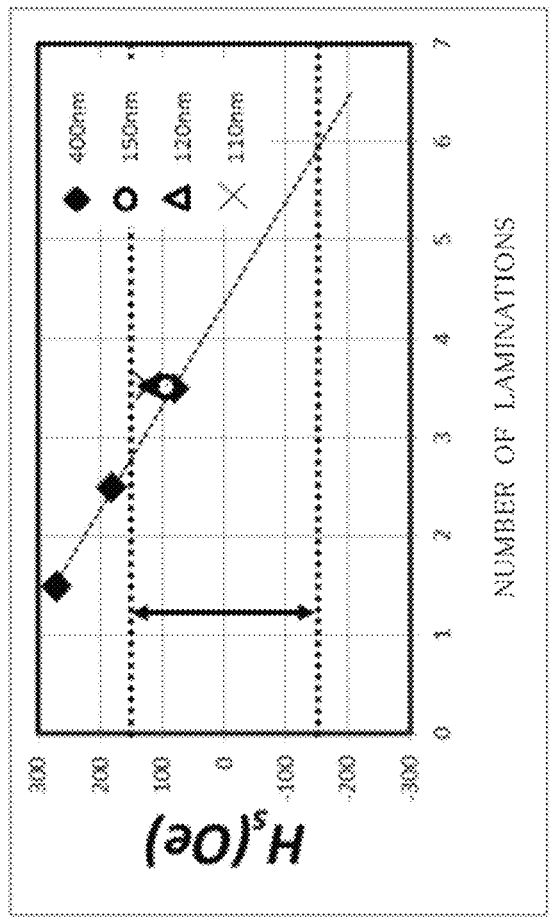
FIG. 38(a) represents a structure of a reference layer and FIG. 38(b) represents a relationship with a shift magnetic field when the magnetization M2 of the second magnetic layer (22) is varied in accordance with the number of laminations.
Figure 38:
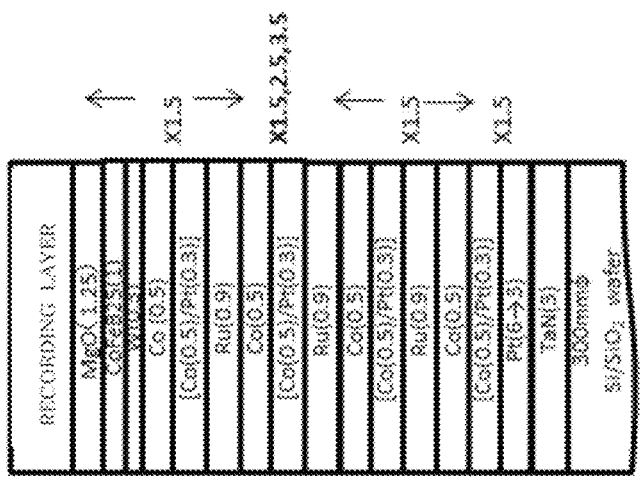

The shift magnetic field Hs was obtained from magnetization curves shown in FIG. 38(a) representing cases of samples shown in FIG. 37(a), FIG. 37(b), and FIG. 37(c) with element sizes of 400 nm, 150 nm, 120 nm, and 110 nm, and FIG. 38(b) shows a relationship between the shift magnetic field. Hs and the film thickness (number of laminations) of the magnetic layers. In addition, in the case of the samples, since the magnetization cures indicate that the coercive force Hc when the effect of a stray magnetic field is small is 1000 Oe, it is revealed that, in order to adjust the shill magnetic field Hs to a range of −200 Oe to 200 Oe which corresponds to 0.2 of the coercive force Hc, setting the film thickness of the second magnetic layer (22) to 2.0 nm to 3.0 nm (setting the number of laminations of Co/Pt to 2.5 times to 3.5 times) is preferable from the perspective of the stray magnetic field. Furthermore, it is revealed that, in order to adjust the shift magnetic field Hs to a range of −150 Oe to 150 Oe which corresponds to 0.15 of the coercive force Hc, setting the film thickness of the magnetic layer to 3.0 nm (setting the number of laminations of Co/Pt to 3.5 times) is preferable from the perspective of the stray magnetic field.

FIG. 39(a) to FIG. 39(c) show layer structures and magnetization curves when varying a magnitude of magnetization or, in other words, a film thickness of the magnetic layers. FIG. 39(a) represents M1=M2=M3=M4 and t1=t2=t3=t4, FIG. 39(b) represents M2=M3>M1=M4 and t2=t3>t1=t4, and FIG. 39(e) represents M1=M4>M2=M3 and t1=t4>t2=t3. Note that FIG. 39(a) to FIG. 39(c) all satisfy relationships of M2+M4=M1+M3 and t2+t4=t1+t3, the non-magnetic insertion layer is Ru with a film thickness of (0.9 nm, and J12=J23=J34.

In FIG. 39(a) represents a structure expressed as [Co(0.5)/ Pt(0.3)]2.5/Ru(0.9)/[Co(0.5)/Pt(0.3)]2.5/Ru(0.9)/[Co(0.5)/ Pt(0.3)]2.5/Ru(0.9)/[Co(0.5)/Pt(0.3)]2.5, (b) represents a structure expressed as [Co(0.5)/Pt(0.3)]1.5/Ru(0.9)/[Co (0.5)/Pt(0.3)]2.5/Ru(0.9)/[Co(0.5)/Pt(0.3)]2.5/Ru(0.9)/[Co (0.5)/Pt(0.3)]1.5, and (c) represents a structure expressed as [Co(0.5)/Pt(0.3)]2.5/Ru(0.9)/[Co(0.5)/Pt(0.3)]1.5/Ru(0.9)/ [Co(0.5)/Pt(0.3)]1.5/Ru(0.9)/[Co(0.5)/Pt(0.3)]2.5.

Figure 40:
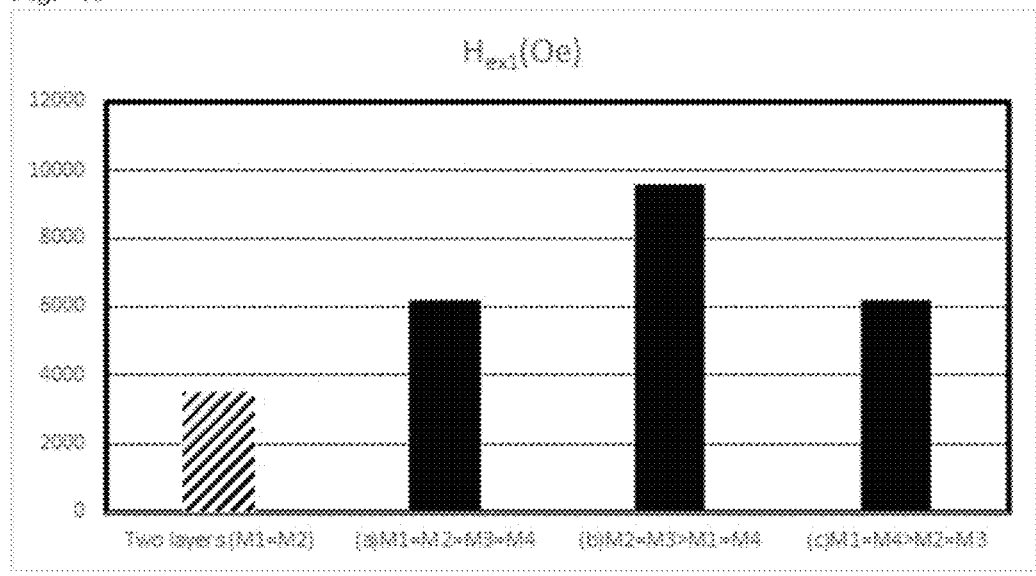
FIG. 40 represents the exchange coupling, field $H_{ex1}$ when magnetization of each magnetic layer is varied.

An exchange coupling field $H_{ex1}$ was obtained from the magnetization curves in FIG. 39(a) to FIG. 39(C) and is shown in Table 1 and FIG. 40 together with a value of a reference layer according to a conventional example having two magnetic layers.

TABLE 1

|  | $H_{ex1}$(Oe) |
| --- | --- |
| Two layers (M1 = M2) | 3500 |
| (a) M1 = M2 = M3 = M4 | 6200 |
| (b) M2 = M3 > M1 = M4 | 9000 |
| (c) M1 = M4 > M2 = M3 | 3200 |

Table 1 and FIG. 40 revealed that, compared to a reference layer according to a conventional example having two magnetic layers, (a), (b), and (c) all increase the exchange coupling field $H_{ex1}$.

In addition, using (a) in which magnetization of the four magnetic layers is the same or, in other words, film thicknesses of the magnetic layers are the same as a reference, it was revealed that by reducing magnetization M1 and M4 and film thicknesses t1 and t4 of the first magnetic layer (21) and the fourth magnetic layer (24), the exchange coupling field $H_{ex1}$ is increased from 6200 Oe to 9600 Oe. On the other hand, when magnetization M2 and M3 and film thicknesses t2 and t3 of the second magnetic layer (22) and the third magnetic layer (23) were reduced, the exchange coupling field $H_{ex1}$ remained more or less the same as that of (a) used as a reference.

Therefore, in the reference layer having four magnetic layers, when magnetization of the magnetic layers is M2=M3>M1=M4 or M2>M1, the exchange coupling field $H_{ex1}$ particularly increases and a wider margin can be secured between the writing current Ic of the recording layer and the current at which magnetization of the reference layer reverses.

As described above, front the perspectives of a margin between the writing current Ic of the recording layer and the current at which magnetization of the reference layer reverses and an improvement in the thermal stability factor Δ due to suppressing a stray magnetic field, the magnetization of the four magnetic layers of the first reference layer (B1) preferably satisfy conditions expressed as $M2+M4 \geq M1+M3$, $M2>M1$, $M2+M3>M1=M4$, and M1=M2=M3=M4, and film thicknesses of the magnetic layers preferably satisfy conditions expressed as $t2+t4 \geq t1+t3$, $t2>t1$, $t2=t3>t1=t4$, and t1=t2=t3=t4. Furthermore, the magnetization of the four magnetic layers of the first reference layer (B1) more preferably satisfy conditions expressed as $M2+M4 \geq M1+M3$ and/or $M2>M1$ and film thicknesses of the magnetic layers preferably satisfy conditions expressed as $t2+t4 \geq t1+t3$ and/or $t2>t1$.

Film Thickness of Non-magnetic Insertion Layer

FIG. 41(a) to FIG. 41(c) show layer structures and magnetization curves when varying film thicknesses of non-magnetic insertion layers (31, 32, and 33) or, in other words, antiferromagnetic coupling forces J12, J23, and J34. FIG. 41(a) represents J12=J23=J34, (b) represents J23>J12=J34, and (c) represents J12=J34>=J23. Note that the non-magnetic insertion layers (31, 32, and 33) of FIG. 41(a) to FIG. 41(c) are all Ru, and an antiferromagnetic coupling force at a film thickness of 0.9 nm is smaller than an antiferromagnetic coupling force at a film thickness of 0.4 nm.

In FIG. 41(a) represents a structure expressed as [Co(0.5)/ Pt(0.3)]2.5/Ru(0.9)/[Co(0.5)/Pt(0.3)]2.5/Ru(0.9)/[Co(0.5)/

Pt(0.3)]2.5/Ru(0.9)/[Co(0.5)/Pt(0.3)]2.5/Ru(0.9)/[Co(0.5)/Pt(0.3)]2.5, (b) represents a structure expressed as [Co(0.5)/Pt(0.3)]2.5/Ru(0.9)/[Co(0.5)/Pt(0.3)]2.5/Ru(0.4)/[Co(0.5)/Pt(0.3)]2.5/Ru(0.9)/[Co(0.5)/Pt(0.3)]2.5, and (c) represents a structure expressed as [Co(0.5)/Pt(0.3)]2.5/Ru(0.4)/[Co(0.5)/Pt(0.3)]2.5/Ru(0.9)/[Co(0.5)/Pt(0.3)]2.5/Ru(0.4)/[Co(0.5)/Pt(0.3)]2.5.

An exchange coupling field $H_{ex1}$ is obtained from the magnetization curves in FIG. 41 and shown in Table 2 and FIG. 42 together with a value of a reference layer according to a conventional example having two magnetic layers.

TABLE 2

| | $H_{ex1}$(Oe) |
|---|---|
| Two layers (Prior Art) | 3500 |
| (a) J12 = J23 = J34 | 6100 |
| (b) J23 > J12 = J34 | 6150 |
| (c) J12 = J34 > J23 | 12300 |

Table 2 and FIG. 42 revealed that, compared to a reference layer according to a conventional example having two magnetic layers. (a), (b), and (c) all, increase the exchange coupling field $H_{ex1}$.

In addition, using (a) in which antiferromagnetic coupling forces between the four magnetic layers are the same as a reference, it was revealed that by making the antiferromagnetic coupling force J12 between the first magnetic layer (21) and the second magnetic layer (22) and the antiferromagnetic coupling force J34 between the third magnetic layer (23) and the fourth magnetic layer (24) larger than the anti ferromagnetic coupling force J23 between the second magnetic layer (22) and the third magnetic layer (23), the exchange coupling field $H_{ex1}$ is increased from 6100 Oe to 12300 Oe. Conversely, when J23 is made larger than J12 and J34, the exchange coupling field $H_{ex1}$ remained more or less the same as that of (a) used as a reference.

Therefore, in the reference layer having four magnetic layers, when coupling on outer sides is strengthened as in the case of J12=J34>J23, the exchange coupling field $H_{ex1}$ particularly increases and a wider margin can be secured between the writing current Ic of the recording layer and the current at which magnetization of the reference layer reverses.

Furthermore, in order to increase the antiferromagnetic coupling forces J12 and J34, Ir with a film thickness of 0.5±0.15 nm may be inserted as the non-magnetic insertion layers (31 and 33) and Ru with a film thickness of 0.9±0.2 nm may be inserted as the second non-magnetic insertion layer (32).

Third Embodiment

Figure 3:
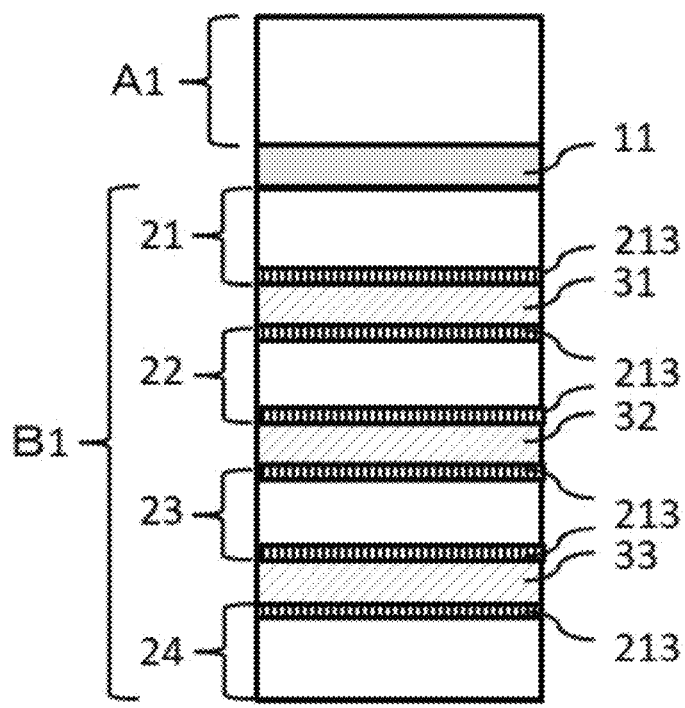
FIG. 3 is a longitudinal section view showing another example of a structure of the magnetoresistance effect element according to the present invention.

FIG. 3 shows a structure according to a third embodiment of the present invention. A magnetoresistance effect element includes a structure in which a first recording layer (A1)/a first non-magnetic layer (11)/a first magnetic layer (21)/a first non-magnetic insertion layer (31)/a second magnetic layer (22)/a second non-magnetic insertion layer (32)/a third magnetic layer (23)/a third non-magnetic insertion layer (33)/and a fourth magnetic layer (24) are sequentially and adjacently arranged, in which the first magnetic layer (21)/the first non-magnetic insertion layer (31)/the second magnetic layer (22)/the second non-magnetic insertion layer (32)/the third magnetic layer (23)/the third non-magnetic insertion layer (33)/and the fourth magnetic layer (24) constitute a first reference layer (B1), and each of the four magnetic layers (21, 22, 23, and 24) includes a Co layer (213) at an interface with adjacent non-magnetic insertion layers (31, 32, and 33).

Details of the third embodiment are similar to those of the second embodiment with the exception of the characteristics described below.

The first magnetic layer (21) has the Co layer (213) at an interlace with the first non-magnetic insertion layer (31), the second magnetic layer (22) has the Co layer (213) at an interface with the first non-magnetic insertion layer (31) and the second non-magnetic insertion layer (32), the third magnetic layer (23) has the Co layer (213) at an interface with the second non-magnetic insertion layer (32) and the third non-magnetic insertion layer (33), and the fourth magnetic layer (24) has the Co layer (213) at an interface with the third non-magnetic insertion layer (33).

By having the Co layer (213) come into contact with the interfaces of the three non-magnetic insertion layers (31, 32, and 33), the antiferromagnetic coupling forces (J12, J23, and J34) can be further increased.

The Co layer (213) may be an alloy containing, in addition to Co as a main component, a non-magnetic element such is W, Ta, Hf Zr, Nb, Mo, Ti, V, Cr, Si, Al, B, Pd, and Pt. Among the elements combined as described above, a content of some elements may be a minute amount or other magnetic materials or non-magnetic materials used to improve material characteristics may be further contained.

A film thickness of the Co layer (213) preferably ranges from 0.1 nm to 1.0 nm and more preferably ranges from 0.3 nm to 0.8 nm.

Fourth Embodiment

Figure 4:
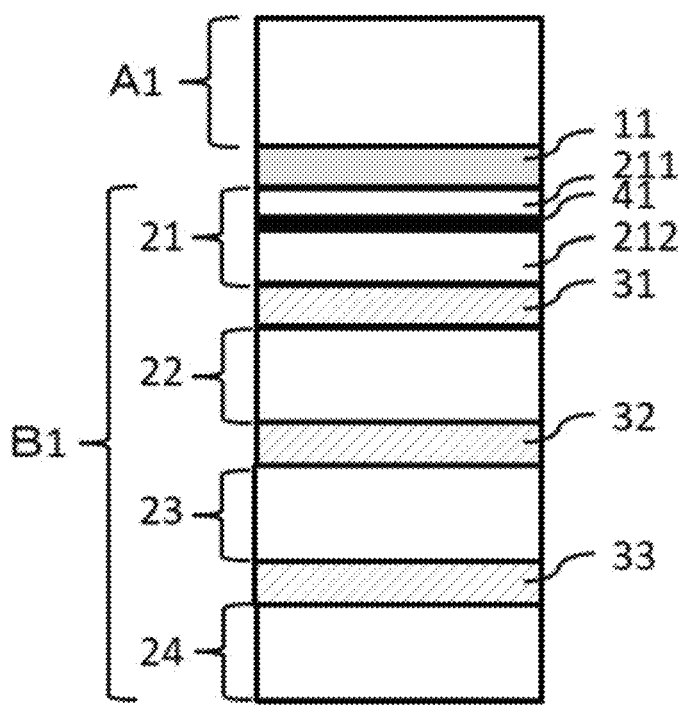
FIG. 4 is a longitudinal section view showing another example of a structure of the magnetoresistance effect element according to the present invention.

FIG. 4 shows a structure according to a to fourth embodiment of the present invention. A magnetoresistance effect element includes a structure in which a first recording layer (A1)/a first non-magnetic layer (11)/a first magnetic layer (21)/a first non-magnetic insertion layer (31)/a second magnetic layer (22)/a second non-magnetic insertion layer (32)/a third magnetic layer (23)/a third non-magnetic insertion layer (33)/and a fourth magnetic layer (24) are sequentially and adjacently arranged, in which the first magnetic layer (21)/the first non-magnetic insertion layer (31)/the second magnetic layer (22)/the second non-magnetic insertion layer (32)/the third magnetic layer (23)/the third non-magnetic insertion layer (33)/and the fourth magnetic layer (24) constitute a first reference layer (B1), and the first magnetic layer (21) includes an interface magnetic layer (211) which is adjacent to the first non-magnetic layer (11)/a non-magnetic coupling layer (41)/and a Co magnetic layer (212).

Details of the fourth embodiment are similar to those of the second embodiment with the exception of the characteristics described below.

The interface magnetic layer (211) included in the first magnetic layer (21) at least contains Co or Fe and is provided so as to have perpendicular magnetic anisotropy at the interface with the first non-magnetic layer (11). Specific examples of the interface magnetic layer (211) include Co, Fe, CoFe, FeNi, CoNi, CoB, FeB, and CoFeB, and CoFeB is more preferable. Providing the interface magnetic layer (211) described above to be adjacent to the non-magnetic layer is desirable since, when the adjacent first non-magnetic layer (11) is MgO, MgO can be oriented in as (001) crystal direction and a high tunnel magnetoresistance ratio (TMR ratio) can be obtained. The magnetic layer may be an alloy containing, in addition to the magnetic element described above, a non-magnetic element such as W, Ta, Hf, Zr, Nb, Mo, Ti, V, Cr, Si, Al, B, Pd, and Pt. Among the elements combined as described above, a content of some elements may be a minute amount or other magnetic materials or non-magnetic materials used to improve material characteristics may be further contained.

A film thickness of the interface magnetic layer (211) preferably ranges from 0.1 nm to 2.0 nm and more preferably ranges from 0.5 nm to 1.5 nm.

The non-magnetic coupling layer (41) included in the first magnetic layer (21) may further contain a non-magnetic element such as W, Ta, Hg, Zr, Nb, Mo, Ti, V, Cr, Si, Al, B, Pd, or Pt, and W or Ta is more preferable. The non-magnetic coupling layer (41) is capable of, when B is present in the adjacent magnetic layer, absorbing B and promoting crystallization and magnetically coupling the interface magnetic layer (211) and the Co magnetic layer (212) which are adjacent to the non-magnetic coupling layer (41). Furthermore, when a crystal structure of the Co magnetic layer (212) is an fcc structure, the non-magnetic coupling layer (41) has a function of resetting the fcc structure and orienting the interface magnetic layer (211) in a bcc structure. A combination of these actions enables a high tunnel magnetoresistance ratio (TMR ratio) to be obtained.

Since the non-magnetic coupling layer (41) must forcibly couple the interface magnetic layer (211) and the Co magnetic layer (212) which are adjacent to the non-magnetic coupling layer (41), a film thickness of the non-magnetic coupling layer (41) is adjusted to be sufficiently thin to, for example, around 0.2 nm to 0.7 nm.

The Co magnetic layer (212) included in the first magnetic layer (21) is a ferromagnetic body at least containing any of 3d ferromagnetic transition metal elements and at least contains Co. Specific examples of the Co magnetic layer (212) are combinations of elements such as Co, CoFe, CoNi, CoB, CoFeB, CoPt, CoPd, and TbTeCo, in which CoPt is preferable and a lamination layer of Co/Pt is more preferable. The magnetic layer may be an alloy containing, in addition to the magnetic element described above, a non-magnetic element such as W, Ta, Hf, Zr, Nb, Mo, Ti, V, Cr, Si, Al, B, Pd, and Pt. Among the elements combined as described above, a content of some elements may be a minute amount or other magnetic materials or non-magnetic materials used to improve material characteristics may be further contained.

In addition, a thin non-magnetic coupling layer may be inserted into the Co magnetic layer (212). Examples of a material of the non-magnetic coupling layer include Pt, Ta, Hf, Zr, Nb, Mo, Ti, Mg, MgO, Cr, V, and Pd.

The Co magnetic layer (212) may have a monolayer structure, a lamination layer structure, a multilayer structure, a lamination layer structure with, other than Co/Pt, Pt, Ru, Ir, Rh, W, Ni, and Pd, a thin-layer ferri structure, and the like. When a ferromagnetic layer has a multilayer structure, an orientation of magnetization may be fixed to parallel or antiparallel depending on a material and/or a film thickness of the layers.

Fifth Embodiment

Figure 5:
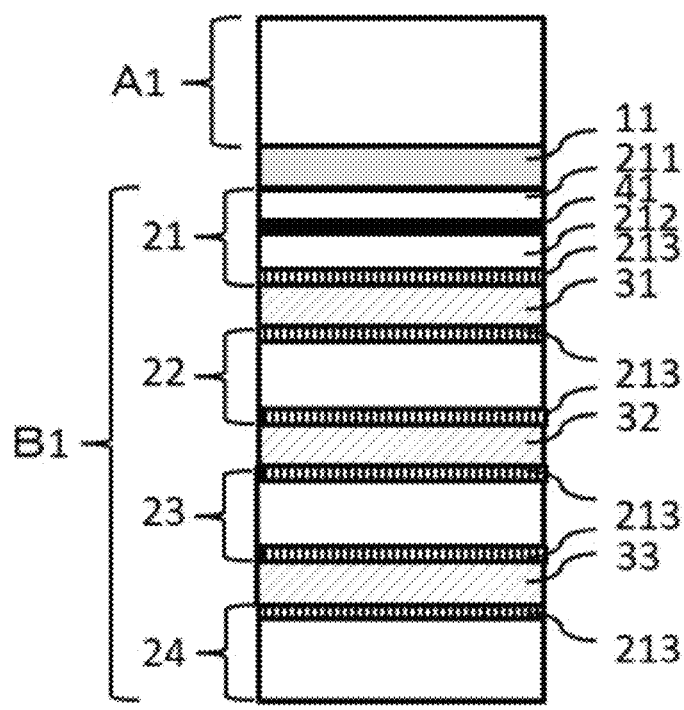
FIG. 5 is a longitudinal section view showing another example of a structure of the magnetoresistance effect element according to the present invention.

FIG. 5 shows a structure according to a fifth embodiment of the present invention. A magnetoresistance effect element includes a structure in which a first recording layer (A1)/a first non-magnetic layer (11)/a first magnetic layer (21)/a first non-magnetic insertion layer (31)/a second magnetic layer (22)/a second non-magnetic insertion layer (32)/a third magnetic layer (23)/a third non-magnetic insertion layer (33)/and a fourth magnetic layer (24) are sequentially and adjacently arranged, in which the first magnetic layer (21)/the first non-magnetic insertion layer (31)/the second magnetic layer (22)/the second non-magnetic insertion layer (32)/the third magnetic layer (23)/the third non-magnetic insertion layer (33)/and the fourth magnetic layer (24) constitute a first reference layer (B1), each of the four magnetic layers (21, 22, 23, and 24) includes a Co layer (213) at an interface with adjacent non-magnetic insertion layers (31, 32, and 33), and the first magnetic layer (21) includes an interface magnetic layer (211) which is adjacent to the first non-magnetic layer (11)/a non-magnetic coupling layer (41)/and a Co magnetic layer (212).

Details of the fifth embodiment are similar to those of the third and fourth embodiments with the exception of the characteristics described below.

The first magnetic layer (21) includes the interface magnetic layer (211), the non-magnetic coupling layer (41), the Co magnetic layer (212), and the Co layer (213).

Sixth Embodiment

Element Structure

Figure 6:
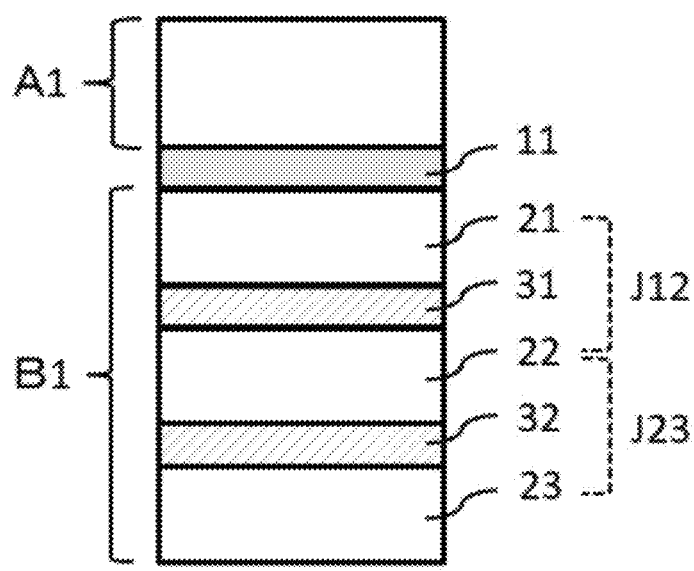
FIG. 6 is a longitudinal section view showing another example of a structure of the magnetoresistance effect element according to the present invention.

FIG. 6 shows a structure according to a sixth embodiment of the present invention. A magnetoresistance effect element includes a structure in which a first recording layer (A1)/a first non-magnetic layer (11)/a first magnetic layer (21)/a first non-magnetic insertion layer (31)/a second magnetic layer (22)/a second non-magnetic insertion layer (32)/and a third magnetic layer (23) are sequentially and adjacently arranged, in which the first magnetic layer (21)/the first non-magnetic insertion layer (31)/the second magnetic layer (22)/the second non-magnetic insertion layer (32)/the third magnetic layer (23) constitute a first reference layer (B1). In other words, the sixth embodiment represents a structure a case where n=3 in the first embodiment.

Details of the sixth embodiment are similar to those of the first and second embodiments with the exception of the characteristics described below.

Magnetization and Film Thickness of Magnetic Layers

When magnetization of the first magnetic layer (21) is denoted by M1, magnetization of the second magnetic layer (22) is denoted by M2, and magnetization of the third magnetic layer (23) is denoted by M3, examples of a magnitude relationship thereof include $M2 \geq M1+M3$ or $M2 \geq M1$.

In this case, magnitudes of magnetization (M1, M2, and M3) of the respective magnetic layers approximately correspond to film thicknesses of magnetic elements of the magnetic layers. Therefore, when the film thickness of the first magnetic layer (21) is denoted by t1, the film thickness of the second magnetic layer (22) is denoted by t2, and the film thickness of the third magnetic layer (23) is denoted by t3, examples of a magnitude relationship thereof include $t2 \geq t1+t3$ or $t2 \geq t1$.

Hereinafter, the magnitude relationships of magnetization and film thickness will be described.

In the following description, an antiferromagnetic coupling force between the first magnetic layer (21) and the second magnetic layer (22) is denoted by J12 and an antiferromagnetic coupling force between the second magnetic layer (22) and the third magnetic layer (23) is denoted by J23.

FIG. 35B(a) to FIG. 35B(d) shows a schematic chart of a stray magnetic field in the reference layer according to the sixth embodiment. FIG. 35B(a) is a schematic chart of a stray magnetic field when magnetization is expressed as M2>M1 or M2>M1+M3 and antiferromagnetic coupling forces are expressed as J12=J23, FIG. 35B(b) is a schematic chart of a stray magnetic field when magnetization is expressed as M1>M2 and antiferromagnetic coupling threes are expressed as J12=J23, FIG. 35B(c) is a schematic chart of a stray magnetic field when magnetization is expressed as M1=M2=M3 and antiferromagnetic coupling forces are expressed as J12=J23, and FIG. 35B(d) is a schematic chart of a stray magnetic field when magnetization is expressed as M1=M2=M3 and antiferromagnetic coupling forces are expressed as J12>J23.

With FIG. 35B(c) in FIG. 35B as a reference, it is shown that the stray magnetic field from the reference layer With respect to the recording layer is large in FIG. 35B(b) but the stray magnetic field is small in FIG. 35B(a). In other words, it is revealed that making an adjustment to M2>M1+M3 or M2>M1 enables the stray magnetic field from the reference layer to be suppressed, an effect of the shift magnetic field Hs on the recording layer to be reduced, a reduction in the effective coercive three Hc'=Hc−Hs to be suppressed, and the thermal stability factor Δ to be improved.

As described above, from the perspectives of a margin between the writing current Ic of the recording layer and the current at which magnetization of the reference layer reverses and an improvement in the thermal stability factor Δ due to suppressing a stray magnetic field, the magnetization of the three magnetic layers of the first reference layer (B1) more preferably satisfies conditions expressed as M2≥M1+M3 or M2≥M1 and film thicknesses of the magnetic layers mote preferably satisfy conditions expressed as t2≥t1+t3 or t2≥t1.

Seventh Embodiment

Figure 7:
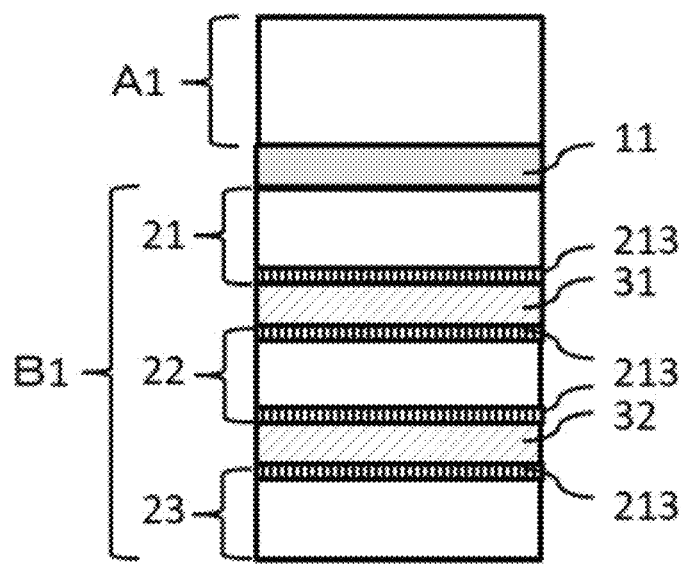
FIG. 7 is a longitudinal section view showing another example of a structure of the magnetoresistance effect element according to the present invention.

FIG. 7 shows a structure according to a seventh embodiment of the present invention. A magnetoresistance effect element includes a structure in which a first recording layer (A1)/a first non-magnetic layer (11)/a first magnetic layer (21)/a first non-magnetic insertion layer (31)/a second magnetic layer (22)/a second non-magnetic insertion layer (32)/ and a third magnetic laser (23) are sequentially and adjacently arranged, in which the first magnetic layer (21)/the first non-magnetic insertion layer (31) the second magnetic layer (22)/the second non-magnetic insertion layer (32)/and the third magnetic layer (23) constitute a first reference layer (B1), and each of the three magnetic layers (21, 22, and 23) includes a Co layer (213) at an interface with adjacent non-magnetic insertion layers (31 and 32).

Details of the seventh embodiment are similar to those of the third and sixth embodiments with the exception of the characteristics described below.

The first magnetic layer (21) has the Co layer (213) at an interface with the first non-magnetic insertion layer (31), the second magnetic layer (22) has the Co layer (213) at an interface with the first non-magnetic insertion layer (31) and the second non-magnetic insertion layer (32), and the third magnetic layer (23) has the Co layer (213) at an interface with the second non-magnetic insertion layer (32).

Eighth Embodiment

Figure 8:
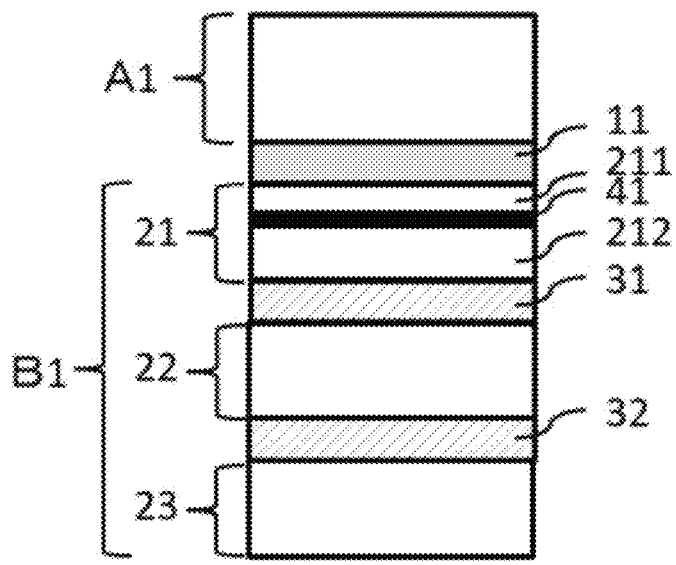
FIG. 8 is a longitudinal section view showing another example of a structure of the magnetoresistance effect element according to the present invention.

FIG. 8 shows a structure according to an eighth embodiment of the present invention. A magnetoresistance effect element includes a structure in which a first recording layer (A1)/a first non-magnetic layer (11)/a first magnetic layer (21)/a first non-magnetic insertion layer (31)/a second magnetic layer (22)/a second non-magnetic insertion layer (32)/ and a third magnetic layer (23) are sequentially and adjacently arranged, in which the first magnetic layer (21)/the first non-magnetic insertion layer (31)/the second magnetic layer (22)/the second non-magnetic insertion layer (32)/and the third magnetic layer (23) constitute a first reference layer (B1), and the first magnetic layer (21) includes an interface magnetic layer (211) which is adjacent to the first non-magnetic layer (11)/a non-magnetic coupling layer (41)/and a Co magnetic layer (212).

Details of the eighth embodiment are similar to those of the fourth and sixth embodiments.

Ninth Embodiment

Figure 9:
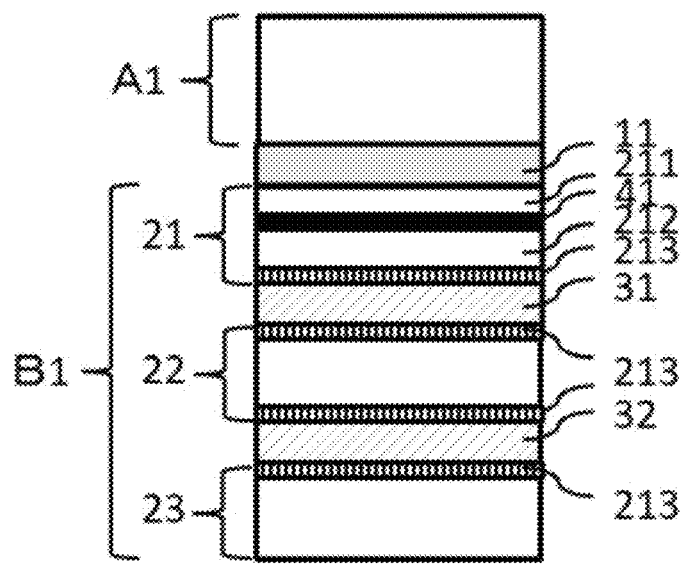
FIG. 9 is a longitudinal section view showing another example of a structure of the magnetoresistance effect element according to the present invention.

FIG. 9 shows a structure according to a ninth embodiment of the present invention. A magnetoresistance effect element includes a structure in which a first recording layer (A1)/a first non-magnetic layer (11)/a first magnetic layer (21)/a first non-magnetic insertion layer (31)/a second magnetic layer (22)/a second non-magnetic insertion layer (32)/and a third magnetic layer (23) are sequentially and adjacently arranged, in which the first magnetic layer (21)/the first non-magnetic insertion layer (31)/the second magnetic layer (22)/the second non-magnetic insertion layer (32)/and the third magnetic layer (23) constitute a first reference layer (B1), each of the three magnetic layers (21, 22, and 23) includes a Co layer (213) at an interface with adjacent non-magnetic insertion layers (31 and 32), and the first magnetic layer (21) includes an interface magnetic layer (211) which is adjacent to the first non-magnetic layer (11)/a non-magnetic coupling layer (41)/a Co magnetic layer (212)/and a Co layer (213).

Details of the ninth embodiment are similar to those of the fifth and sixth embodiments.

Tenth Embodiment

Figure 10:
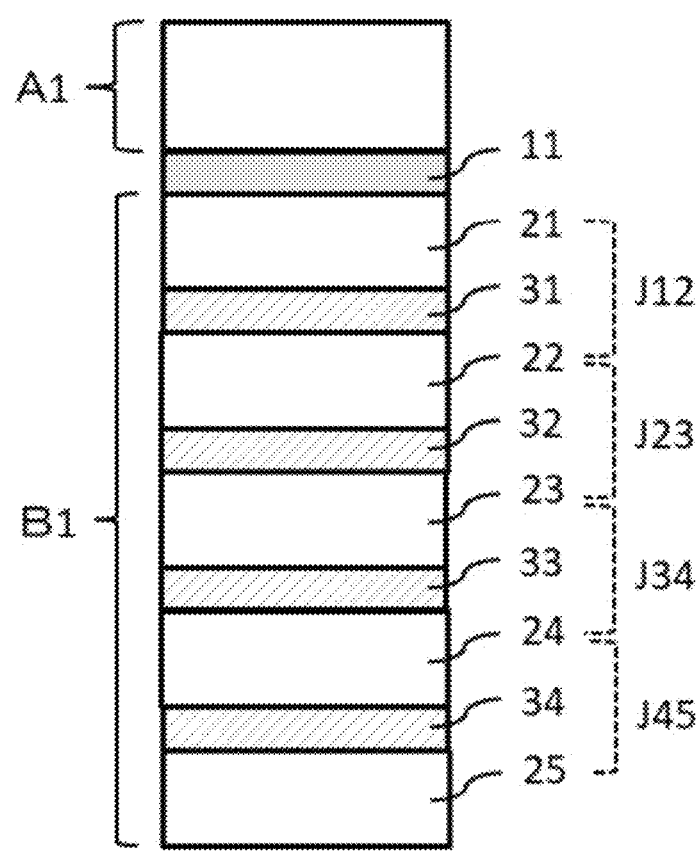
FIG. 10 is a longitudinal section view showing another example of a structure of the magnetoresistance effect element according to the present invention.

FIG. 10 shows a structure according to a tenth embodiment of the present invention. A magnetoresistance effect element includes a structure in which a first recording layer (A1)/a first non-magnetic layer (11)/a first magnetic layer (21)/a first non-magnetic insertion layer (31)/a second magnetic layer (22)/a second non-magnetic insertion layer (32)/a third magnetic layer (23)/a third non-magnetic insertion layer (33)/a fourth magnetic layer (24)/a fourth non-magnetic insertion layer (34)/and a fifth magnetic layer (25) are sequentially and adjacently arranged, in which the first magnetic layer (21)/the first non-magnetic insertion layer (31)/the second magnetic layer (22)/the second non-magnetic insertion layer (32)/the third magnetic layer (23)/the third non-magnetic insertion layer (33)/the fourth magnetic layer (24)/the fourth non-magnetic insertion layer (34)/and the filth magnetic layer (25) constitute a first reference layer (B1). In other words, the tenth embodiment represents a structure in a case where n=5 in the first embodiment.

Details of the tenth embodiment are similar to those of the first to fifth embodiments.

In FIG. 10, each of the magnetic layers (21, 22, 23, 24, and 25) may include the Co layer (213) at an interface with adjacent non-magnetic insertion layers (31, 32, 33, and 34).

In addition, the first magnetic layer (21) may include the interface magnetic layer (211) which is adjacent to the first non-magnetic layer (11)/the non-magnetic coupling layer (41)/and the Co magnetic layer (212).

Eleventh Embodiment

Figure 11:
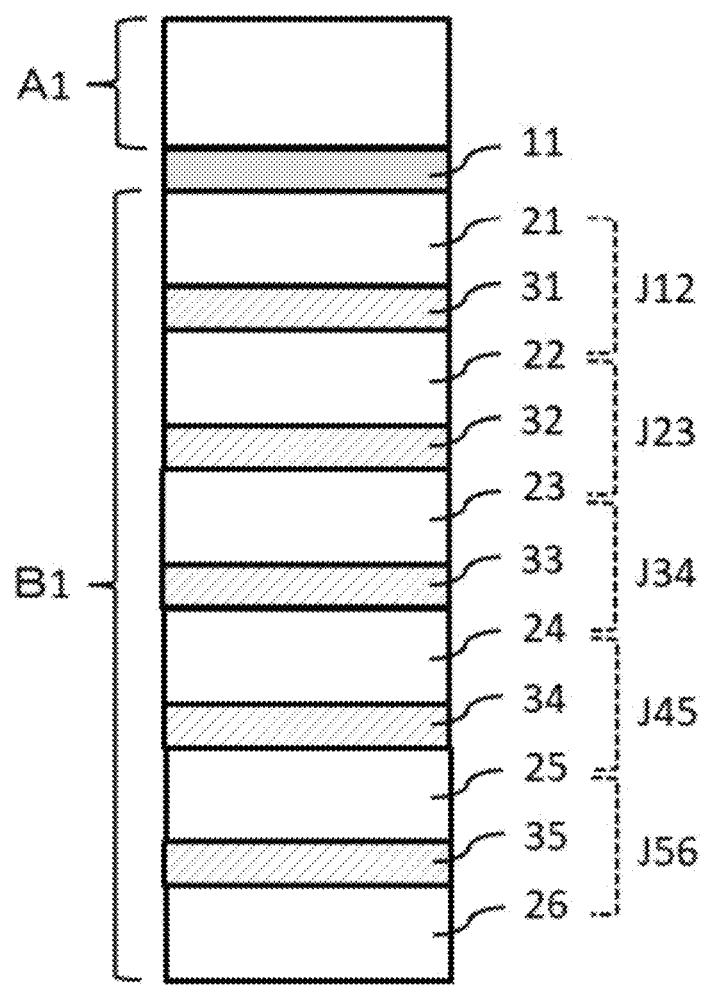
FIG. 11 is a longitudinal section view showing another example of a structure of the magnetoresistance effect element according to the present invention.

FIG. 11 shows a structure according to an eleventh embodiment of the present invention. A magnetoresistance effect element includes a structure in which a first recording layer (A1)/a first non-magnetic layer (11)/a first magnetic layer (21)/a first non-magnetic insertion layer (31)/a second magnetic layer (22)/a second non-magnetic insertion layer (32)/a third magnetic layer (23)/a third non-magnetic insertion layer (33)/a fourth magnetic layer (24)/a fourth non-magnetic insertion layer (34)/a fifth magnetic layer (25)/a fifth non-magnetic insertion layer (35)/and a sixth magnetic layer (26) are sequentially and adjacently arranged, in which the first magnetic layer (21)/the first non-magnetic insertion layer (31)/the second magnetic layer (22)/the second non-magnetic insertion layer (32)/the third magnetic layer (23)/the third non-magnetic insertion layer (33)/the fourth magnetic layer (24)/the fourth non-magnetic insertion layer (34)/the fifth magnetic layer (25)/the fifth non-magnetic insertion layer (35)/and the sixth magnetic layer (26) constitute a first reference layer (B1). In other words, the eleventh embodiment represents a structure in a case where n=6 in the first embodiment.

Details of the eleventh embodiment are similar to those of the first to fifth embodiments.

In FIG. 11, each of the magnetic layers (21, 22, 23, 24, 25, and 26) may include the Co layer (213) at an interface with adjacent non-magnetic insertion layers (31, 32, 33, 34, and 35).

In addition, the first magnetic layer (21) may include the interface magnetic layer (211) which is adjacent to the first non-magnetic layer (11)/the non-magnetic coupling layer (41)/and the Co magnetic layer (212).

Twelfth Embodiment

Figure 12:
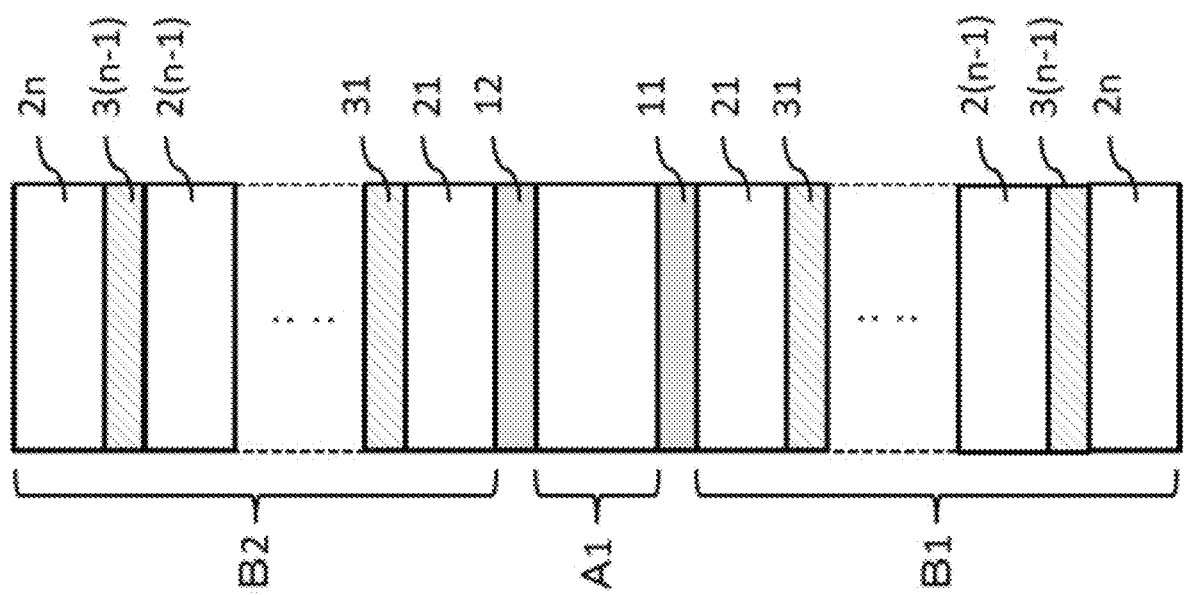
FIG. 12 is a longitudinal section view showing another example of a structure of the magnetoresistance effect element according to the present invention.

FIG. 12 shows a structure according to a twelfth embodiment of the present invention. A magnetoresistance effect element includes a structure in which an n-th magnetic layer (2n)/an (n−1)-th non-magnetic insertion layer (3(n−1))/an (n−1)-th magnetic layer (2(n−1))/ . . . /a first non-magnetic insertion layer (31)/a first magnetic layer (21) a second non-magnetic layer (12)/a first recording layer (A1)/a first non-magnetic layer (11)/a first magnetic layer (21)/a first non-magnetic insertion layer (31)/ . . . /(n−1)-th magnetic layer (2(n−1))/an (n−1)-th non-magnetic insertion layer (3(n−1))/and an n-th magnetic layer (2n) are sequentially and adjacently arranged.

[The first magnetic layer (21) which is adjacent to the first non-magnetic layer 11/the first non-magnetic insertion layer (31)/ . . . /the (n−1)-th magnetic layer (2(n−1))/the (n−1)-th non-magnetic insertion layer (3(n−1))/and the n-th magnetic layer (2n)] constitute a first reference layer (B1). n is 3 or larger and more preferably 4 or larger. [The n-th magnetic layer (2n) which is adjacent to the second non-magnetic layer 12/the (n−1)-th non-magnetic insertion layer (3(n−1))/ the (n−1)-th magnetic layer (2(n−1))/the first non-magnetic insertion layer (31)/and the first magnetic layer (21)] constitute a second reference layer (B2). n is 3 or larger and more preferably 4 or larger.

Details of the twelfth embodiment are similar to those of the first embodiment with the exception of the characteristics described below.

The second reference layer (B2) is a ferromagnetic layer of which a direction of magnetization (an orientation of magnetization) is fixed to a film surface vertical direction, and the first reference layer (B1) and the second reference layer (B2) may share a same structure or may differ from each other in film thickness and/or elemental composition of each layer. A structure in which a stray magnetic field from the first reference layer (B1) and a stray magnetic field from the second reference layer (B2) are canceled in the first recording layer (A1) is preferable, and a structure which reduces a total film thickness of the reference layers to increase an exchange coupling field is desirable. From this perspective, more preferably, the structure of the first reference layer (B1) and the structure of the second reference layer (B2) are made to be vertically symmetrical with the first recording layer (A1) therebetween.

The second non-magnetic layer (12) has a similar structure and similar characteristics to the first non-magnetic layer (11).

Thirteenth Embodiment

Figure 13:
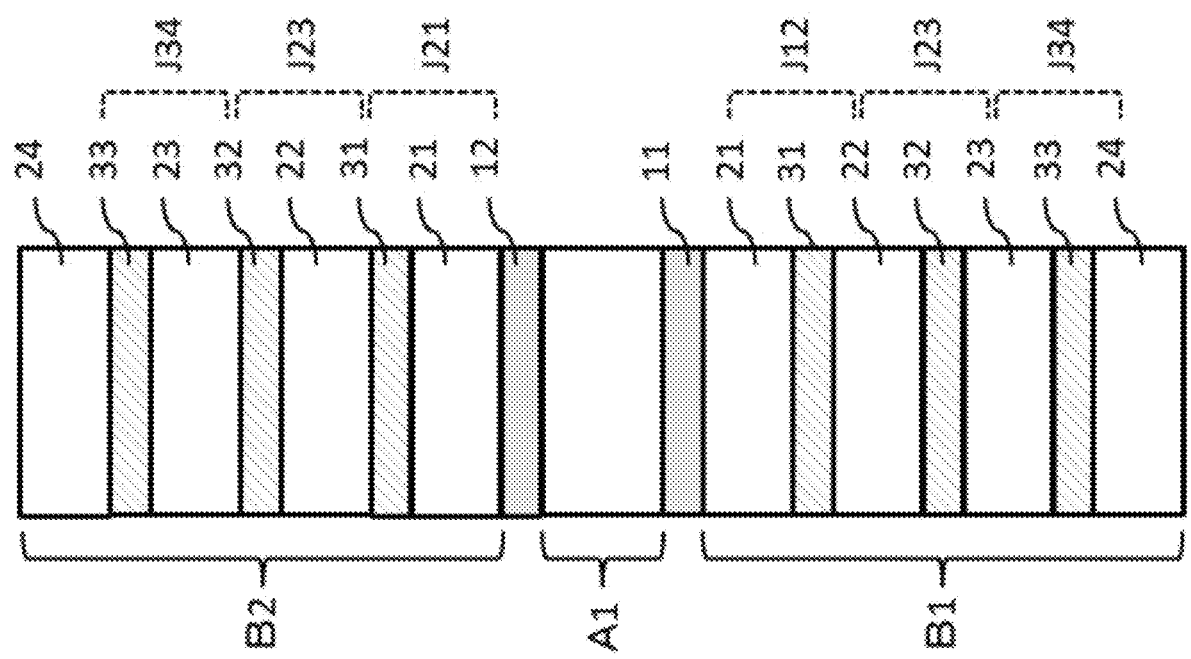
FIG. 13 is a longitudinal section view showing another example of a structure of the magnetoresistance effect element according to the present invention.

FIG. 13 shows a structure according to a thirteenth embodiment of the present invention. A magnetoresistance effect element includes a structure in which a fourth magnetic layer (24)/a third non-magnetic insertion layer (33)/a third magnetic layer (23)/a second non-magnetic insertion layer (32)/a second magnetic layer (22)/a first non-magnetic insertion layer (31)/a first magnetic layer (21)/a second non-magnetic layer (12)/a first recording layer (A1)/a first non-magnetic layer (11)/a first recording layer (21)/a first non-magnetic insertion layer (31)/a second magnetic layer (22)/a second non-magnetic insertion layer (32)/a third magnetic layer (23)/a third non-magnetic insertion layer (33)/and a fourth magnetic layer (24) are sequentially and adjacently arranged.

[The first magnetic layer (21) which is adjacent to the first non-magnetic layer (11)/the first non-magnetic insertion layer (31)/the second magnetic layer (22)/the second non-magnetic insertion layer (32)/the third magnetic layer (23)/ the third non-magnetic insertion layer (33)/and the fourth magnetic layer (24)] constitute a first reference layer (B1). In other words, this represents a structure in a case where n=4 in the twelfth embodiment. [The fourth magnetic layer (24) which is adjacent to the second non-magnetic layer (12)/the third non-magnetic insertion layer (33)/the third magnetic layer (23)/the second non-magnetic insertion layer (32)/the second magnetic layer (22)/the first non-magnetic insertion layer (31)/and the first magnetic layer (21)] constitute a second reference layer (B2). In other words, this represents a structure in a case where n=4 in the twelfth embodiment.

Details of the thirteenth embodiment are similar to those of the second and twelfth embodiments.

Fourteenth Embodiment

Figure 14:
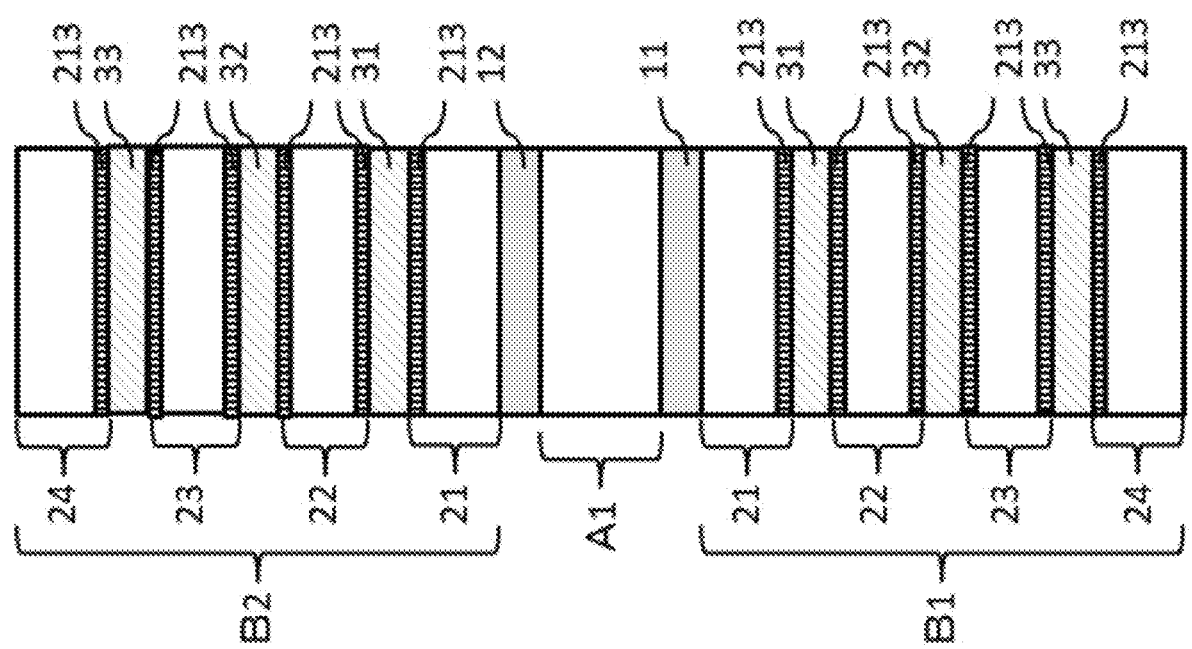
FIG. 14 is a longitudinal section view showing another example of a structure of the magnetoresistance effect element according to the present invention.

FIG. 14 shows a structure according to a fourteenth embodiment of the present invention. A magnetoresistance effect element includes a structure in which a fourth magnetic layer (24)/a third non-magnetic insertion layer (33)/a third magnetic layer (23)/a second non-magnetic insertion layer (32)/a second magnetic layer (22)/a first non-magnetic insertion layer (31)/a first magnetic layer (21)/a second non-magnetic layer (12)/a first recording layer (A1)/a first non-magnetic layer (11)/a first magnetic layer (21)/a first non-magnetic insertion layer (31)/a second magnetic layer (22)/a second non-magnetic insertion layer (32)/a third magnetic layer (23)/a third non-magnetic insertion layer (33)/and a fourth magnetic layer (24) are sequentially and adjacently arranged.

[The first magnetic layer (21) which is adjacent to the first non-magnetic layer (11) the first non-magnetic insertion layer (31)/the second magnetic layer (22)/the second non-magnetic insertion layer (32) the third magnetic layer (23)/ the third non-magnetic insertion layer (33)/and the fourth magnetic layer (24)] constitute a first reference layer (B1), and each of the four magnetic layers (21, 22, 23, and 24) includes a Co layer (213) at an interface with adjacent non-magnetic insertion layers (31, 32, and 33). [The fourth magnetic layer (24) which is adjacent to the second non-magnetic layer (12)/the third non-magnetic insertion layer (33)/the third magnetic layer (23)/the second non-magnetic insertion layer (32)/the second magnetic layer (22)/the first non-magnetic insertion layer (31)/and the first magnetic layer (21)] constitute a second reference layer (B2), and each of the four magnetic layers (21, 22, 23, and 24) includes a Co layer (213) at an interface with adjacent non-magnetic insertion layers (31, 32, and 33).

Details of the fourteenth embodiment are similar to those of the third and thirteenth embodiments.

Fifteenth Embodiment

Figure 15:
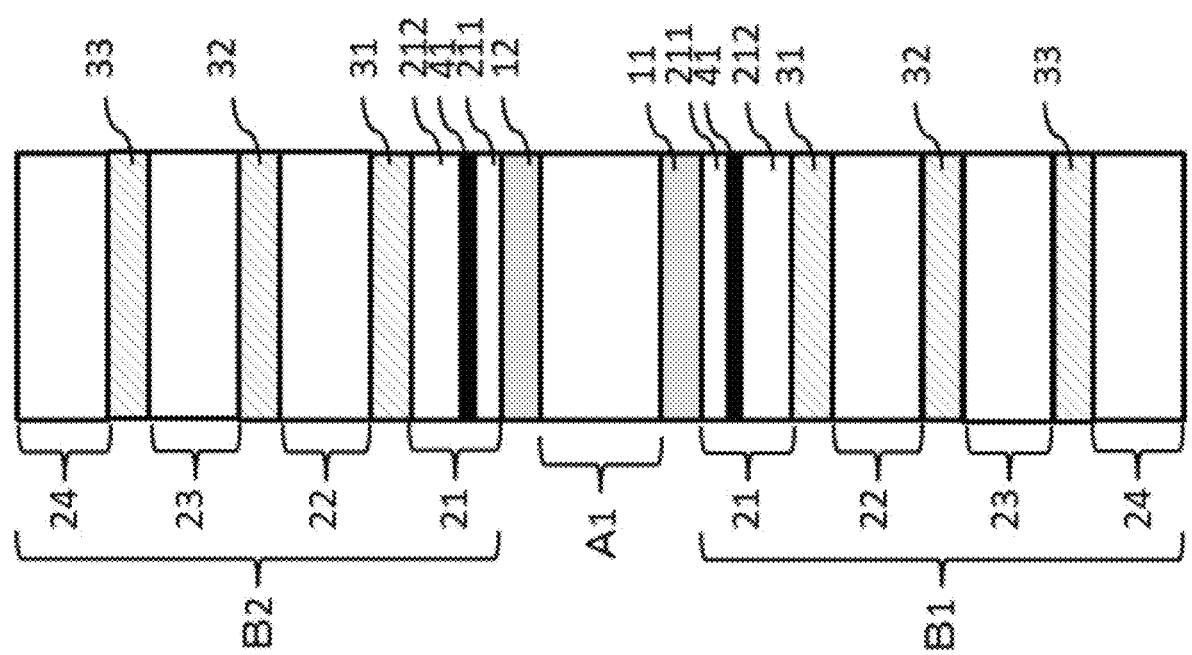
FIG. 15 is a longitudinal section view showing another example of a structure of the magnetoresistance effect element according to the present invention.

FIG. 15 shows a structure according, to a fifteenth embodiment of the present invention. A magnetoresistance effect element includes a structure in which a fourth magnetic layer (24)/a third non-magnetic insertion layer (33)/a third magnetic layer (23)/a second non-magnetic insertion layer (32)/a second magnetic layer (22)/a first non-magnetic insertion layer (31)/a first magnetic layer (21)/a second non-magnetic insertion layer (12)/a first recording layer (A1)/a first non-magnetic layer (11)/a first magnetic layer (21)/a first non-magnetic insertion layer (31)/a second magnetic layer (22)/a second non-magnetic insertion layer (32)/a third magnetic layer (23)/a third non-magnetic insertion layer (33)/and a fourth magnetic layer (24) are sequentially and adjacently arranged.

[The first magnetic layer (21) which is adjacent to the first non-magnetic layer (11)/the first non-magnetic insertion layer (31)/the second magnetic layer (22)/the second non-magnetic insertion layer (32)/the third magnetic layer (23)/ the third non-magnetic insertion layer (33)/and the fourth magnetic layer (24)] constitute a first reference layer (B1), and the first magnetic layer (21) in the first reference layer (B1) includes an interface magnetic layer (211) which is adjacent to the first non-magnetic layer (11)/a non-magnetic coupling layer (41)/and a Co magnetic layer (212). [The fourth magnetic layer (24) which is adjacent to the second non-magnetic layer (12)/the third non-magnetic insertion layer (33)/the third magnetic layer (23)/the second non-magnetic insertion layer (32)/the second magnetic layer (22)/the first non-magnetic insertion layer (31)/and the first magnetic layer (21)] constitute a second reference layer (B2), and the first magnetic layer (21) in the second reference layer (B2) includes an interface magnetic layer (211) which is adjacent to the second non-magnetic layer (12)/a non-magnetic coupling layer (41)/and a Co magnetic layer (212).

Details of the fifteenth embodiment are similar to those of the fourth and thirteenth embodiments.

Sixteenth Embodiment

Figure 16:
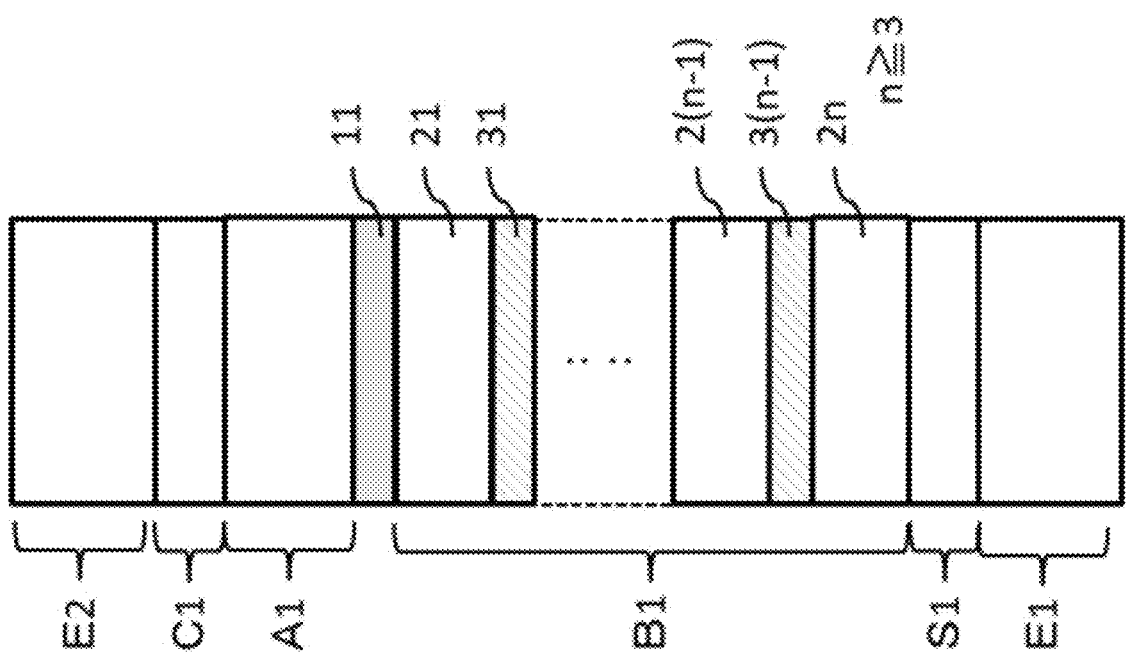
FIG. 16 is a longitudinal section view showing another example of a structure of the magnetoresistance effect element according to the present invention.

FIG. 16 shows a structure according to a sixteenth embodiment of the present invention. A magnetoresistance effect element includes a structure in which an upper electrode layer (E2) a cap layer (C1)/a first recording layer (A1)/a first non-magnetic layer (11)/a first reference layer (B1)/a ground layer (S1)/and a lower electrode layer (E1) are sequentially and adjacently arranged, in which the first reference layer (B1) includes a first magnetic layer (21) which is adjacent to the first non-magnetic layer (11)/a first non-magnetic insertion layer (31)/ . . . /an (n−1)-th magnetic layer (2(n−1))/an (n−1)-th non-magnetic insertion layer (3(n−1))/and an n-th magnetic layer (2n) which is adjacent to the ground layer (S1). n is 3 or larger and more preferably 4 or larger.

Details of the sixteenth embodiment are similar to those of the first embodiment with the exception of the characteristics described below.

The ground layer (S1) is provided when necessary on an opposite side to the first non-magnetic layer (11) of the first reference layer (B1), and the lower electrode layer (E1) is provided on an opposite side to the first reference layer (B1) of the ground layer (S1).

In addition, the cap layer (C1) is provided GU an opposite side to the first non-magnetic layer (11) of the first recording layer (A1), and the upper electrode layer (E2) is provided on an opposite side to the first recording layer (A1) of the cap layer (C1).

Examples of a laminate structure of the lower electrode layer (E1) include Ta (5 nm)/Ru (5 nm)/Ta (10 nm)/Pt (5 nm) and Ta (5 nm)/TaN (20 nm).

Examples of a laminate structure of the upper electrode layer (E2) include Ta (50 nm), Ta (5 nm)/Ru (50 nm), Ru (1 nm to 50 nm), Pt (1 nm to 50 nm), and CoFeB (0.2 nm to 1.5 nm)/Ru (5 nm) Ta (50 nm).

The cap layer (C1) is desirably constituted by a material that protects the recording layer and examples thereof include Ta, Ru, Pt, and CoFeB.

The ground layer (S1) is laminated on top of the lower electrode for the purpose of diffusion prevention, crystal orientation control of tipper magnetic layers, and the like. Examples thereof include Ta(5), Ta(5)/Pt(5) and Ta(5)/Ru (30).

Seventeenth Embodiment

Figure 17:
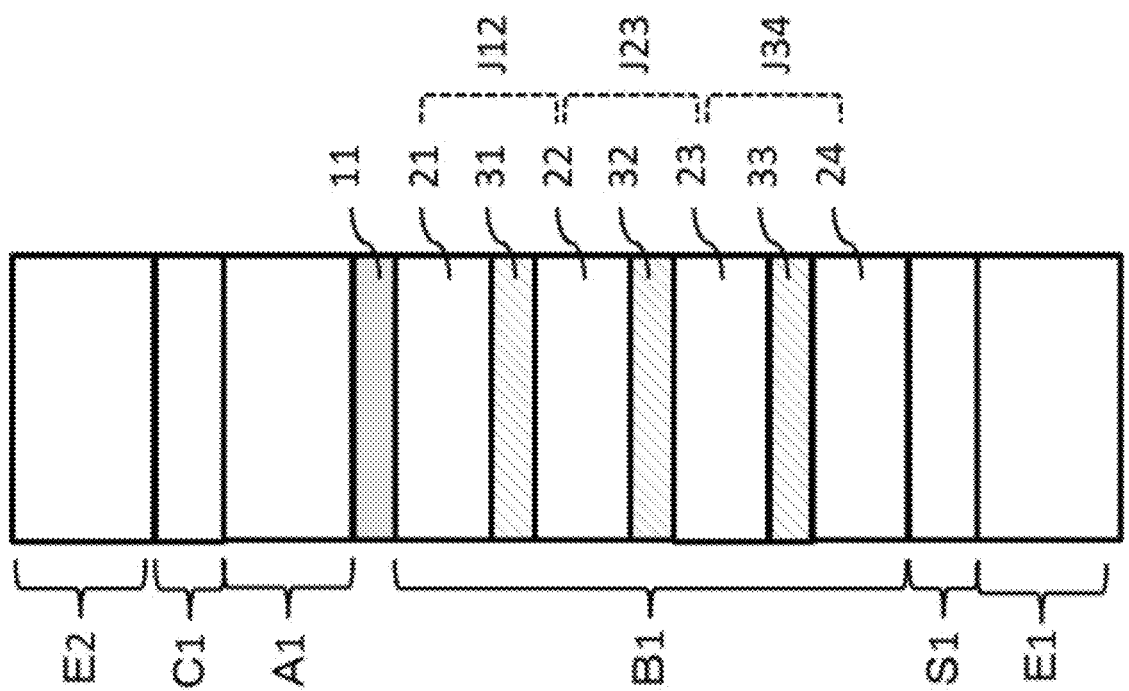
FIG. 17 is a longitudinal section view showing another example of a structure of the magnetoresistance effect element according to the present invention.

FIG. 17 shows a structure according to a seventeenth embodiment of the present invention. A magnetoresistance effect element includes a structure in which an upper electrode layer (E2)/a cap layer (C1)/a first recording layer (A1)/a first non-magnetic layer (11)/a first reference layer (B1)/a ground layer (S1)/and a lower electrode layer (E1) are sequentially and adjacently arranged, in which the first reference layer (B1) includes a first magnetic layer (21) which is adjacent to the first non-magnetic layer (11)/a first non-magnetic insertion layer (31)/a second magnetic layer (22)/a second non-magnetic insertion layer (32)/a third magnetic layer (23)/a third non-magnetic insertion layer (33)/and a fourth magnetic layer (24) which is adjacent to the ground layer (S1).

Details of the seventeenth embodiment are similar to those of the second and sixteenth embodiments.

Eighteenth Embodiment

Figure 18:
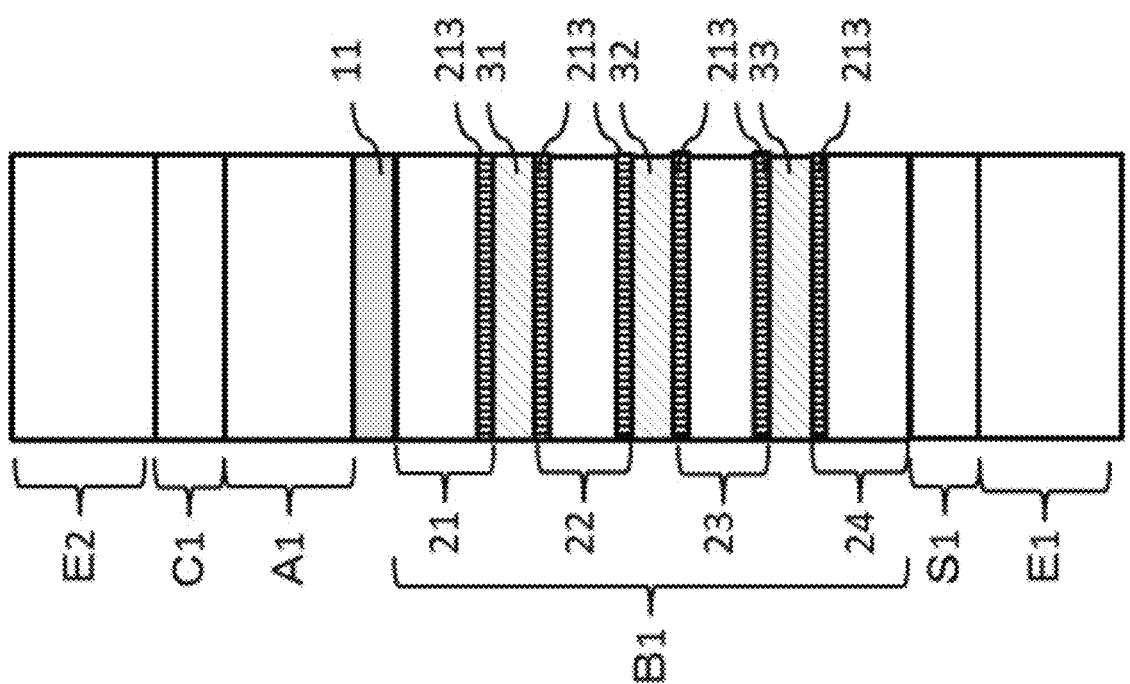
FIG. 18 is a longitudinal section view showing another example of a structure of the magnetoresistance effect element according to the present invention.

FIG. 18 shows a structure according to an eighteenth embodiment of the present invention. A magnetoresistance effect element includes a structure in which an upper electrode layer (E2)/a cap layer (C1)/a first recording layer (A1)/a first non-magnetic layer (11)/a first reference layer (B1)/a ground layer (S1)/and a lower electrode layer (E1) are sequentially and adjacently arranged, in which the first reference layer (B1) includes a first magnetic layer (21) which is adjacent to the first non-magnetic layer (11)/a first non-magnetic insertion layer (31)/a second magnetic layer (22)/a second non-magnetic insertion layer (32)/a third magnetic layer (23)/a third non-magnetic insertion layer (33)/and a fourth magnetic layer (24) which is adjacent to the ground layer (S1), and each of the four magnetic layers (21, 22, 23, and 24) includes a Co layer (213) at an interface with adjacent non-magnetic insertion layers (31, 32, and 33).

Details of the eighteenth embodiment are similar to those of the third and sixteenth embodiments.

Nineteenth Embodiment

Figure 19:
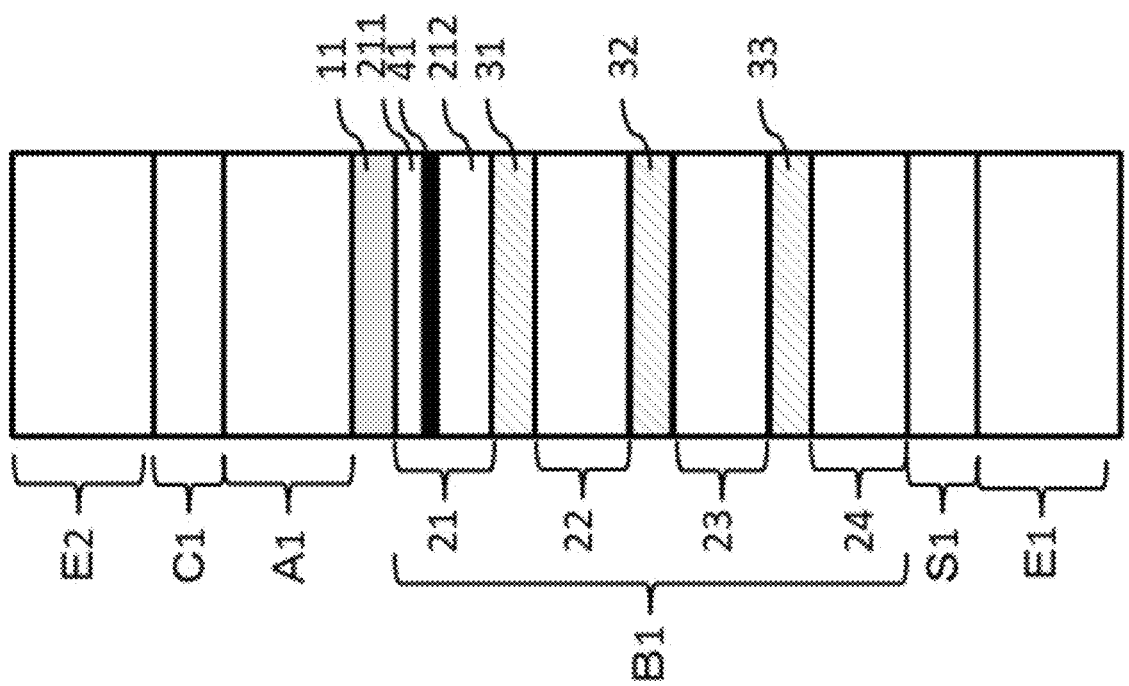
FIG. 19 is a longitudinal section view showing another example of a structure of the magnetoresistance effect element according to the present invention.

FIG. 19 shows a structure according to a nineteenth embodiment of the present invention. A magnetoresistance effect element includes a structure in which an upper electrode layer (E2)/a cap layer (C1)/a first recording layer (A1)/a first non-magnetic layer (11)/a first reference layer (B1)/a ground layer (S1)/and a lower electrode layer (E1) are sequentially and adjacently arranged, in which the first reference layer (B1) includes a first magnetic layer (21) which is adjacent to the first non-magnetic layer (11)/a first non-magnetic insertion layer (31)/a second magnetic layer (22)/a second non-magnetic insertion layer (32)/a third magnetic layer (23)/a third non-magnetic insertion layer (33)/and a fourth magnetic layer (24) which is adjacent to the ground layer (S1), and the first magnetic layer (21) includes an interface magnetic layer (211) which is adjacent to the first non-magnetic layer (11)/a non-magnetic coupling layer (41)/and a Co magnetic layer (212).

Details of the nineteenth embodiment are similar to those of the fourth and sixteenth embodiments.

Twentieth Embodiment

Figure 20:
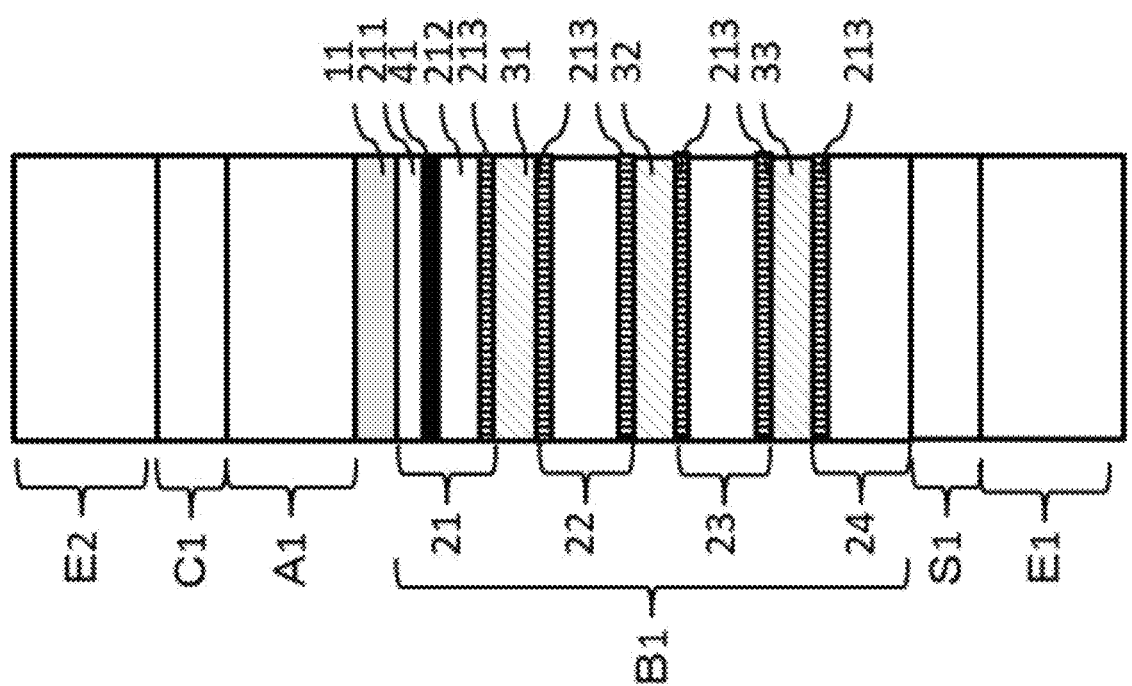
FIG. 20 is a longitudinal section view showing another example of a structure of the magnetoresistance effect element according to the present invention.

FIG. 20 shows a structure according to a twentieth embodiment of the present invention. A magnetoresistance effect element includes a structure in which an upper electrode layer (E2)/a cap layer (C1)/a first recording layer (A1)/a first non-magnetic layer (11)/a first reference layer (B1)/a ground layer (S1)/and a lower electrode layer (E1) are sequentially and adjacently arranged, in which the first reference layer (B1) includes a first magnetic layer (21) which is adjacent to the first non-magnetic layer (11)/a first non-magnetic insertion layer (31)/a second magnetic layer (22)/a second non-magnetic insertion layer (32)/a third magnetic layer (23)/a third non-magnetic insertion layer (33)/and a fourth magnetic layer (24) which is adjacent to the ground layer (S1), each of the four magnetic layers (21, 22, 23, and 24) includes a Co layer (213) at an interface with adjacent non-magnetic insertion layers (31, 32, and 33), and the first magnetic layer (21) includes an interface magnetic layer (211) which is adjacent to the first non-magnetic layer (11)/a non-magnetic coupling layer (41)/a Co magnetic layer (212)/and a Co layer (213).

Details of the twentieth embodiment are similar to those of the fifth and sixteenth embodiments.

Twenty-First Embodiment

Figure 21:
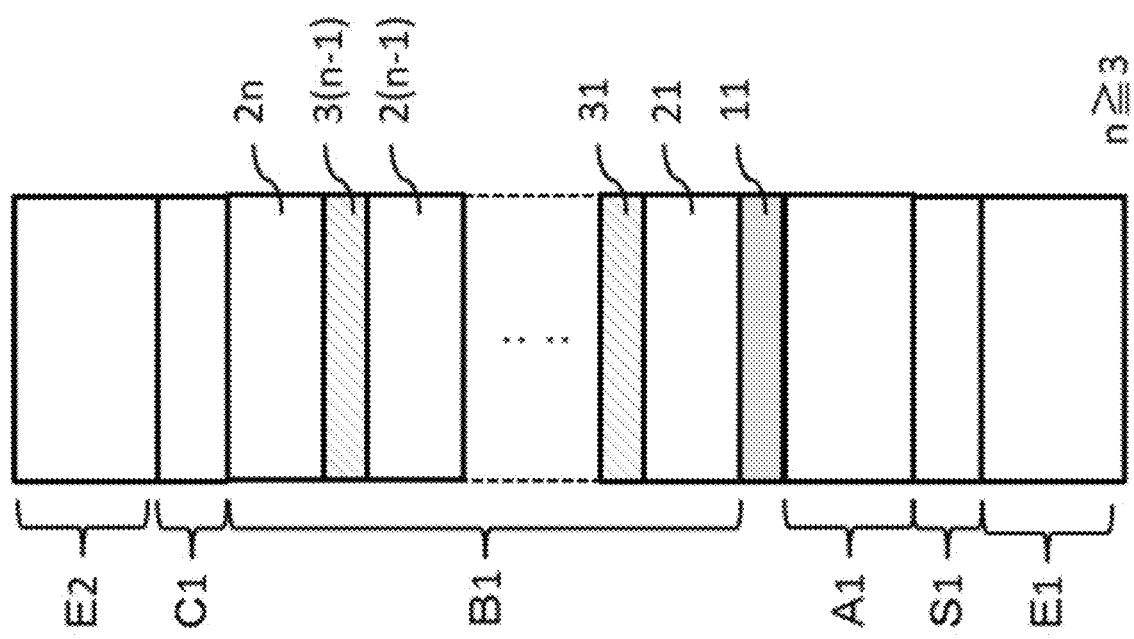
FIG. 21 is a longitudinal section view showing another example of a structure of the magnetoresistance effect element according to the present invention.

FIG. 21 shows a structure according to a twenty-first embodiment of the present invention. A magnetoresistance effect element includes a structure which an upper electrode layer (E2)/a cap layer (C1)/a first reference layer (B1)/a first non-magnetic layer (11)/a first recording layer (A1)/a ground layer (S1)/and a lower electrode layer (E1) are sequentially and adjacently arranged, in which the first reference layer (B1) includes an n-th magnetic layer (2n) which is adjacent to the cap layer/an (n−1)-th non-magnetic insertion layer (3(n−1))/an (n−1)-th magnetic layer (2(n−1))/ . . . /a first non-magnetic insertion layer (31)/and a first magnetic layer (21) which is adjacent to the first non-magnetic layer (11). n is 3 or larger and more preferably 4 or larger.

Details of the twenty-first embodiment are similar to those of the sixteenth embodiment with the exception of the characteristics described below.

The cap layer (C1) is provided when necessary on an opposite side to the first non-magnetic layer (11) of the first reference layer (B1), and the upper electrode layer (E2) is provided on an opposite side to the first reference layer (B1) of the cap layer (C1).

In addition, the ground layer (S1) is provided on an opposite side to the first non-magnetic layer (11) of the first recording layer (A1), and the lower electrode layer (E1) is provided on an opposite side to the first recording layer (A1) of the ground layer (S1).

The sixteenth and twenty-first embodiments represent structures in which positions of reference layers and recording layers have been reversed with respect to a vertical direction of electrodes. Although dependent on various conditions, the reference layers are preferably arranged on a side of the upper electrode in order to improve magnetic characteristics of the recording layers.

Twenty-Second Embodiment

Figure 22:
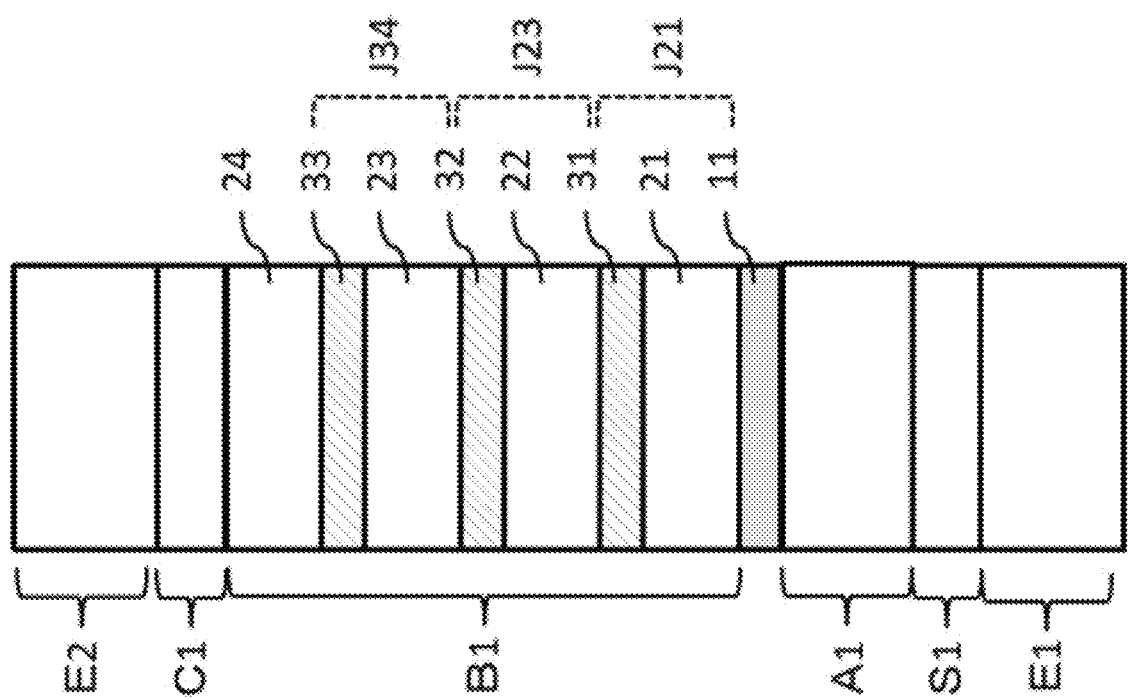
FIG. 22 is a longitudinal section view showing another example of a structure of the magnetoresistance effect element according to the present invention.

FIG. 22 shows a structure according to a twenty-second embodiment of the present invention. A magnetoresistance effect element includes a structure in which an upper electrode layer (E2)/a cap layer (C1)/a first reference layer (B1)/a first non-magnetic layer (11)/a first recording layer (A1)/a ground layer (S1)/and a lower electrode layer (E1) are sequentially and adjacently arranged, in which the first reference layer (B1) includes a fourth magnetic layer (24) which is adjacent to the cap layer (C1)/a third non-magnetic insertion layer (33)/a third magnetic layer (23)/second non-magnetic insertion layer (32)/a second magnetic layer (22)/a first non-magnetic insertion layer (31)/and a first magnetic layer (21) which is adjacent to the first non-magnetic layer (11).

Details of the twenty-second embodiment are similar to those of the seventeenth and twenty-first-embodiments.

Twenty-Third Embodiment

Figure 23:
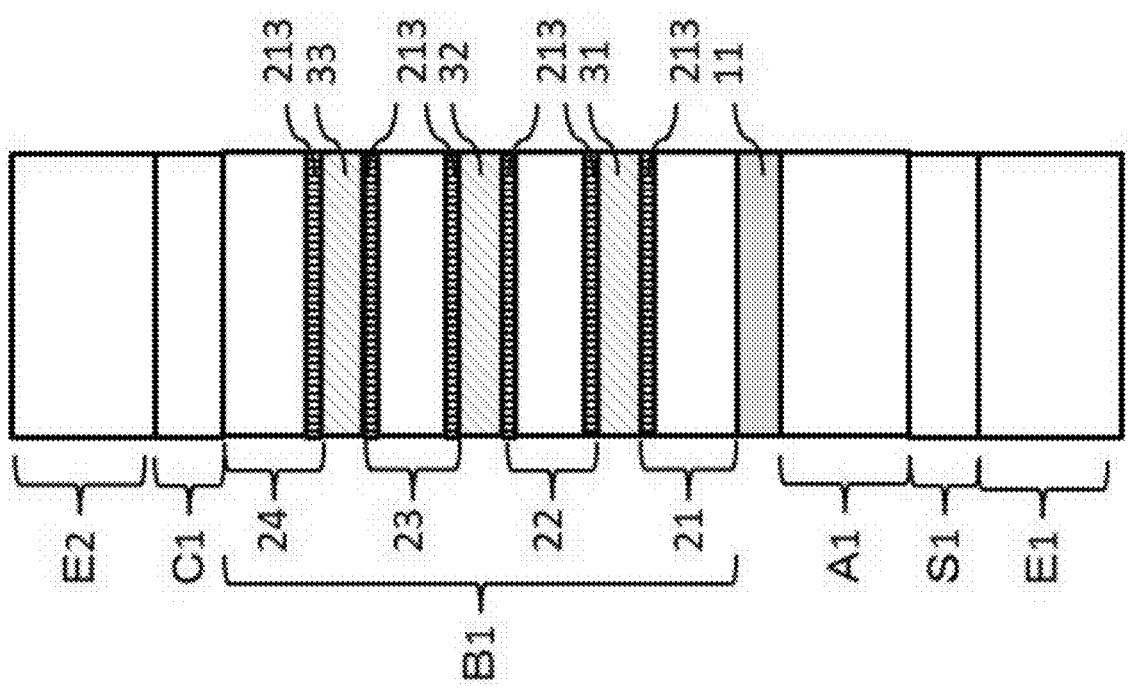
FIG. 23 is a longitudinal section view showing another example of a structure of the magnetoresistance effect element according to the present invention.

FIG. 23 shows a structure according to a twenty-third embodiment of the present invention. A magnetoresistance effect element includes a structure in which an upper electrode layer (E2)/a cap layer (C1)/a first reference layer (B1)/a first non-magnetic layer (11)/a first recording layer (A1)/a ground layer (S1)/and a lower electrode layer (E1) are sequentially and adjacently arranged, in which the first reference layer (B1) includes a fourth magnetic layer (24) which is adjacent to the cap layer (C1)/a third non-magnetic insertion layer (33)/a third magnetic layer (23)/a second non-magnetic insertion layer (32)/a second magnetic layer (22)/a first non-magnetic insertion layer (31)/and a first magnetic layer (21) which is adjacent to the first non-magnetic layer (11), and each of the four magnetic layers (21, 22, 23, and 24) includes a Co layer (213) at an interface with adjacent non-magnetic insertion layers (31, 32, and 33).

Details of the twenty-third embodiment are similar to those of the eighteenth and twenty-first embodiments.

Twenty-Fourth Embodiment

Figure 24:
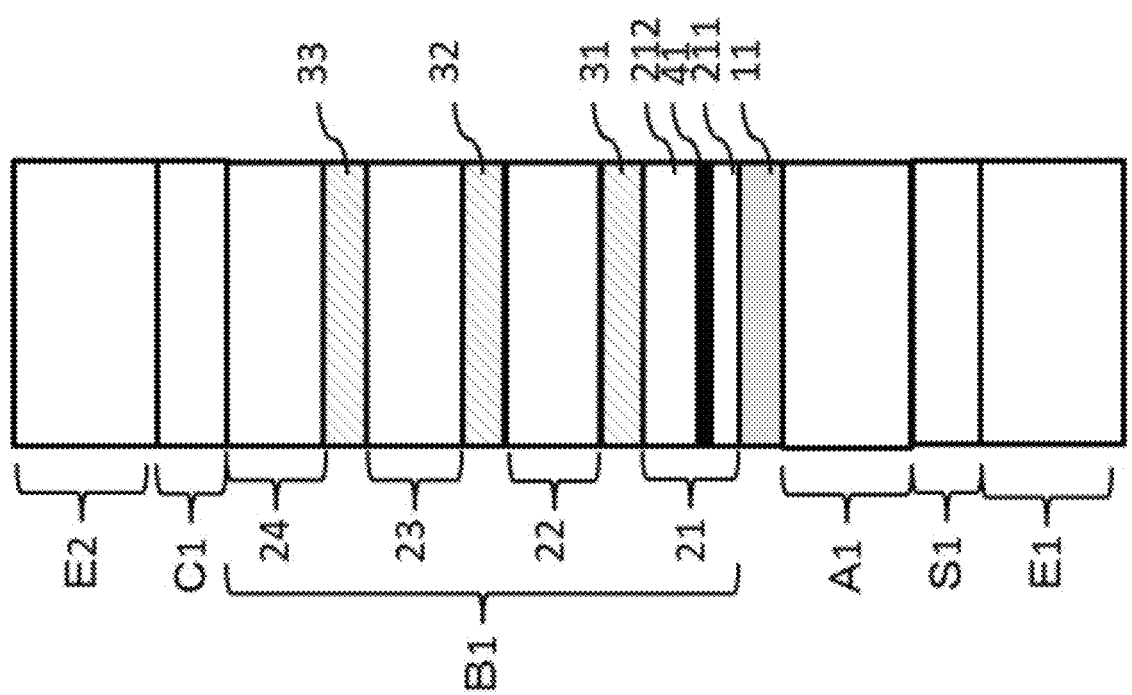
FIG. 24 is a longitudinal section view showing, another example of a structure of the magnetoresistance effect element according to the present invention.

FIG. 24 shows a structure according to a twenty-fourth embodiment of the present invention. A magnetoresistance effect element includes a structure in which an upper electrode layer (E2)/a cap layer (C1)/a first reference layer (B1)/a first non-magnetic layer (11)/a first recording layer (A1)/a ground layer (S1)/and a lower electrode layer (E1) are sequentially and adjacently arranged, in which the first reference layer (B1) includes a fourth magnetic layer (24) which is adjacent to the cap layer (C1)/a third non-magnetic insertion layer (33)/a third magnetic layer (23)/a second non-magnetic insertion layer (32)/a second magnetic layer (22)/a first non-magnetic insertion layer (31)/and a first magnetic layer (21) which is adjacent to the first non-magnetic layer (11), and the first magnetic layer (21) includes an interface magnetic layer (211) which is adjacent to the first non-magnetic layer (11)/a non-magnetic coupling layer (41)/and a Co magnetic laser (212).

Details of the twenty-fourth embodiment are similar to those of the nineteenth and twenty-first embodiments.

Twenty-Fifth Embodiment

Figure 25:
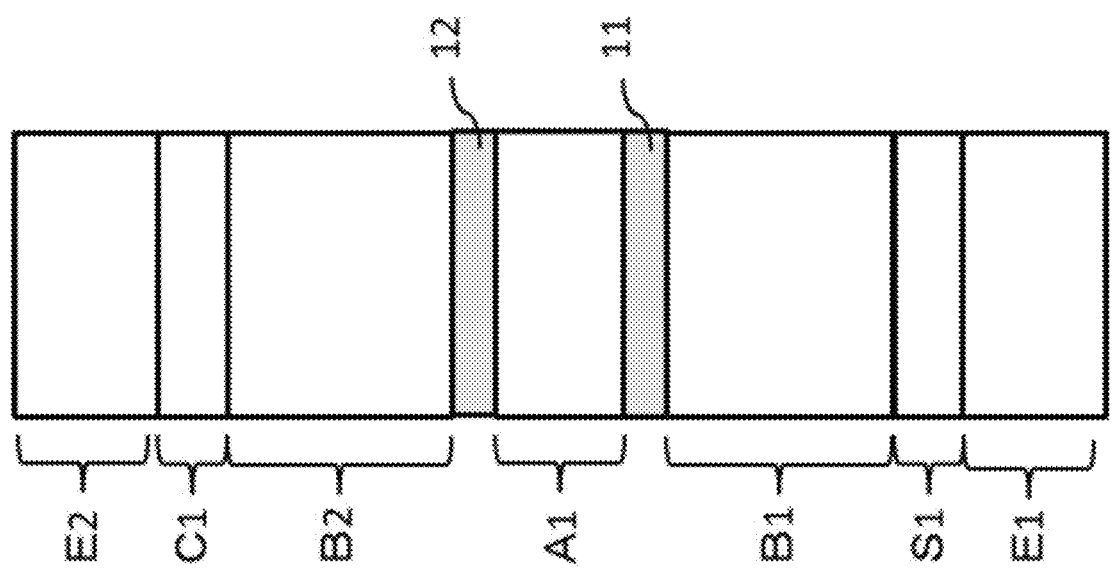
FIG. 25 is a longitudinal section view showing another example of a structure of the magnetoresistance effect element according to the present invention.

FIG. 25 shows a structure according to a twenty-fifth embodiment of the present invention. The magnetoresistance effect element includes a structure in which an upper electrode layer (E2)/a cap layer (C1)/a second reference layer (B2)/a second non-magnetic layer (12)/a first recording layer (A1)/a first non-magnetic layer (11)/a first reference layer (B1)/a ground layer (S1)/and a lower electrode layer (E1) are sequentially and adjacently arranged.

Details of the twenty-fifth embodiment are similar to those of the twelfth, sixteenth, and twenty-first embodiments with the exception of the characteristics described below.

The first reference layer (B1) and the second reference layer (B2) may be structured as exemplified in the first to eleventh embodiments, and structures, film thicknesses, and compositions of the first reference layer (B1) and the second reference layer (B2) may be the same or may differ from each other. A structure in which a stray magnetic field from the first reference layer (B1) and a stray magnetic field from the second reference layer (B2) are canceled in the first recording layer (A1) is preferable, and a structure which reduces a total film thickness of the reference layers to increase an exchange coupling field is desirable. From this perspective, more preferably, the structure of the first reference layer (B1) and the structure of the second reference layer (B2) are made to be vertically symmetrical with the first recording layer (A1) therebetween.

Twenty-Sixth Embodiment

Figure 27A:
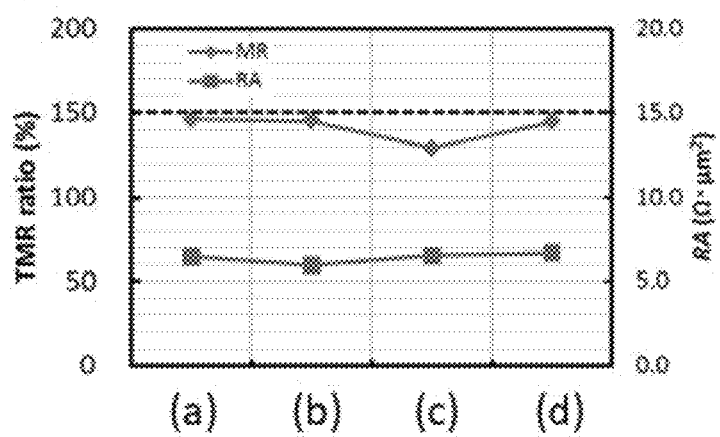
FIG. 27A shows a tunnel magnetoresistance ratio (TMR ratio) and a resistance area product (RA) of a full stack when varying a film thickness of a magnetic layer.

FIG. 26(a) to FIG. 26(d) show as a twenty-sixth embodiment, layer structures and magnetization curves of a full stack when varying a film thickness of a magnetic layer. In addition, FIG. 27A shows tunnel magnetoresistance ratios (TMR ratios) and resistance area products (RAs) of (a) to (d), and FIG. 27B and Table 3 she exchange coupling fields $H_{ex1}$ of FIG. 27B.

A structure of a reference layer in (a) is expressed as [Co(0.5)/Pt(0.3)]2.5/Ru(0.9)/[Co(0.5)/Pt(0.3)]2.5/Ru(0.9)/ [Co(0.5)/Pt(0.3)]2.5/Ru(0.9)/[Co(0.5)/Pt(0.3)]2.5/W(0.3)/ CoFeB(1), a structure of a reference layer in (b) is expressed as [Co(0.5)/Pt(0.3)]1.5/Ru(0.9)/[Co(0.5)/Pt(0.3)]2.5/Ru (0.9)/[Co(0.5)/Pt(0.3)]2.5/Ru(0.9)/[Co(0.5)/Pt(0.3)]1.5/W (0.3)/CoFeB(1), a structure of a reference layer in (c) is expressed as [Co(0.5)/Pt(0.3)]2.5/Ru(0.9)/[Co(0.5)/Pt(0.3)] 1.5/Ru(0.9)/[Co(0.5)/Pt(0.3)]1.5/Ru(0.9)/[Co(0.5)/Pt(0.3)] 2.5/W(0.3)/CoFeB(1), a structure of a reference layer in (d) is expressed as [Co(0.5)/Pt(0.3)]1.5/Ru(0.9)/[Co(0.5)/Pt (0.3)]1.5/Ru(0.9)/[Co(0.5)/Pt(0.3)]1.5/Ru(0.9)/[Co(0.5)/(Pt (0.3)]1.5/W(0.3)/CoFeB(1), and in each of samples (a) to (d), a CoFeB layer is adjacent to a non-magnetic layer that is adjacent to a recording layer. In this case, while magnitudes (Ma1, Ma2, Ma3, and Ma4) of magnetization of the fourth magnetic layers of the sample (a) are the same (Ma1=Ma2=Ma3=Ma4) and magnitudes (Md1, Md2, Md3, and Md4) of magnetization of the fourth magnetic layers of the sample (d) are also the same (Md1=Md2=Md3=Md4), the magnetization of the sample (a) is greater than the magnetization of the sample (d) (Ma1>Md1),

TABLE 3

| | $H_{ex1}$(Oe) |
|---|---|
| (a) J12 = J23 = J34, Ma1 = Ma2 = Ma3 = Ma4 | 5800 |
| (b) J23 > J12 = J34, M2 = M3 > M1 = M4 | 9000 |
| (c) J12 = J34 > J23, M1 = M4 > M2 = M3 | 4800 |
| (d) J12 = J23 = J34, Md1 = Md2 = Md3 = Md4, Ma1 > Md1 | 9000 |

Figure 27B:
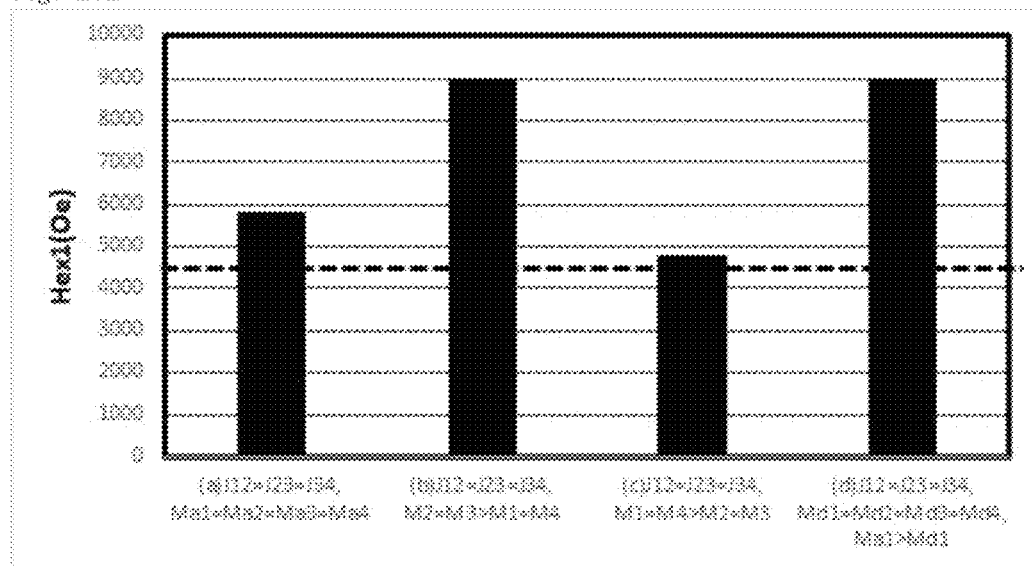
FIG. 27B shows an exchange coupling field ($H_{ex1}$) of a full stack when varying a film thickness of a magnetic layer.

It is revealed that, even in a full stack, the exchange coupling field $H_{ex1}$ is greater in all of the samples (a) to (d) than 4400 Oe according to a conventional example and indicated by a dotted line in FIG. 27B. It is also revealed that, particularly when magnetization of the magnetic layers satisfies M2>M1 and film thicknesses of the magnetic layers satisfy t2>t1, the exchange coupling field $H_{ex1}$ increases from 4400 Oe according to the conventional example and indicated by the dotted line in FIG. 27B to 9000 Oe. It is also revealed that, even when the magnitudes of magnetization of the four magnetic layers are the same, the smaller the magnitude of magnetization per layer, the larger the exchange coupling field $H_{ex1}$, resulting in an increase from 4400 Oe according to the conventional example and indicated by the dotted line in FIG. 27B to 9000 Oe.

Therefore, it is revealed that, even in a case of a full stack, a wider margin can be secured between the writing current Ic of the recording layer and a current at which magnetization of the reference layer reverses.

Furthermore, it is confirmed that, when the resistance area product (RA) is 5 $\Omega \cdot \mu m^2$, a tunnel magnetoresistance ratio (TMR ratio) of approximately 150% can be secured in a similar manner to the value of the conventional example indicated by a dotted line in (a) to (d).

Twenty-Seventh Embodiment

FIG. 28(a) to FIG. 28(c) show, as a twenty-seventh embodiment, layer structures and magnetization curves of a full stack when varying film thicknesses of a non-magnetic insertion layer and a magnetic layer. In addition, (a) to (c) show tunnel magnetoresistance ratios (TMR ratios) and resistance area products (RAs) of (a) to (c), and FIG. 29B and Table 4 show exchange coupling fields of (a) to (c).

A structure of a reference layer in (a) is expressed as [Co(0.5)/Pt(0.3)]2.5/Ir(0.5)/[Co(0.5)/Pt(0.3)]1.5/Ru(0.9)/ [Co(0.5)/Pt(0.3)]1.5/Ir(0.5)/Co(0.5)/W(0.3)/CoFeB(1), a structure of a reference layer in (b) is expressed as [Co(0.5)/Pt(0.3)]2.5/Ir(0.5)/[Co(0.5)/Pt(0.3)]2.5/Ru(0.9)/[Co(0.5)/Pt(0.3)]2.5/Ir(0.5)/Co(0.5)/W(0.3)/CoFeB(1), a structure of a reference layer in (c) is expressed as [Co(0.5)/Pt(0.3)]2.5/Ir(0.5)/[Co(0.5)/Pt(0.3)]2.5/Ru(0.9)/[Co(0.5)/Pt(0.3)]3.5/Ir(0.5)/Co(0.5)/W(0.3) CoFeB(1), and in each of samples (a) to (c), a CoFeB layer is adjacent to a non-magnetic layer that is adjacent to a recording layer.

TABLE 4

|  | $H_{ex1}$(Oe) |
| --- | --- |
| (a) J12 = J23 > J23, M1 = M2 | 6500 |
| (b) J12 = J23 > J23, M2 > M1 | 5500 |
| (c) J12 = J23 > J23, M2 > M1 | 6000 |

Figure 29A:
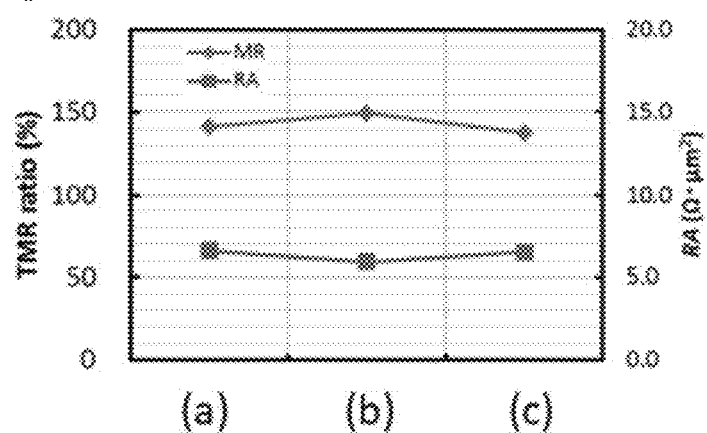
FIG. 29A shows a tunnel magnetoresistance ratio (TMR ratio) and a resistance area product (RA) of a full stack when varying a film thickness of a magnetic layer.
Figure 29B:
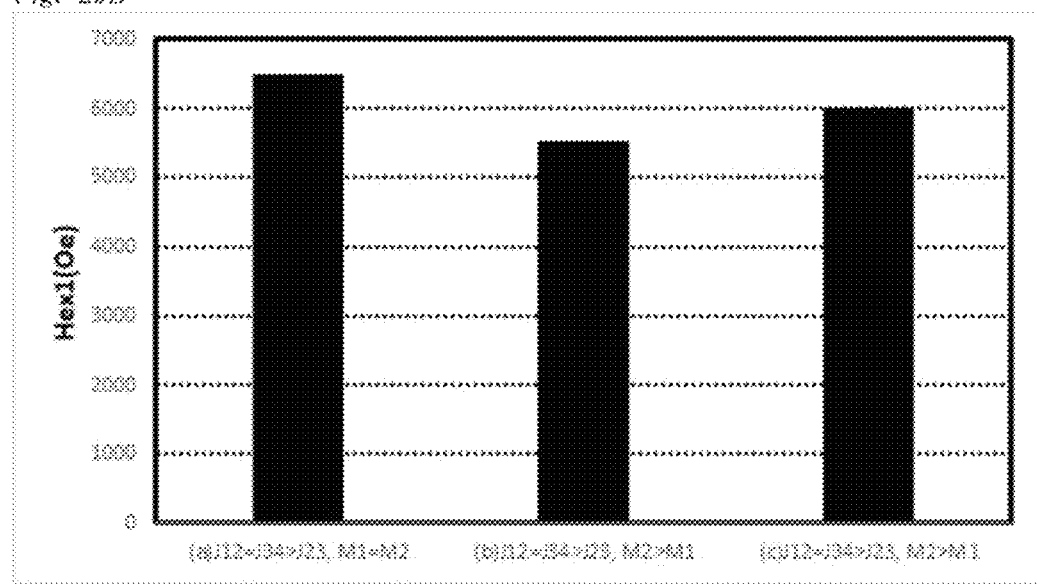

Even in a full stack, when outer-side non-magnetic insertion layers or, in other words, the first non-magnetic insertion layer (31) and the third non-magnetic insertion layer (33) are changed from Ru (0.9 nm) to Ir (0.5 nm), interlayer exchange coupling energy satisfies a relationship expressed as J12=J34>J23, and the exchange coupling field $H_{ex1}$ is approximately 1.5 times 4400 Oe of the conventional example indicated by a dotted line in FIG. 29B. It is also revealed that, even when magnetization of the magnetic layers satisfies M2>M1 and film thicknesses oldie magnetic layers satisfy t2>t1, the exchange coupling field $H_{ex1}$ increases.

Therefore, it is revealed that, even in a case of a full stack, a wider margin can be secured between the writing current Ic of the recording layer and a current at which magnetization of the reference layer reverses.

Furthermore, it is confirmed that, when the resistance area product (RA) is around 6.5 $\Omega\cdot\mu^2$, a tunnel magnetoresistance ratio (TMR ratio) of approximately 150% can be secured in a similar manner to the value of the conventional example.

Twenty-Eighth Embodiment

In a magnetoresistance effect element with a structure illustrated in FIG. 2, a higher effect can be obtained by controlling magnetization and film thicknesses of the four magnetic layers in a reference layer such that a sum of "a product of magnetization M1 and a film thickness t1 of the first magnetic layer (21) and a product of magnetization M3 and a film thickness t3 of the third magnetic layer (23)" is equal to or smaller than a sum of "a product of magnetization M2 and a film thickness t2 of the second magnetic layer (22) and a product of magnetization M4 and a film thickness t4 of the fourth magnetic layer (24)".

Twenty-ninth Embodiment

In a magnetoresistance effect element with a structure illustrated in FIG. 6, a higher effect can be obtained by controlling magnetization and film thicknesses of the three magnetic layers in a reference layer such that "a product of magnetization M2 and a film thickness t2 of the second magnetic layer (22)" is greater than a sum of "a product of magnetization M1 and a film thickness t1 of the first magnetic layer (21) and a product of magnetization M3 and a film thickness t3 of the third magnetic layer (23)".

Thirtieth Embodiment

Figure 30:
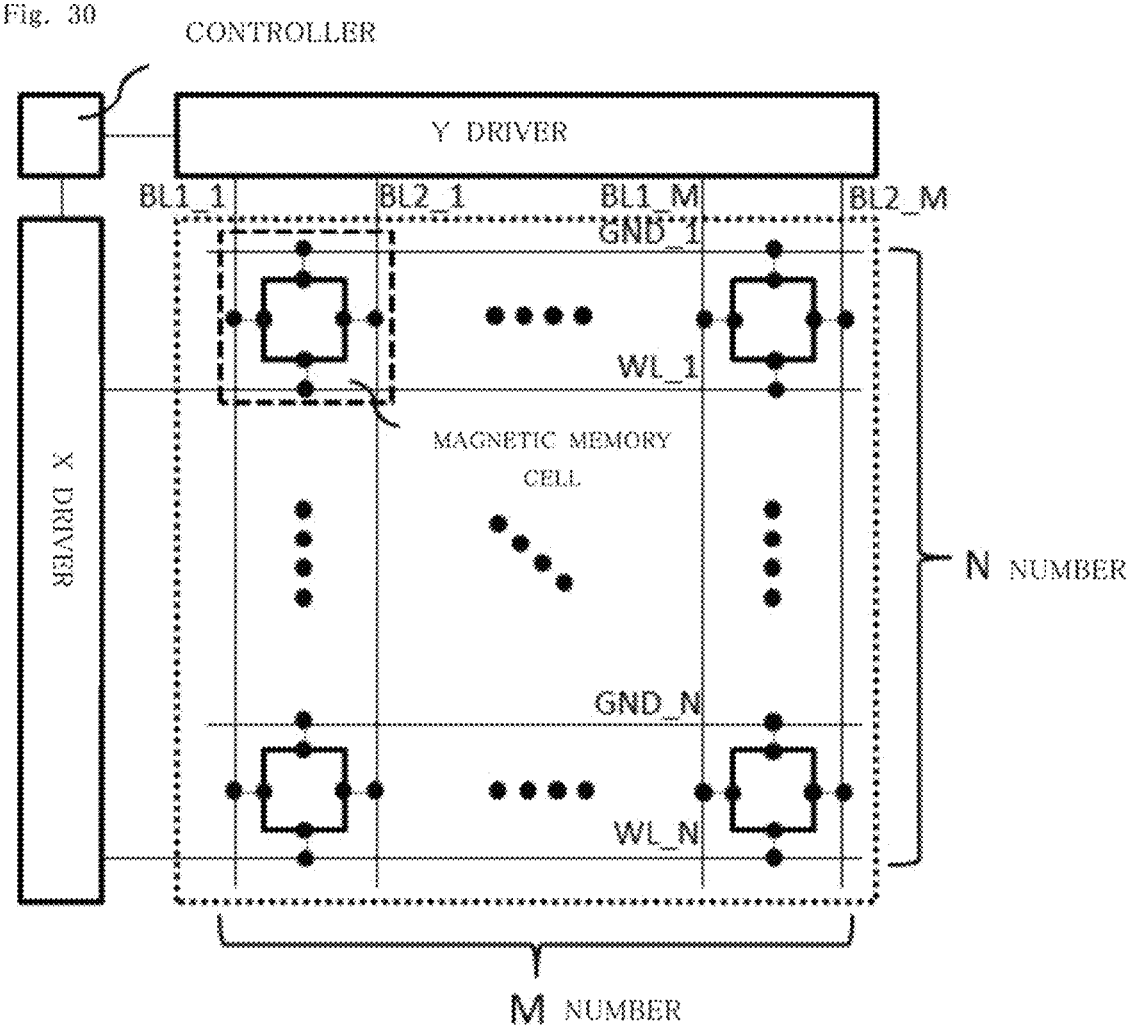
FIG. 30 is an example of a block diagram of a magnetic memory in which the magnetoresistance effect element according to the present invention is arranged in plurality.
Figure 31:
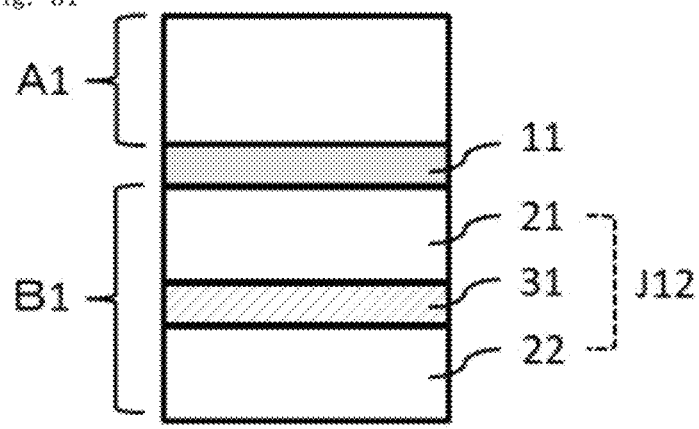
FIG. 31 is a longitudinal section view showing an example of a structure of a conventional magnetoresistance effect element.

FIG. 30 shows, as a thirtieth embodiment, an example of a magnetic memory including a plurality of magnetic memory cells having a structure according to the first to fifteenth embodiments.

The magnetic memory includes a memory cell array, an X driver, a Y driver, and a controller. The memory cell array includes magnetic memory cells arranged in an array. The X driver is connected to a plurality of word lines (WLs) and the Y driver is connected to a plurality of bit lines (BLs), and the X driver and the Y driver respectively function as reading means and writing means.

Note that the layer structure described in each embodiment need only be adjacently arranged and a lamination method, a lamination order, vertical and horizontal orientations, and the like thereof are not limited.

REFERENCE SIGNS LIST

11 First non-magnetic layer
12 Second non-magnetic layer
21 First magnetic layer
211 Interface magnetic layer
212 Co magnetic layer
41 Non-magnetic coupling layer
22 Second magnetic layer
23 Third magnetic layer
24 Fourth magnetic layer
2n (n-th) magnetic layer
31 First non-magnetic insertion layer
32 Second non-magnetic insertion layer
33 Third non-magnetic insertion layer
3n (n-th) non-magnetic insertion layer
A1 First recording layer
B1 First reference layer
B2 Second reference layer
C1 Cap layer
E1 Lower electrode layer
E2 Upper electrode layer
S1 Ground layer
J12, J23, . . . Antiferromagnetic coupling force (between magnetic layers)
J2 Antiferromagnetic coupling force between first magnetic layer and second magnetic layer
J23 Antiferromagnetic coupling force between second magnetic layer and third magnetic layer
Jn (n+1) Antiferromagnetic coupling force between n-th magnetic layer and (n+1)-th magnetic layer
BL1 First bit line
BL2 Second bit line
GND Ground line.
T1 First terminal
T2 Second terminal
T3 Third terminal
TR1 First transistor
Tr2 Second transistor
WL Word line

What is claimed is:
1. A magnetoresistance effect element, comprising:
a first recording layer (A1);
a first non-magnetic layer (11) provided adjacent to the first recording layer (A1); and
a first reference layer (B1) provided adjacent to the first non-magnetic layer (11) on an opposite side to the first recording layer (A1), wherein
the first reference layer (B1) includes n-number of a plurality of magnetic layers (21, 22, . . . , 2n) and (n−1)−number of a plurality of non-magnetic insertion layers (31, 32, . . . , 3(n−1)) adjacently sandwiched by each of the plurality of magnetic layers, where n≥3, a first magnetic layer (21) among the plurality of magnetic layers is provided adjacent to the first non-magnetic layer (11), an orientation of magnetization of the first reference layer (B1) is fixed in a film surface vertical direction, and each of the plurality of non-magnetic insertion layers (31, 32, . . . , 3(n−1)) antiferromagnetically couples two adjacent magnetic layers to each other, and wherein each of the plurality of non-magnetic insertion layers (31, 32, . . . , 3(n−1)) contains Ru or Ir, a film thickness of the Ru is 0.9±0.2 nm or 0.4±0.15 nm, and a film thickness of the Ir is 0.5±0.15 nm or 1.35±0.1 nm.

2. The magnetoresistance effect element according to claim 1, wherein a shift magnetic field Hs with respect to the first recording layer (A1) due to a stray magnetic field from the first reference layer (B1) is smaller than a coercive force Hc of the first recording layer (A1).

3. The magnetoresistance effect element according to claim 2, wherein the shift magnetic field Hs is equal to or smaller than 0.2 of the coercive force Hc.

4. The magnetoresistance effect element according to claim 1, wherein each of the plurality of magnetic layers (21, 22, . . . , 2n) contains Co.

5. The magnetoresistance effect element according to claim 4, wherein each of the plurality of magnetic layers (21, 22, . . . , 2n) includes a Co layer (213) at an interface with the non-magnetic insertion layer that is adjacent to each magnetic layer.

6. The magnetoresistance effect element according to claim 1, wherein the first magnetic layer (21) includes an interface magnetic layer (211) which contains Co or Fe and which is provided adjacent to a first non-magnetic layer (11), a non-magnetic coupling layer (41) which is provided adjacent to the interface magnetic layer (211) on an opposite side to the first non-magnetic layer (11), and a Co magnetic layer (212) which contains Co and which is provided adjacent to the non-magnetic coupling layer (41) on an opposite side to the interface magnetic layer (211).

7. The magnetoresistance effect element according claim 1, wherein the number of the plurality of magnetic layers is n≥4, and the plurality of magnetic layers and the plurality of non-magnetic insertion layers have a structure that includes:

the first magnetic layer (21);

a first non-magnetic insertion layer (31) provided adjacent to the first magnetic layer (21) on an opposite side to the first non-magnetic layer (11);

a second magnetic layer (22) provided adjacent to the first non-magnetic insertion layer (31) on an opposite side to the first magnetic layer (21);

a second non-magnetic insertion layer (32) provided adjacent to the second magnetic layer (22) on an opposite side to the first non-magnetic insertion layer (31);

a third magnetic layer (23) provided adjacent to the second non-magnetic insertion layer (32) on an opposite side to the second magnetic layer (22);

a third non-magnetic insertion layer (33) provided adjacent to the third magnetic layer (23) on an opposite side to the second non-magnetic insertion layer (32); and a fourth magnetic layer (24) provided adjacent to the third non-magnetic insertion layer (33) on an opposite side to the third magnetic layer (23).

8. The magnetoresistance effect element according to claim 7, wherein the number of the plurality of magnetic layers is n=4, and a sum of magnetization M1 of the first magnetic layer (21) and magnetization M3 of the third magnetic layer (23) is equal to or smaller than a sum of magnetization M2 of the second magnetic layer (22) and magnetization M4 of the fourth magnetic layer (24).

9. The magnetoresistance effect element according to claim 7, wherein magnetization M1 of the first magnetic layer (21) is smaller than magnetization M2 of the second magnetic layer (22).

10. The magnetoresistance effect element according to claim 7, wherein the number of the plurality of magnetic layers is n=4, and a sum of a film thickness t1 of the first magnetic layer (21) and a film thickness t3 of the third magnetic layer (23) is equal to or smaller than a sum of a film thickness t2 of the second magnetic layer (22) and a film thickness t4 of the fourth magnetic layer (24).

11. The magnetoresistance effect element according to claim 7, wherein a film thickness t1 of the first magnetic layer (21) is smaller than a film thickness t2 of the second magnetic layer (22).

12. The magnetoresistance effect element according to claim 10, wherein a film thickness t3 of the third magnetic layer (23) is larger than a film thickness t4 of the fourth magnetic layer (24).

13. The magnetoresistance effect element according to claim 10, wherein a film thickness t3 of the third magnetic layer (23) is smaller than a film thickness t4 of the fourth magnetic layer (24).

14. The magnetoresistance effect element according to claim 7, wherein the number of the plurality of magnetic layers is n=4, and an antiferromagnetic coupling force J12 between the first magnetic layer (21) and the second magnetic layer (22) is larger than an antiferromagnetic coupling force J23 between the second magnetic layer (22) and the third magnetic layer (23).

15. The magnetoresistance effect element according to claim 14, wherein an antiferromagnetic coupling force J34 between the third magnetic layer (23) and the fourth magnetic layer (24) is larger than an antiferromagnetic coupling force J23 between the second magnetic layer (22) and the third magnetic layer (23).

16. The magnetoresistance effect element according to claim 7, wherein the number of the plurality of magnetic layers is n=4, the first non-magnetic insertion layer (31) and the third non-magnetic insertion layer (33) are Ru with a film thickness of 0.4±0.15 nm, and the second non-magnetic insertion layer (32) is Ru with a film thickness of 0.9±0.2 nm.

17. The magnetoresistance effect element according to claim 7, wherein the number of the plurality of magnetic layers is n=4, the first non-magnetic insertion layer (31) and the third non-magnetic insertion layer (33) are Ir with a film thickness of 0.5±0.15 nm, and the second non-magnetic insertion layer (32) is Ru with a film thickness of 0.9±0.2 nm.

18. The magnetoresistance effect element according to claim 1, wherein
the number of the plurality of magnetic layers is n=3,
the plurality of magnetic layers and the plurality of non-magnetic insertion layers have a structure that includes:
the first magnetic layer (21);
a first non-magnetic insertion layer (31) provided adjacent to the first magnetic layer (21) on an opposite side to the first non-magnetic layer (11);
a second magnetic layer (22) provided adjacent to the first non-magnetic insertion layer (31) on an opposite side to the first magnetic layer (21);
a second non-magnetic insertion layer (32) provided adjacent to the second magnetic layer (22) on an opposite side to the first non-magnetic insertion layer (31); and
a third magnetic layer (23) provided adjacent to the second non-magnetic insertion layer (32) on an opposite side to the second magnetic layer (22), and
magnetization M2 of the second magnetic layer (22) is larger than a sum of magnetization M1 of the first magnetic layer (21) and magnetization M3 of the third magnetic layer (23).

19. The magnetoresistance effect element according to claim 1, wherein
the number of the plurality of magnetic layers is n=3,
the plurality of magnetic layers and the plurality of non-magnetic insertion layers have a structure that includes:
the first magnetic layer (21);
a first non-magnetic insertion layer (31) provided adjacent to the first magnetic layer (21) on an opposite side to the first non-magnetic layer (11);
a second magnetic layer (22) provided adjacent to the first non-magnetic insertion layer (31) on an opposite side to the first magnetic layer (21);
a second non-magnetic insertion layer (32) provided adjacent to the second magnetic layer (22) on an opposite side to the first non-magnetic insertion layer (31); and
a third magnetic layer (23) provided adjacent to the second non-magnetic insertion layer (32) on an opposite side to the second magnetic layer (22), and
a film thickness t2 of the second magnetic layer (22) is larger than a sum of a film thickness t1 of the first magnetic layer (21) and a film thickness t3 of the third magnetic layer (23).

20. The magnetoresistance effect element according to claim 1, further comprising:
a cap layer (C1) provided adjacent to the first recording layer (A1) on an opposite side to the non-magnetic layer (11);
an upper electrode layer (E2) provided adjacent to the cap layer (C1) on an opposite side to the first recording layer (A1);
a ground layer (S1) provided adjacent to the first reference layer (B1) on an opposite side to the non-magnetic layer (11); and
a lower electrode layer (E1) provided adjacent to the ground layer (S1) on an opposite side to the first reference layer (B1).

21. The magnetoresistance effect element according to claim 1, further comprising:
a cap layer (C1) provided adjacent to the first reference layer (B1) on an opposite side to the non-magnetic layer (11);
an upper electrode layer (E2) provided adjacent to the cap layer (C1) on an opposite side to the reference layer (B1);
a ground layer (S1) provided adjacent to the first recording layer (A1) on an opposite side to the non-magnetic layer (11); and
a lower electrode layer (E1) provided adjacent to the ground layer (S1) on an opposite side to the first recording layer (A1).

22. The magnetoresistance effect element according to claim 1, further comprising:
a second non-magnetic layer (12) provided adjacent to the first recording layer (A1) on an opposite side to the first non-magnetic layer (11); and
a second reference layer (B2) provided adjacent to the second non-magnetic layer (12) on an opposite side to the first recording layer (A1), wherein
the second reference layer (B2) includes n-number of a plurality of magnetic layers (21, 22, . . . , 2n) and (n−1)−number of a plurality of non-magnetic insertion layers (31, 32, . . . , 3(n−1)) adjacently sandwiched by each of the plurality of magnetic layers, where n≥3,
a first magnetic layer (21) among the plurality of magnetic layers is provided adjacent to the first non-magnetic layer (11),
an orientation of magnetization of the second reference layer (B2) is fixed in a film surface vertical direction, and
each of the plurality of non-magnetic insertion layers (31, 32, . . . , 3(n−1)) antiferromagnetically couples two adjacent magnetic layers to each other.

23. The magnetoresistance effect element according to claim 7, wherein the number of the plurality of magnetic layers is n=4, and
a sum of a product of magnetization M1 and a film thickness t1 of the first magnetic layer (21) and a product of magnetization M3 and a film thickness t3 of the third magnetic layer (23) is equal to or smaller than a sum of a product of magnetization M2 and a film thickness t2 of the second magnetic layer (22) and a product of magnetization M4 and a film thickness t4 of the fourth magnetic layer (24).

24. The magnetoresistance effect element according claim 1, wherein
the number of the plurality of magnetic layers is n=3,
the plurality of magnetic layers and the plurality of non-magnetic insertion layers have a structure that includes:
the first magnetic layer (21);
a first non-magnetic insertion layer (31) provided adjacent to the first magnetic layer (21) on an opposite side to the first non-magnetic layer (11);
a second magnetic layer (22) provided adjacent to the first non-magnetic insertion layer (31) on an opposite side to the first magnetic layer (21);
a second non-magnetic insertion layer (32) provided adjacent to the second magnetic layer (22) on an opposite side to the first non-magnetic insertion layer (31), and
a third magnetic layer (23) provided adjacent to the second non-magnetic insertion layer (32) on an opposite side to the second magnetic layer (22), and
a product of magnetization M2 and a film thickness t2 of the second magnetic layer (22) is larger than a sum of a product of magnetization M1 and a film thickness t1 of the first magnetic layer (21) and a sum of a product of magnetization M3 and a film thickness t3 of the third magnetic layer (23).

25. A magnetoresistance effect element, comprising:
a first recording layer (A1);
a first non-magnetic layer (11) provided adjacent to the first recording layer (A1); and
a first reference layer (B1) provided adjacent to the first non-magnetic layer (11) on an opposite side to the first recording layer (A1), wherein
the first reference layer (B1) includes n-number of a plurality of magnetic layers (21, 22, . . . , 2n) and (n−1)-number of a plurality of non-magnetic insertion layers (31, 32, . . . , 3(n−1)) adjacently sandwiched by each of the plurality of magnetic layers, where n≥3,
a first magnetic layer (21) among the plurality of magnetic layers is provided adjacent to the first non-magnetic layer (11),
an orientation of magnetization of the first reference layer (B1) is fixed in a film surface vertical direction, and
each of the plurality of non-magnetic insertion layers (31, 32, . . . , 3(n−1)) antiferromagnetically couples two adjacent magnetic layers to each other,
wherein a shift magnetic field Hs with respect to the first recording layer (A1) due to a stray magnetic field from the first reference layer (B1) is smaller than a coercive force Hc of the first recording layer (A1).

26. The magnetoresistance effect element according to claim 25, wherein the shift magnetic field Hs is equal to or smaller than 0.2 of the coercive force Hc.

27. A magnetoresistance effect element, comprising:
a first recording layer (A1);
a first non-magnetic layer (11) provided adjacent to the first recording layer (A1); and
a first reference layer (B1) provided adjacent to the first non-magnetic layer (11) on an opposite side to the first recording layer (A1), wherein
the first reference layer (B1) includes n-number of a plurality of magnetic layers (21, 22, . . . , 2n) and (n−1)-number of a plurality of non-magnetic insertion layers (31, 32, . . . , 3(n−1)) adjacently sandwiched by each of the plurality of magnetic layers, where n≥3,
a first magnetic layer (21) among the plurality of magnetic layers is provided adjacent to the first non-magnetic layer (11),
an orientation of magnetization of the first reference layer (B1) is fixed in a film surface vertical direction, and
each of the plurality of non-magnetic insertion layers (31, 32, . . . , 3(n−1)) antiferromagnetically couples two adjacent magnetic layers to each other, and
wherein the first magnetic layer (21) includes an interface magnetic layer (211) which contains Co or Fe and which is provided adjacent to a first non-magnetic layer (11), a non-magnetic coupling layer (41) which is provided adjacent to the interface magnetic layer (211) on an opposite side to the first non-magnetic layer (11), and a Co magnetic layer (212) which contains Co and which is provided adjacent to the non-magnetic coupling layer (41) on an opposite side to the interface magnetic layer (211).

28. A magnetoresistance effect element, comprising:
a first recording layer (A1);
a first non-magnetic layer (11) provided adjacent to the first recording layer (A1); and
a first reference layer (B1) provided adjacent to the first non-magnetic layer (11) on an opposite side to the first recording layer (A1), wherein the first reference layer (B1) includes n-number of a plurality of magnetic layers (21, 22, . . . , 2n) and (n−1)-number of a plurality of non-magnetic insertion layers (31, 32, . . . , 3(n−1)) adjacently sandwiched by each of the plurality of magnetic layers, where n≥3,
a first magnetic layer (21) among the plurality of magnetic layers is provided adjacent to the first non-magnetic layer (11),
an orientation of magnetization of the first reference layer (B1) is fixed in a film surface vertical direction, and
each of the plurality of non-magnetic insertion layers (31, 32, . . . , 3(n−1)) antiferromagnetically couples two adjacent magnetic layers to each other,
wherein
the number of the plurality of magnetic layers is n≥4, and
the plurality of magnetic layers and the plurality of non-magnetic insertion layers have a structure that includes:
the first magnetic layer (21);
a first non-magnetic insertion layer (31) provided adjacent to the first magnetic layer (21) on an opposite side to the first non-magnetic layer (11);
a second magnetic layer (22) provided adjacent to the first non-magnetic insertion layer (31) on an opposite side to the first magnetic layer (21);
a second non-magnetic insertion layer (32) provided adjacent to the second magnetic layer (22) on an opposite side to the first non-magnetic insertion layer (31);
a third magnetic layer (23) provided adjacent to the second non-magnetic insertion layer (32) on an opposite side to the second magnetic layer (22);
a third non-magnetic insertion layer (33) provided adjacent to the third magnetic layer (23) on an opposite side to the second non-magnetic insertion layer (32); and
a fourth magnetic layer (24) provided adjacent to the third non-magnetic insertion layer (33) on an opposite side to the third magnetic layer (23), and
wherein
the number of the plurality of magnetic layers is n=4, and
a sum of magnetization M1 of the first magnetic layer (21) and magnetization M3 of the third magnetic layer (23) is equal to or smaller than a sum of magnetization M2 of the second magnetic layer (22) and magnetization M4 of the fourth magnetic layer (24).

29. A magnetoresistance effect element, comprising:
a first recording layer (A1);
a first non-magnetic layer (11) provided adjacent to the first recording layer (A1); and
a first reference layer (B1) provided adjacent to the first non-magnetic layer (11) on an opposite side to the first recording layer (A1), wherein
the first reference layer (B1) includes n-number of a plurality of magnetic layers (21, 22, . . . , 2n) and (n−1)-number of a plurality of non-magnetic insertion layers (31, 32, . . . , 3(n−1)) adjacently sandwiched by each of the plurality of magnetic layers, where n≥3,
a first magnetic layer (21) among the plurality of magnetic layers is provided adjacent to the first non-magnetic layer (11),
an orientation of magnetization of the first reference layer (B1) is fixed in a film surface vertical direction, and each of the plurality of non-magnetic insertion layers (31, 32, . . . , 3(*n*−1)) antiferromagnetically couples two adjacent magnetic layers to each other,
wherein
the number of the plurality of magnetic layers is n≥4, and
the plurality of magnetic layers and the plurality of non-magnetic insertion layers have a structure that includes:
the first magnetic layer (21);
a first non-magnetic insertion layer (31) provided adjacent to the first magnetic layer (21) on an opposite side to the first non-magnetic layer (11);
a second magnetic layer (22) provided adjacent to the first non-magnetic insertion layer (31) on an opposite side to the first magnetic layer (21);
a second non-magnetic insertion layer (32) provided adjacent to the second magnetic layer (22) on an opposite side to the first non-magnetic insertion layer (31);
a third magnetic layer (23) provided adjacent to the second non-magnetic insertion layer (32) on an opposite side to the second magnetic layer (22);
a third non-magnetic insertion layer (33) provided adjacent to the third magnetic layer (23) on an opposite side to the second non-magnetic insertion layer (32); and
a fourth magnetic layer (24) provided adjacent to the third non-magnetic insertion layer (33) on an opposite side to the third magnetic layer (23), and
wherein magnetization M1 of the first magnetic layer (21) is smaller than magnetization M2 of the second magnetic layer (22).

30. A magnetoresistance effect element, comprising:
a first recording layer (A1);
a first non-magnetic layer (11) provided adjacent to the first recording layer (A1); and
a first reference layer (B1) provided adjacent to the first non-magnetic layer (11) on an opposite side to the first recording layer (A1), wherein
the first reference layer (B1) includes n-number of a plurality of magnetic layers (21, 22, . . . , 2*n*) and (n−1)−number of a plurality of non-magnetic insertion layers (31, 32, . . . , 3(*n*−1)) adjacently sandwiched by each of the plurality of magnetic layers, where n≥3,
a first magnetic layer (21) among the plurality of magnetic layers is provided adjacent to the first non-magnetic layer (11),
an orientation of magnetization of the first reference layer (B1) is fixed in a film surface vertical direction, and
each of the plurality of non-magnetic insertion layers (31, 32, . . . , 3(*n*−1)) antiferromagnetically couples two adjacent magnetic layers to each other,
wherein
the number of the plurality of magnetic layers is n≥4, and
the plurality of magnetic layers and the plurality of non-magnetic insertion layers have a structure that includes:
the first magnetic layer (21);
a first non-magnetic insertion layer (31) provided adjacent to the first magnetic layer (21) on an opposite side to the first non-magnetic layer (11);
a second magnetic layer (22) provided adjacent to the first non-magnetic insertion layer (31) on an opposite side to the first magnetic layer (21);
a second non-magnetic insertion layer (32) provided adjacent to the second magnetic layer (22) on an opposite side to the first non-magnetic insertion layer (31);
a third magnetic layer (23) provided adjacent to the second non-magnetic insertion layer (32) on an opposite side to the second magnetic layer (22);
a third non-magnetic insertion layer (33) provided adjacent to the third magnetic layer (23) on an opposite side to the second non-magnetic insertion layer (32); and
a fourth magnetic layer (24) provided adjacent to the third non-magnetic insertion layer (33) on an opposite side to the third magnetic layer (23), and
wherein
the number of the plurality of magnetic layers is n=4, and
a sum of a film thickness t1 of the first magnetic layer (21) and a film thickness t3 of the third magnetic layer (23) is equal to or smaller than a sum of a film thickness t2 of the second magnetic layer (22) and a film thickness t4 of the fourth magnetic layer (24).

31. The magnetoresistance effect element according to claim 30, wherein a film thickness t3 of the third magnetic layer (23) is larger than a film thickness t4 of the fourth magnetic layer (24).

32. The magnetoresistance effect element according to claim 30, wherein a film thickness t3 of the third magnetic layer (23) is smaller than a film thickness t4 of the fourth magnetic layer (24).

33. A magnetoresistance effect element, comprising:
a first recording layer (A1);
a first non-magnetic layer (11) provided adjacent to the first recording layer (A1); and
a first reference layer (B1) provided adjacent to the first non-magnetic layer (11) on an opposite side to the first recording layer (A1), wherein
the first reference layer (B1) includes n-number of a plurality of magnetic layers (21, 22, . . . , 2*n*) and (n−1)−number of a plurality of non-magnetic insertion layers (31, 32, . . . , 3(*n*−1)) adjacently sandwiched by each of the plurality of magnetic layers, where n≥3,
a first magnetic layer (21) among the plurality of magnetic layers is provided adjacent to the first non-magnetic layer (11),
an orientation of magnetization of the first reference layer (B1) is fixed in a film surface vertical direction, and
each of the plurality of non-magnetic insertion layers (31, 32, . . . , 3(*n*−1)) antiferromagnetically couples two adjacent magnetic layers to each other,
wherein
the number of the plurality of magnetic layers is n≥4, and
the plurality of magnetic layers and the plurality of non-magnetic insertion layers have a structure that includes:
the first magnetic layer (21);
a first non-magnetic insertion layer (31) provided adjacent to the first magnetic layer (21) on an opposite side to the first non-magnetic layer (11);
a second magnetic layer (22) provided adjacent to the first non-magnetic insertion layer (31) on an opposite side to the first magnetic layer (21);
a second non-magnetic insertion layer (32) provided adjacent to the second magnetic layer (22) on an opposite side to the first non-magnetic insertion layer (31);

a third magnetic layer (23) provided adjacent to the second non-magnetic insertion layer (32) on an opposite side to the second magnetic layer (22);

a third non-magnetic insertion layer (33) provided adjacent to the third magnetic layer (23) on an opposite side to the second non-magnetic insertion layer (32); and a fourth magnetic layer (24) provided adjacent to the third non-magnetic insertion layer (33) on an opposite side to the third magnetic layer (23), and wherein a film thickness t1 of the first magnetic layer (21) is smaller than a film thickness t2 of the second magnetic layer (22).

34. A magnetoresistance effect element, comprising:
a first recording layer (A1);
a first non-magnetic layer (11) provided adjacent to the first recording layer (A1); and
a first reference layer (B1) provided adjacent to the first non-magnetic layer (11) on an opposite side to the first recording layer (A1), wherein
the first reference layer (B1) includes n-number of a plurality of magnetic layers (21, 22, . . . , 2n) and (n−1)−number of a plurality of non-magnetic insertion layers (31, 32, . . . , 3(n−1)) adjacently sandwiched by each of the plurality of magnetic layers, where n≥3,
a first magnetic layer (21) among the plurality of magnetic layers is provided adjacent to the first non-magnetic layer (11),
an orientation of magnetization of the first reference layer (B1) is fixed in a film surface vertical direction, and
each of the plurality of non-magnetic insertion layers (31, 32, . . . , 3(n−1)) antiferromagnetically couples two adjacent magnetic layers to each other,
wherein
the number of the plurality of magnetic layers is n≥4, and
the plurality of magnetic layers and the plurality of non-magnetic insertion layers have a structure that includes:
the first magnetic layer (21);
a first non-magnetic insertion layer (31) provided adjacent to the first magnetic layer (21) on an opposite side to the first non-magnetic layer (11);
a second magnetic layer (22) provided adjacent to the first non-magnetic insertion layer (31) on an opposite side to the first magnetic layer (21);
a second non-magnetic insertion layer (32) provided adjacent to the second magnetic layer (22) on an opposite side to the first non-magnetic insertion layer (31);
a third magnetic layer (23) provided adjacent to the second non-magnetic insertion layer (32) on an opposite side to the second magnetic layer (22);
a third non-magnetic insertion layer (33) provided adjacent to the third magnetic layer (23) on an opposite side to the second non-magnetic insertion layer (32); and
a fourth magnetic layer (24) provided adjacent to the third non-magnetic insertion layer (33) on an opposite side to the third magnetic layer (23), and
wherein
the number of the plurality of magnetic layers is n=4, and
an antiferromagnetic coupling force J12 between the first magnetic layer (21) and the second magnetic layer (22) is larger than an antiferromagnetic coupling force J23 between the second magnetic layer (22) and the third magnetic layer (23).

35. The magnetoresistance effect element according to claim 34, wherein an antiferromagnetic coupling force J34 between the third magnetic layer (23) and the fourth magnetic layer (24) is larger than an antiferromagnetic coupling force J23 between the second magnetic layer (22) and the third magnetic layer (23).

36. A magnetoresistance effect element, comprising:
a first recording layer (A1);
a first non-magnetic layer (11) provided adjacent to the first recording layer (A1); and
a first reference layer (B1) provided adjacent to the first non-magnetic layer (11) on an opposite side to the first recording layer (A1), wherein
the first reference layer (B1) includes n-number of a plurality of magnetic layers (21, 22, . . . , 2n) and (n−1)−number of a plurality of non-magnetic insertion layers (31, 32, . . . , 3(n−1)) adjacently sandwiched by each of the plurality of magnetic layers, where n≥3,
a first magnetic layer (21) among the plurality of magnetic layers is provided adjacent to the first non-magnetic layer (11),
an orientation of magnetization of the first reference layer (B1) is fixed in a film surface vertical direction, and
each of the plurality of non-magnetic insertion layers (31, 32, . . . , 3(n−1)) antiferromagnetically couples two adjacent magnetic layers to each other,
wherein
the number of the plurality of magnetic layers is n≥4, and
the plurality of magnetic layers and the plurality of non-magnetic insertion layers have a structure that includes:
the first magnetic layer (21);
a first non-magnetic insertion layer (31) provided adjacent to the first magnetic layer (21) on an opposite side to the first non-magnetic layer (11);
a second magnetic layer (22) provided adjacent to the first non-magnetic insertion layer (31) on an opposite side to the first magnetic layer (21);
a second non-magnetic insertion layer (32) provided adjacent to the second magnetic layer (22) on an opposite side to the first non-magnetic insertion layer (31);
a third magnetic layer (23) provided adjacent to the second non-magnetic insertion layer (32) on an opposite side to the second magnetic layer (22);
a third non-magnetic insertion layer (33) provided adjacent to the third magnetic layer (23) on an opposite side to the second non-magnetic insertion layer (32); and
a fourth magnetic layer (24) provided adjacent to the third non-magnetic insertion layer (33) on an opposite side to the third magnetic layer (23), and
wherein
the number of the plurality of magnetic layers is n=4,
the first non-magnetic insertion layer (31) and the third non-magnetic insertion layer (33) are Ru with a film thickness of 0.4±0.15 nm, and
the second non-magnetic insertion layer (32) is Ru with a film thickness of 0.9±0.2 nm.

37. A magnetoresistance effect element, comprising:
a first recording layer (A1);
a first non-magnetic layer (11) provided adjacent to the first recording layer (A1); and a first reference layer (B1) provided adjacent to the first non-magnetic layer (11) on an opposite side to the first recording layer (A1), wherein the first reference layer (B1) includes n-number of a plurality of magnetic layers (21, 22, . . . , 2n) and (n−1)-number of a plurality of non-magnetic insertion layers (31, 32, . . . , 3(*n*−1)) adjacently sandwiched by each of the plurality of magnetic layers, where n≥3, a first magnetic layer (21) among the plurality of magnetic layers is provided adjacent to the first non-magnetic layer (11), an orientation of magnetization of the first reference layer (B1) is fixed in a film surface vertical direction, and each of the plurality of non-magnetic insertion layers (31, 32, . . . , 3(*n*−1)) antiferromagnetically couples two adjacent magnetic layers to each other, wherein the number of the plurality of magnetic layers is n≥4, and the plurality of magnetic layers and the plurality of non-magnetic insertion layers have a structure that includes:

the first magnetic layer (21);

a first non-magnetic insertion layer (31) provided adjacent to the first magnetic layer (21) on an opposite side to the first non-magnetic layer (11);

a second magnetic layer (22) provided adjacent to the first non-magnetic insertion layer (31) on an opposite side to the first magnetic layer (21);

a second non-magnetic insertion layer (32) provided adjacent to the second magnetic layer (22) on an opposite side to the first non-magnetic insertion layer (31);

a third magnetic layer (23) provided adjacent to the second non-magnetic insertion layer (32) on an opposite side to the second magnetic layer (22);

a third non-magnetic insertion layer (33) provided adjacent to the third magnetic layer (23) on an opposite side to the second non-magnetic insertion layer (32); and a fourth magnetic layer (24) provided adjacent to the third non-magnetic insertion layer (33) on an opposite side to the third magnetic layer (23), and wherein the number of the plurality of magnetic layers is n=4, the first non-magnetic insertion layer (31) and the third non-magnetic insertion layer (33) are Ir with a film thickness of 0.5±0.15 nm, and the second non-magnetic insertion layer (32) is Ru with a film thickness of 0.9±0.2 nm.

38. A magnetoresistance effect element, comprising:

a first recording layer (A1);

a first non-magnetic layer (11) provided adjacent to the first recording layer (A1); and a first reference layer (B1) provided adjacent to the first non-magnetic layer (11) on an opposite side to the first recording layer (A1), wherein the first reference layer (B1) includes n-number of a plurality of magnetic layers (21, 22, . . . , 2n) and (n−1)-number of a plurality of non-magnetic insertion layers (31, 32, . . . , 3(*n*−1)) adjacently sandwiched by each of the plurality of magnetic layers, where n≥3, a first magnetic layer (21) among the plurality of magnetic layers is provided adjacent to the first non-magnetic layer (11), an orientation of magnetization of the first reference layer (B1) is fixed in a film surface vertical direction, and each of the plurality of non-magnetic insertion layers (31, 32, . . . , 3(*n*−1)) antiferromagnetically couples two adjacent magnetic layers to each other, wherein the number of the plurality of magnetic layers is n=3, the plurality of magnetic layers and the plurality of non-magnetic insertion layers have a structure that includes:

the first magnetic layer (21);

a first non-magnetic insertion layer (31) provided adjacent to the first magnetic layer (21) on an opposite side to the first non-magnetic layer (11);

a second magnetic layer (22) provided adjacent to the first non-magnetic insertion layer (31) on an opposite side to the first magnetic layer (21);

a second non-magnetic insertion layer (32) provided adjacent to the second magnetic layer (22) on an opposite side to the first non-magnetic insertion layer (31); and a third magnetic layer (23) provided adjacent to the second non-magnetic insertion layer (32) on an opposite side to the second magnetic layer (22), and magnetization M2 of the second magnetic layer (22) is larger than a sum of magnetization M1 of the first magnetic layer (21) and magnetization M3 of the third magnetic layer (23).

39. A magnetoresistance effect element, comprising:

a first recording layer (A1);

a first non-magnetic layer (11) provided adjacent to the first recording layer (A1); and a first reference layer (B1) provided adjacent to the first non-magnetic layer (11) on an opposite side to the first recording layer (A1), wherein the first reference layer (B1) includes n-number of a plurality of magnetic layers (21, 22, . . . , 2n) and (n−1)-number of a plurality of non-magnetic insertion layers (31, 32, . . . , 3(*n*−1)) adjacently sandwiched by each of the plurality of magnetic layers, where n≥3, a first magnetic layer (21) among the plurality of magnetic layers is provided adjacent to the first non-magnetic layer (11), an orientation of magnetization of the first reference layer (B1) is fixed in a film surface vertical direction, and each of the plurality of non-magnetic insertion layers (31, 32, . . . , 3(*n*−1)) antiferromagnetically couples two adjacent magnetic layers to each other, wherein the number of the plurality of magnetic layers is n=3, the plurality of magnetic layers and the plurality of non-magnetic insertion layers have a structure that includes:

the first magnetic layer (21);

a first non-magnetic insertion layer (31) provided adjacent to the first magnetic layer (21) on an opposite side to the first non-magnetic layer (11);

a second magnetic layer (22) provided adjacent to the first non-magnetic insertion layer (31) on an opposite side to the first magnetic layer (21);

a second non-magnetic insertion layer (32) provided adjacent to the second magnetic layer (22) on an opposite side to the first non-magnetic insertion layer (31); and a third magnetic layer (23) provided adjacent to the second non-magnetic insertion layer (32) on an opposite side to the second magnetic layer (22), and a film thickness t2 of the second magnetic layer (22) is larger than a sum of a film thickness t1 of the first magnetic layer (21) and a film thickness t3 of the third magnetic layer (23).

40. A magnetoresistance effect element, comprising:
a first recording layer (A1);
a first non-magnetic layer (11) provided adjacent to the first recording layer (A1); and
a first reference layer (B1) provided adjacent to the first non-magnetic layer (11) on an opposite side to the first recording layer (A1), wherein
the first reference layer (B1) includes n-number of a plurality of magnetic layers (21, 22, ..., 2n) and (n−1)-number of a plurality of non-magnetic insertion layers (31, 32, ..., 3(n−1)) adjacently sandwiched by each of the plurality of magnetic layers, where n≥3,
a first magnetic layer (21) among the plurality of magnetic layers is provided adjacent to the first non-magnetic layer (11),
an orientation of magnetization of the first reference layer (B1) is fixed in a film surface vertical direction, and
each of the plurality of non-magnetic insertion layers (31, 32, ..., 3(n−1)) antiferromagnetically couples two adjacent magnetic layers to each other,
the magnetoresistance effect element further comprising:
a cap layer (C1) provided adjacent to the first recording layer (A1) on an opposite side to the non-magnetic layer (11);
an upper electrode layer (E2) provided adjacent to the cap layer (C1) on an opposite side to the first recording layer (A1);
a ground layer (S1) provided adjacent to the first reference layer (B1) on an opposite side to the non-magnetic layer (11); and
a lower electrode layer (E1) provided adjacent to the ground layer (S1) on an opposite side to the first reference layer (B1).

41. A magnetoresistance effect element, comprising:
a first recording layer (A1);
a first non-magnetic layer (11) provided adjacent to the first recording layer (A1); and
a first reference layer (B1) provided adjacent to the first non-magnetic layer (11) on an opposite side to the first recording layer (A1), wherein
the first reference layer (B1) includes n-number of a plurality of magnetic layers (21, 22, ..., 2n) and (n−1)-number of a plurality of non-magnetic insertion layers (31, 32, ..., 3(n−1)) adjacently sandwiched by each of the plurality of magnetic layers, where n≥3,
a first magnetic layer (21) among the plurality of magnetic layers is provided adjacent to the first non-magnetic layer (11),
an orientation of magnetization of the first reference layer (B1) is fixed in a film surface vertical direction, and
each of the plurality of non-magnetic insertion layers (31, 32, ..., 3(n−1)) antiferromagnetically couples two adjacent magnetic layers to each other,
the magnetoresistance effect element further comprising:
a cap layer (C1) provided adjacent to the first reference layer (B1) on an opposite side to the non-magnetic layer (11);
an upper electrode layer (E2) provided adjacent to the cap layer (C1) on an opposite side to the reference layer (B1);
a ground layer (S1) provided adjacent to the first recording layer (A1) on an opposite side to the non-magnetic layer (11); and
a lower electrode layer (E1) provided adjacent to the ground layer (S1) on an opposite side to the first recording layer (A1).

42. A magnetoresistance effect element, comprising:
a first recording layer (A1);
a first non-magnetic layer (11) provided adjacent to the first recording layer (A1); and
a first reference layer (B1) provided adjacent to the first non-magnetic layer (11) on an opposite side to the first recording layer (A1), wherein
the first reference layer (B1) includes n-number of a plurality of magnetic layers (21, 22, ..., 2n) and (n−1)-number of a plurality of non-magnetic insertion layers (31, 32, ..., 3(n−1)) adjacently sandwiched by each of the plurality of magnetic layers, where n≥3,
a first magnetic layer (21) among the plurality of magnetic layers is provided adjacent to the first non-magnetic layer (11),
an orientation of magnetization of the first reference layer (B1) is fixed in a film surface vertical direction, and
each of the plurality of non-magnetic insertion layers (31, 32, ..., 3(n−1)) antiferromagnetically couples two adjacent magnetic layers to each other,
the magnetoresistance effect element further comprising:
a second non-magnetic layer (12) provided adjacent to the first recording layer (A1) on an opposite side to the first non-magnetic layer (11); and
a second reference layer (B2) provided adjacent to the second non-magnetic layer (12) on an opposite side to the first recording layer (A1), wherein
the second reference layer (B2) includes n-number of a plurality of magnetic layers (21, 22, ..., 2n) and (n−1)-number of a plurality of non-magnetic insertion layers (31, 32, ..., 3(n−1)) adjacently sandwiched by each of the plurality of magnetic layers, where n≥3,
a first magnetic layer (21) among the plurality of magnetic layers is provided adjacent to the first non-magnetic layer (11),
an orientation of magnetization of the second reference layer (B2) is fixed in a film surface vertical direction, and
each of the plurality of non-magnetic insertion layers (31, 32, ..., 3(n−1)) antiferromagnetically couples two adjacent magnetic layers to each other.

43. A magnetoresistance effect element, comprising:
a first recording layer (A1);
a first non-magnetic layer (11) provided adjacent to the first recording layer (A1); and a first reference layer (B1) provided adjacent to the first non-magnetic layer (11) on an opposite side to the first recording layer (A1), wherein
the first reference layer (B1) includes n-number of a plurality of magnetic layers (21, 22, ..., 2n) and (n−1)-number of a plurality of non-magnetic insertion layers (31, 32, ..., 3(n−1)) adjacently sandwiched by each of the plurality of magnetic layers, where n≥3,
a first magnetic layer (21) among the plurality of magnetic layers is provided adjacent to the first non-magnetic layer (11),
an orientation of magnetization of the first reference layer (B1) is fixed in a film surface vertical direction,
each of the plurality of non-magnetic insertion layers (31, 32, ..., 3(n−1)) contains Ru or Ir,
a film thickness of the Ru is 0.9±0.2 nm or 0.4±0.15 nm, and
a film thickness of the Ir is 0.5±0.15 nm or 1.35±0.1 nm.

44. The magnetoresistance effect element according to claim 43, wherein the number of the plurality of magnetic layers is n≥4.

45. A magnetoresistance effect element, comprising:
a first recording layer (A1);
a first non-magnetic layer (11) provided adjacent to the first recording layer (A1); and
a first reference layer (B1) provided adjacent to the first non-magnetic layer (11) on an opposite side to the first recording layer (A1), wherein
the first reference layer (B1) includes n-number of a plurality of magnetic layers (21, 22, ..., 2n) and (n−1)-number of a plurality of non-magnetic insertion layers (31, 32, ..., 3(n−1)) adjacently sandwiched by each of the plurality of magnetic layers, where n≥3,
a first magnetic layer (21) among the plurality of magnetic layers is provided adjacent to the first non-magnetic layer (11),
an orientation of magnetization of the first reference layer (B1) is fixed in a film surface vertical direction, and
each of the plurality of non-magnetic insertion layers (31, 32, ..., 3(n−1)) antiferromagnetically couples two adjacent magnetic layers to each other,
wherein
the number of the plurality of magnetic layers is n≥4, and
the plurality of magnetic layers and the plurality of non-magnetic insertion layers have a structure that includes:
the first magnetic layer (21);
a first non-magnetic insertion layer (31) provided adjacent to the first magnetic layer (21) on an opposite side to the first non-magnetic layer (11);
a second magnetic layer (22) provided adjacent to the first non-magnetic insertion layer (31) on an opposite side to the first magnetic layer (21);
a second non-magnetic insertion layer (32) provided adjacent to the second magnetic layer (22) on an opposite side to the first non-magnetic insertion layer (31);
a third magnetic layer (23) provided adjacent to the second non-magnetic insertion layer (32) on an opposite side to the second magnetic layer (22);
a third non-magnetic insertion layer (33) provided adjacent to the third magnetic layer (23) on an opposite side to the second non-magnetic insertion layer (32); and
a fourth magnetic layer (24) provided adjacent to the third non-magnetic insertion layer (33) on an opposite side to the third magnetic layer (23), and
wherein the number of the plurality of magnetic layers is n=4, and
a sum of a product of magnetization M1 and a film thickness t1 of the first magnetic layer (21) and a product of magnetization M3 and a film thickness t3 of the third magnetic layer (23) is equal to or smaller than a sum of a product of magnetization M2 and a film thickness t2 of the second magnetic layer (22) and a product of magnetization M4 and a film thickness t4 of the fourth magnetic layer (24).

46. A magnetoresistance effect element, comprising:
a first recording layer (A1);
a first non-magnetic layer (11) provided adjacent to the first recording layer (A1); and
a first reference layer (B1) provided adjacent to the first non-magnetic layer (11) on an opposite side to the first recording layer (A1), wherein
the first reference layer (B1) includes n-number of a plurality of magnetic layers (21, 22, ..., 2n) and (n−1)-number of a plurality of non-magnetic insertion layers (31, 32, ..., 3(n−1)) adjacently sandwiched by each of the plurality of magnetic layers, where n≥3,
a first magnetic layer (21) among the plurality of magnetic layers is provided adjacent to the first non-magnetic layer (11),
an orientation of magnetization of the first reference layer (B1) is fixed in a film surface vertical direction, and
each of the plurality of non-magnetic insertion layers (31, 32, ..., 3(n−1)) antiferromagnetically couples two adjacent magnetic layers to each other, and
wherein
the number of the plurality of magnetic layers is n=3,
the plurality of magnetic layers and the plurality of non-magnetic insertion layers have a structure that includes:
the first magnetic layer (21);
a first non-magnetic insertion layer (31) provided adjacent to the first magnetic layer (21) on an opposite side to the first non-magnetic layer (11);
a second magnetic layer (22) provided adjacent to the first non-magnetic insertion layer (31) on an opposite side to the first magnetic layer (21);
a second non-magnetic insertion layer (32) provided adjacent to the second magnetic layer (22) on an opposite side to the first non-magnetic insertion layer (31), and
a third magnetic layer (23) provided adjacent to the second non-magnetic insertion layer (32) on an opposite side to the second magnetic layer (22), and
a product of magnetization M2 and a film thickness t2 of the second magnetic layer (22) is larger than a sum of a product of magnetization M1 and a film thickness t1 of the first magnetic layer (21) and a sum of a product of magnetization M3 and a film thickness t3 of the third magnetic layer (23).

47. A magnetic memory comprising the magnetoresistance effect element according to claim 1.
48. A magnetic memory comprising the magnetoresistance effect element according to claim 25.
49. A magnetic memory comprising the magnetoresistance effect element according to claim 27.
50. A magnetic memory comprising the magnetoresistance effect element according to claim 28.
51. A magnetic memory comprising the magnetoresistance effect element according to claim 29.
52. A magnetic memory comprising the magnetoresistance effect element according to claim 30.
53. A magnetic memory comprising the magnetoresistance effect element according to claim 33.
54. A magnetic memory comprising the magnetoresistance effect element according to claim 34.
55. A magnetic memory comprising the magnetoresistance effect element according to claim 36.
56. A magnetic memory comprising the magnetoresistance effect element according to claim 37.
57. A magnetic memory comprising the magnetoresistance effect element according to claim 38.
58. A magnetic memory comprising the magnetoresistance effect element according to claim 39.
59. A magnetic memory comprising the magnetoresistance effect element according to claim 40.
60. A magnetic memory comprising the magnetoresistance effect element according to claim 41.

61. A magnetic memory comprising the magnetoresistance effect element according to claim 42.

62. A magnetic memory comprising the magnetoresistance effect element according to claim 43.

63. A magnetic memory comprising the magnetoresistance effect element according to claim 45.

64. A magnetic memory comprising the magnetoresistance effect element according to claim 46.

\* \* \* \* \*